(12) United States Patent
Yamazaki et al.

(10) Patent No.: US 8,253,144 B2
(45) Date of Patent: Aug. 28, 2012

(54) SEMICONDUCTOR DEVICE AND METHOD FOR MANUFACTURING THE SAME

(75) Inventors: Shunpei Yamazaki, Tokyo (JP); Jun Koyama, Kanagawa (JP); Hideki Uochi, Kanagawa (JP); Yasuo Nakamura, Tokyo (JP); Junpei Sugao, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 144 days.

(21) Appl. No.: 12/898,345

(22) Filed: Oct. 5, 2010

(65) Prior Publication Data

US 2011/0084337 A1 Apr. 14, 2011

(30) Foreign Application Priority Data

Oct. 9, 2009 (JP) ................. 2009-235750

(51) Int. Cl.
*H01L 27/14* (2006.01)

(52) U.S. Cl. ........... 257/72; 257/E29.151; 257/E51.005; 438/149; 438/151

(58) Field of Classification Search .......... 257/43, 257/72, E29.068, E29.151, E51.005; 438/149, 438/150, 151
See application file for complete search history.

(56) References Cited

U.S. PATENT DOCUMENTS

| | | | |
|---|---|---|---|
| 7,061,565 B2 | 6/2006 | Kwon et al. | |
| 7,277,138 B2* | 10/2007 | Cho et al. | 349/46 |
| 7,323,371 B2* | 1/2008 | Yang et al. | 438/151 |
| 7,652,740 B2 | 1/2010 | Hwang et al. | |
| 2004/0041958 A1 | 3/2004 | Hwang et al. | |
| 2005/0018097 A1 | 1/2005 | Kwon et al. | |
| 2005/0094041 A1* | 5/2005 | Oh et al. | 349/27 |
| 2009/0140438 A1 | 6/2009 | Yamazaki et al. | |

FOREIGN PATENT DOCUMENTS

| | | |
|---|---|---|
| JP | 10-229200 A | 8/1998 |
| JP | 2004-133422 A | 4/2004 |
| JP | 2004-163901 A | 6/2004 |

OTHER PUBLICATIONS

International Search Report, PCT Application No. PCT/JP2010/066469, dated Dec. 21, 2010, 2 pages.
Written Opinion, PCT Application No. PCT/JP2010/066469, dated Dec. 21, 2010, 3 pages.

* cited by examiner

*Primary Examiner* — Khiem D Nguyen

(74) *Attorney, Agent, or Firm* — Fish & Richardson P.C.

(57) ABSTRACT

As for a semiconductor device which is typified by a display device, it is an object to provide a highly reliable semiconductor device to which a large-sized or high-definition screen is applicable and which has high display quality and operates stably. By using a conductive layer including Cu as a long lead wiring, an increase in wiring resistance is suppressed. Further, the conductive layer including Cu is provided in such a manner that it does not overlap with the semiconductor layer in which a channel region of a TFT is formed, and is surrounded by insulating layers including silicon nitride, whereby diffusion of Cu can be prevented; thus, a highly reliable semiconductor device can be manufactured. Specifically, a display device which is one embodiment of a semiconductor device can have high display quality and operate stably even when the size or definition thereof is increased.

12 Claims, 37 Drawing Sheets

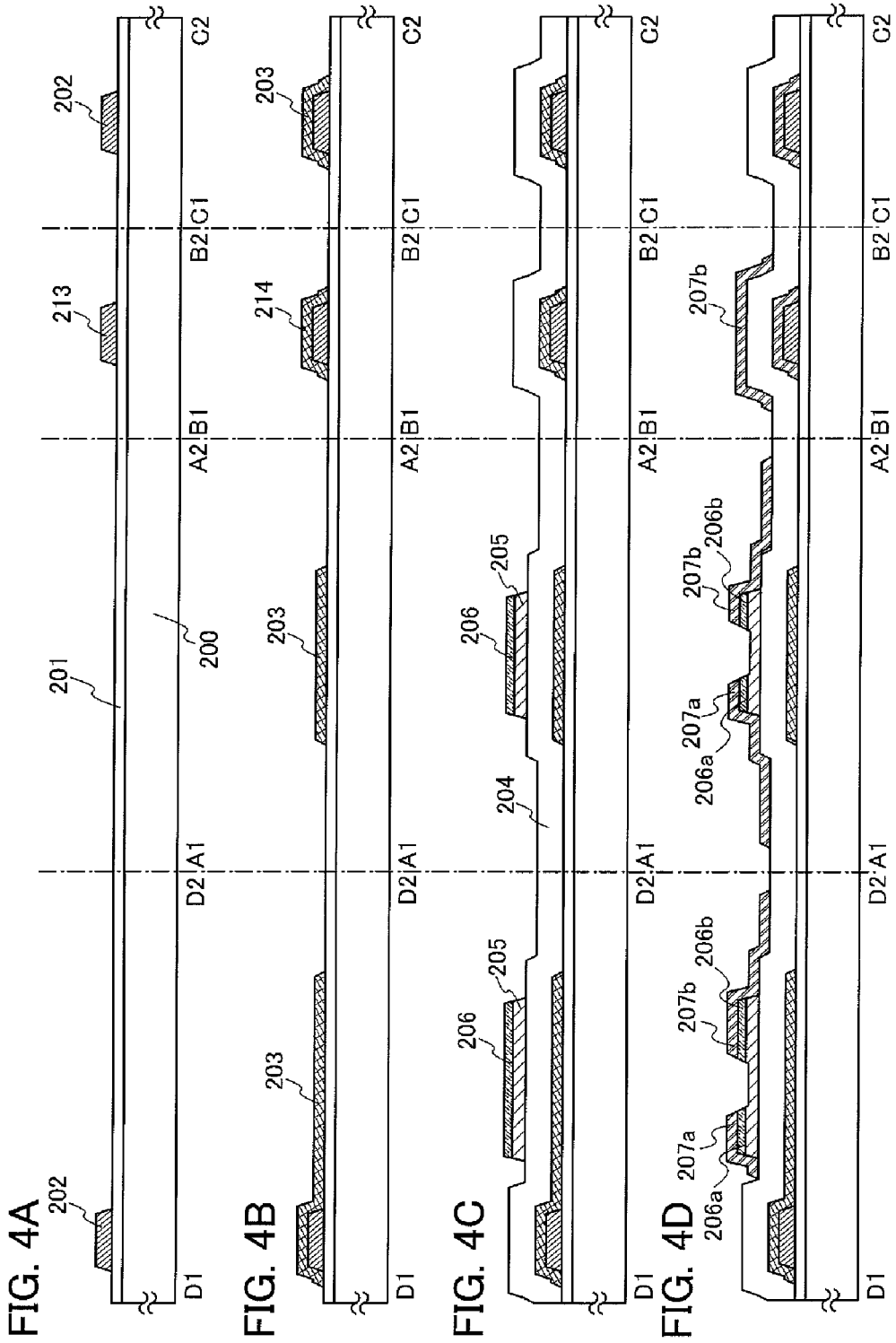

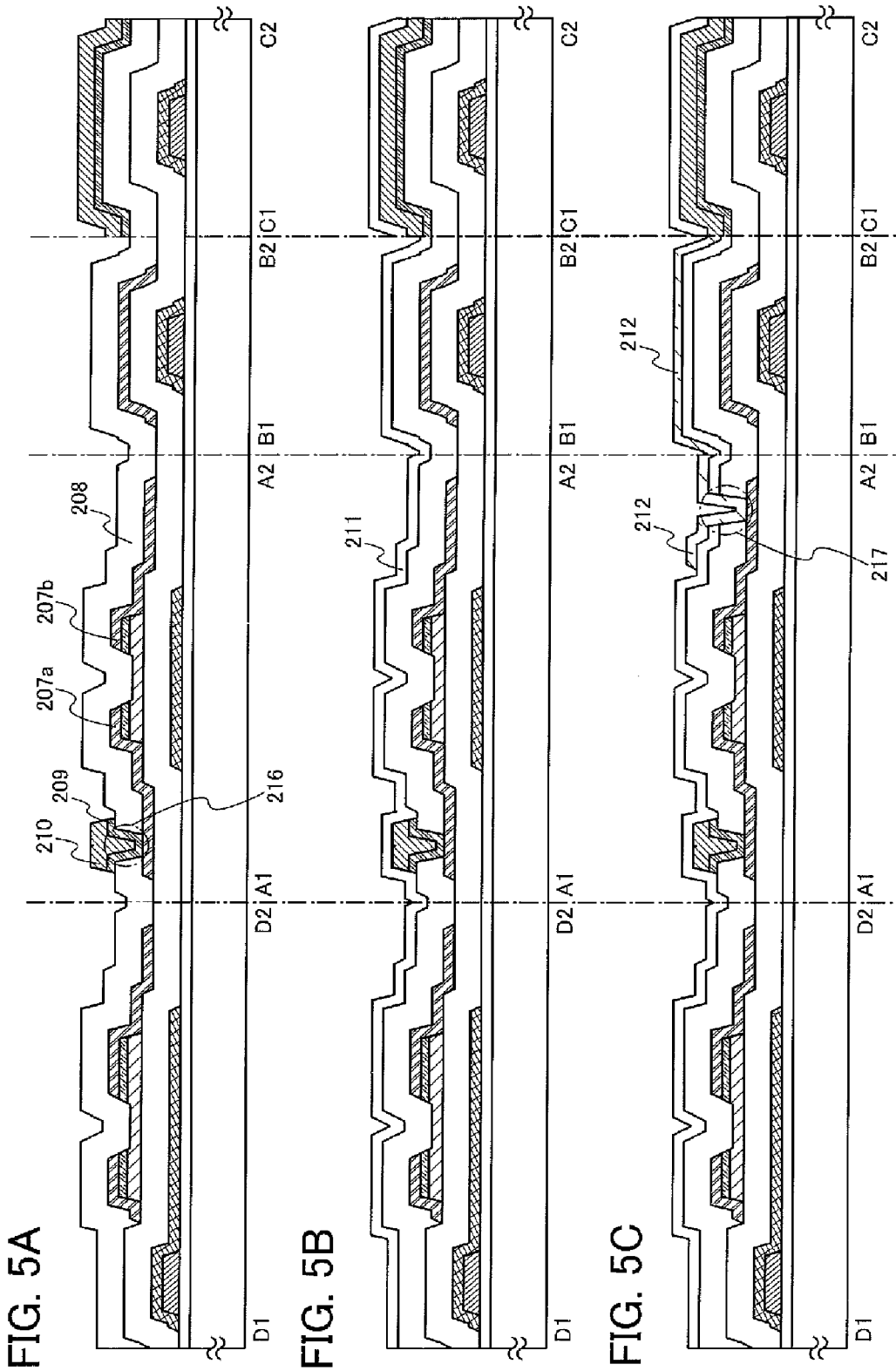

FIG. 12A1
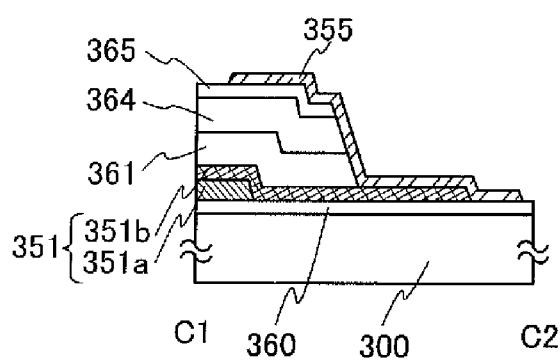
FIG. 12A2
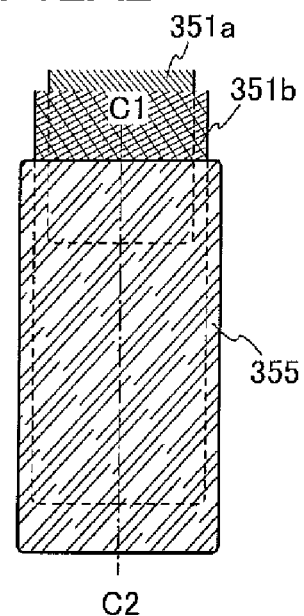
FIG. 12B1
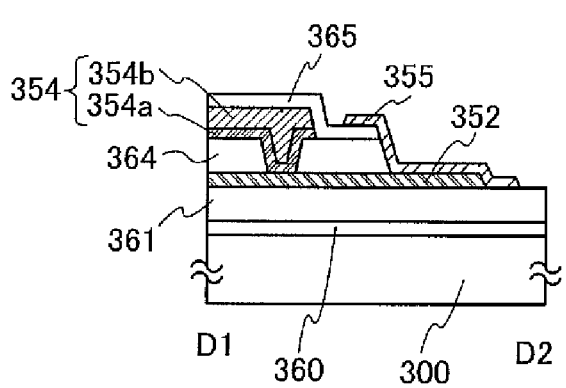
FIG. 12B2
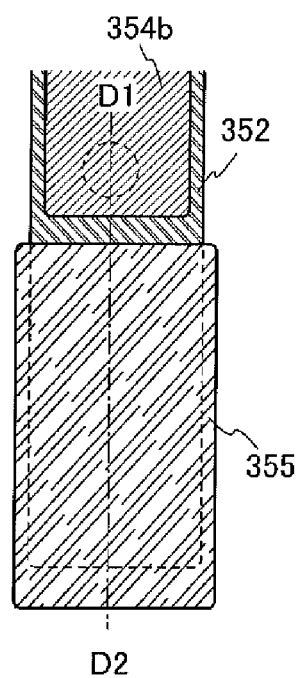

FIG. 13A1
FIG. 13A2
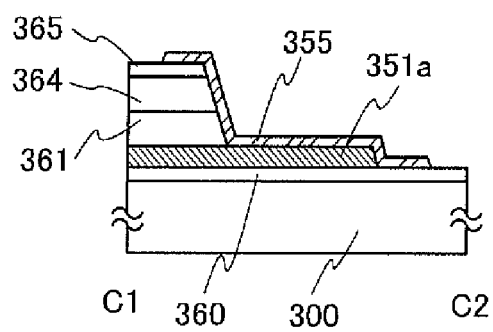
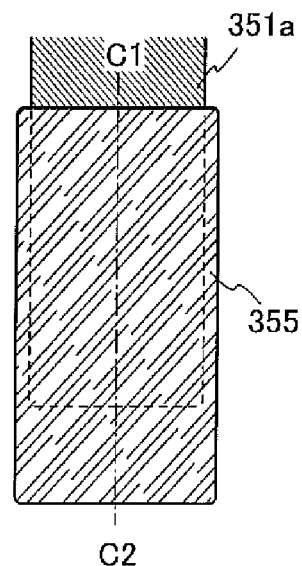
FIG. 13B1
FIG. 13B2
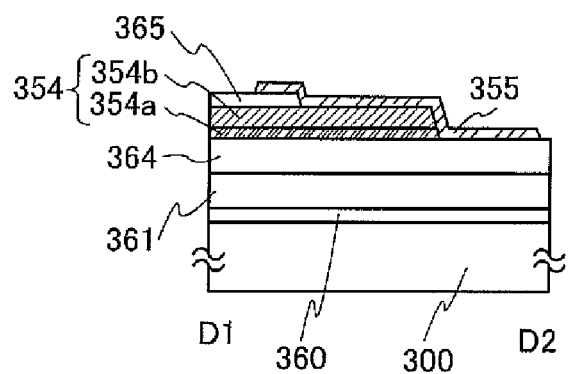
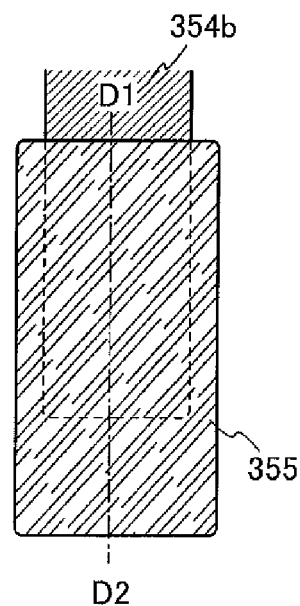

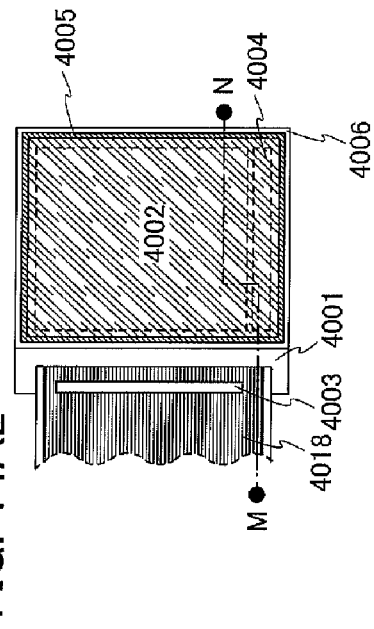
FIG. 14A1
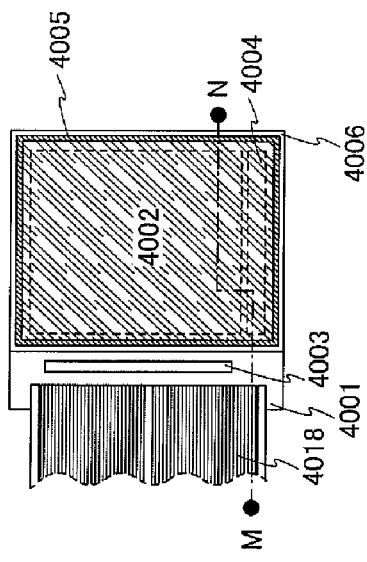
FIG. 14A2
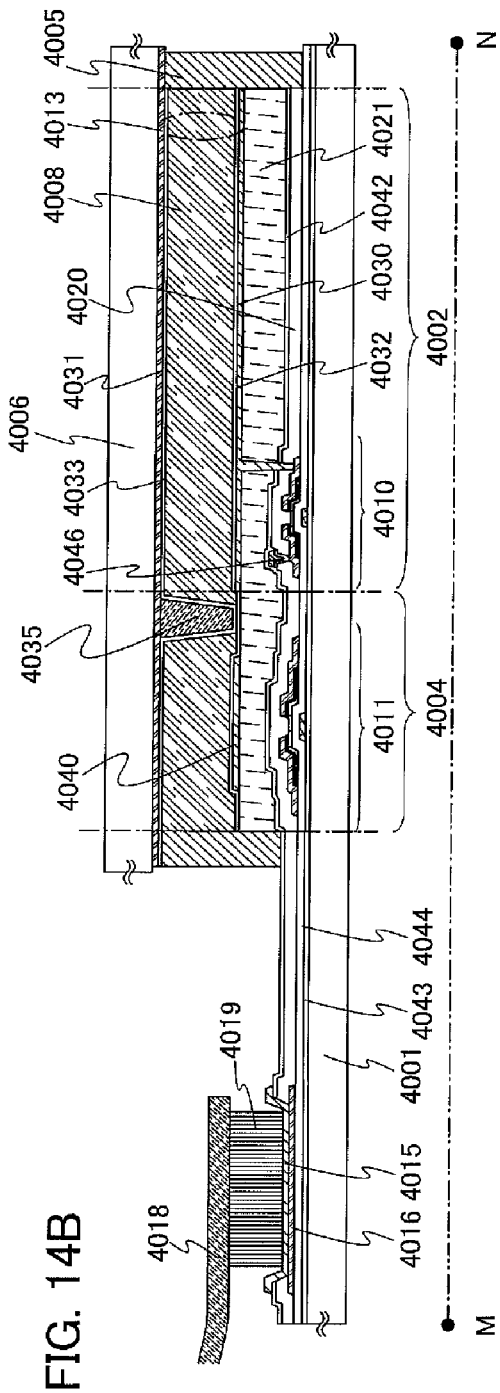
FIG. 14B

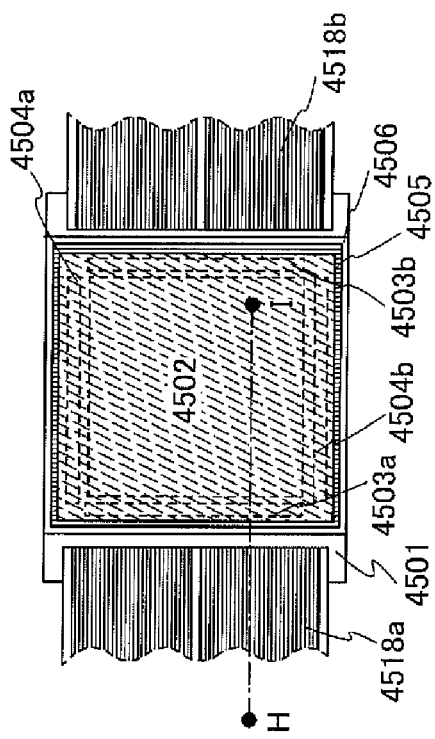
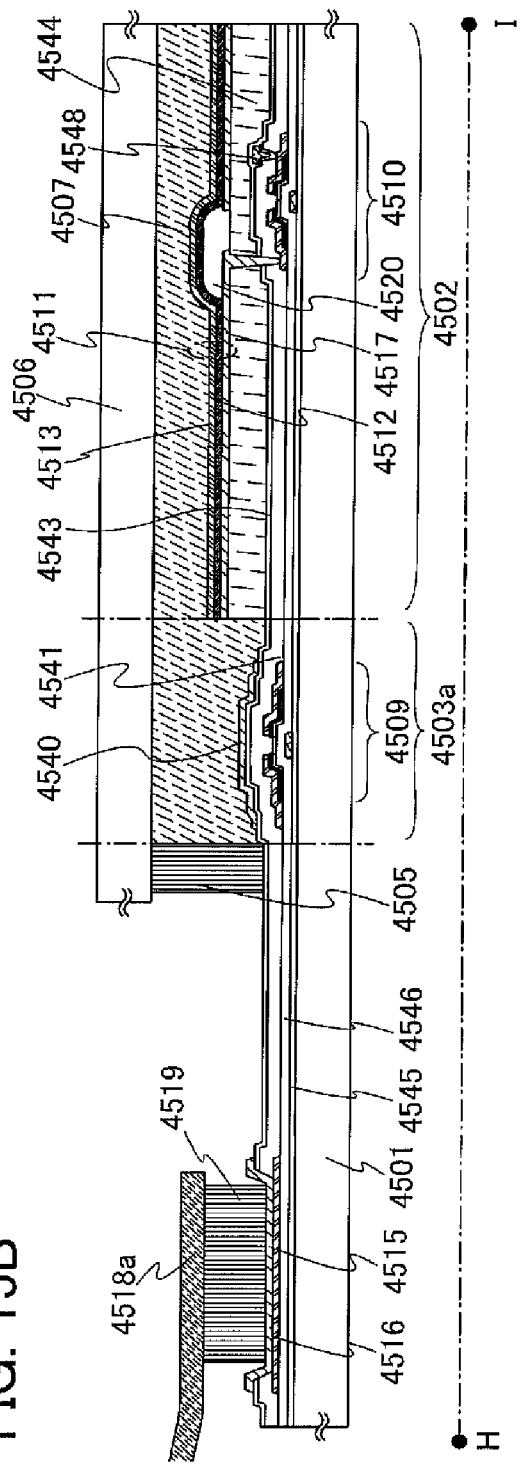
FIG. 15A
FIG. 15B

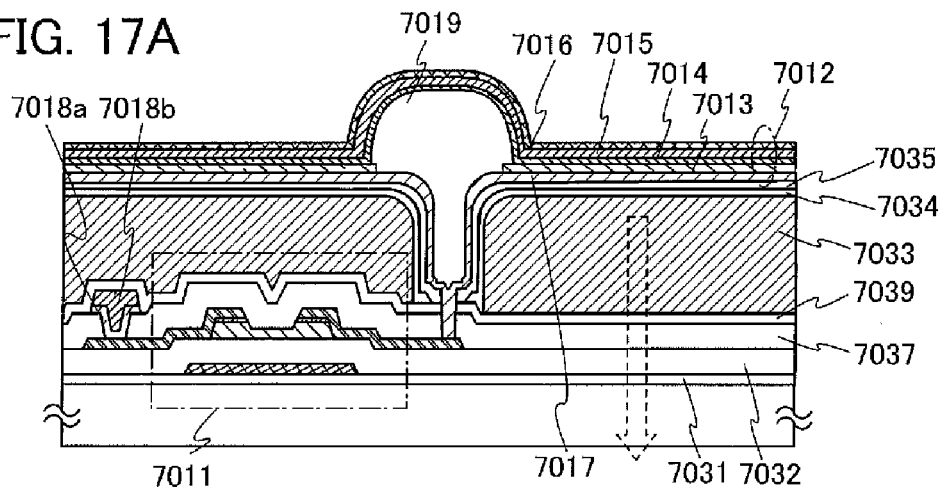
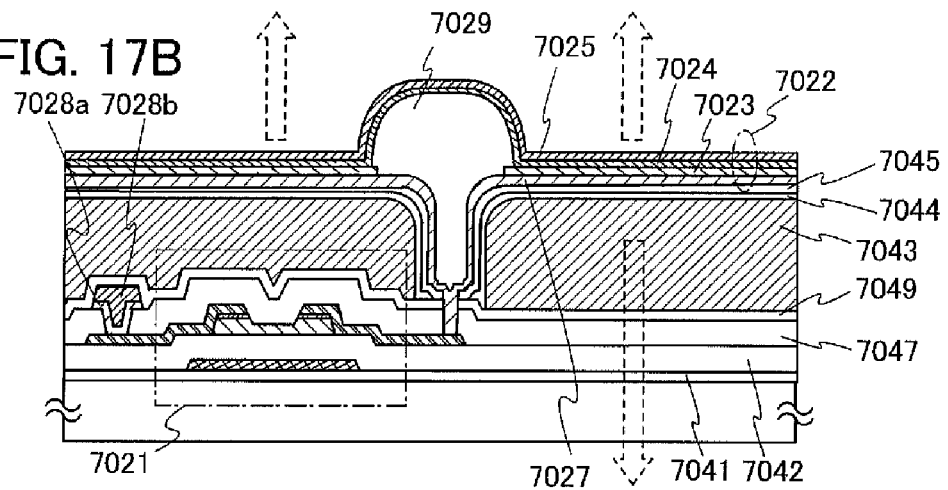
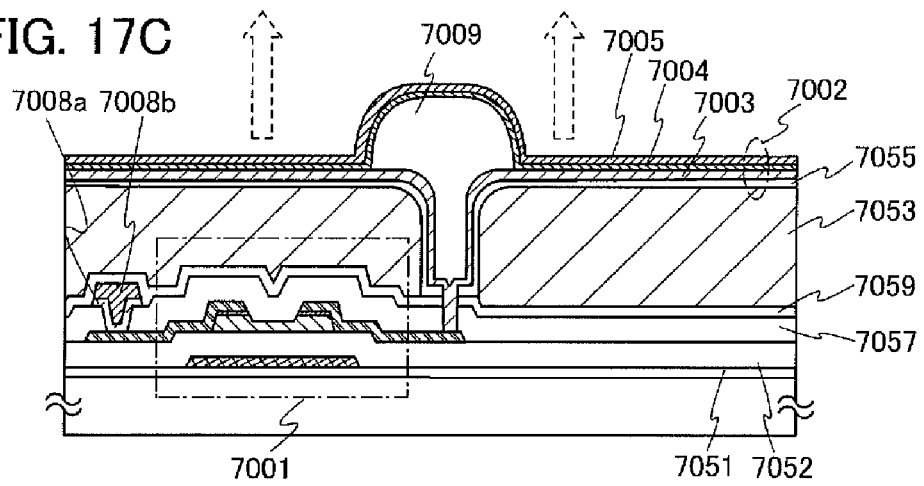

SEMICONDUCTOR DEVICE AND METHOD FOR MANUFACTURING THE SAME

TECHNICAL FIELD

The present invention relates to a semiconductor device which includes a thin film transistor (hereinafter, also referred to as a TFT) and a method for manufacturing the semiconductor device.

Note that the semiconductor device in this specification refers to all the devices which can operate by using semiconductor characteristics, and an electro-optical device, a semiconductor circuit, and an electronic device are all semiconductor devices.

BACKGROUND ART

In recent years, a technique for forming a thin film transistor (TFT) by using a semiconductor thin film (having a thickness of approximately several nanometers to several hundred nanometers) formed over a substrate having an insulating surface has attracted attention. Thin film transistors are applied to a wide variety of electronic devices such as ICs or electro-optical devices, and their development especially as switching elements for an image display device has been accelerated.

Moreover, there is a trend in an active matrix semiconductor device typified by a liquid crystal display device towards a larger screen, e.g., a 60-inch diagonal screen, and further, the development of an active matrix semiconductor device is aimed even at a 120-inch diagonal screen or a larger screen. In addition, a trend in resolution of a screen is toward higher definition, e.g., high-definition (HD) image quality (1366×768) or full high-definition (FHD) image quality (1920×1080), and development of a so-called 4K Digital Cinema display device, which has a resolution of 3840×2048 or 4096×2180, is also accelerated.

An increase in screen size or definition tends to increase wiring resistance in a display portion. An increase in wiring resistance causes delay of signal transmission to an end portion of a signal line, voltage drop in a power supply line, or the like. As a result, deterioration of display quality, such as display unevenness or a defect in grayscale, or an increase in power consumption is caused.

In order to suppress an increase in wiring resistance, a technique of forming a low-resistance wiring layer using copper (Cu) is considered (e.g., see Patent Documents 1 and 2).

[Patent Document 1] Japanese Published Patent Application No. 2004-133422
[Patent Document 2] Japanese Published Patent Application No. 2004-163901

DISCLOSURE OF INVENTION

In order to suppress an increase in wiring resistance, a technique of forming a low-resistance wiring layer using copper (Cu) is considered. However, since Cu easily diffuses into a semiconductor or silicon oxide, the operation of a semiconductor device might be unstable and yield might be significantly reduced.

An object of one embodiment of the present invention is to provide a semiconductor device typified by a display device having higher display quality, in which an effect due to wiring resistance, such as voltage drop, a defect in signal writing to a pixel, or a defect in grayscale, are prevented.

Another object of one embodiment of the present invention is to realize an increase in operation speed of a semiconductor device.

Another object of one embodiment of the present invention is to realize a reduction in power consumption of a semiconductor device.

Another object of one embodiment of the present invention is to realize an improvement in definition of a semiconductor device.

Another object of one embodiment of the present invention is to provide a thin film transistor which operates stably and a semiconductor device which includes the thin film transistor.

An embodiment of the present invention disclosed in this specification is a semiconductor device which includes a first insulating layer including silicon nitride over a substrate; a first conductive layer including Cu over the first insulating layer; a second conductive layer covering the first conductive layer over the first conductive layer; a second insulating layer including silicon nitride over the second conductive layer; an island-shaped semiconductor layer over the second insulating layer; third conductive layers serving as a source electrode and a drain electrode over the island-shaped semiconductor layer; a third insulating layer including silicon nitride over the third conductive layers; a fourth conductive layer electrically in contact with the third conductive layer serving as one of the source electrode and the drain electrode through an opening provided in the third insulating layer; a fifth conductive layer including Cu which overlaps with the fourth conductive layer; a fourth insulating layer including silicon nitride which covers the fifth conductive layer; and a sixth conductive layer electrically in contact with the third conductive layer serving as the other of the source electrode and the drain electrode through an opening provided in the third insulating layer and the fourth insulating layer. In the semiconductor device, the first conductive layer and the fifth conductive layer do not overlap with the island-shaped semiconductor layer in which a channel of a thin film transistor is formed.

Another embodiment of the present invention disclosed in this specification is a semiconductor device which includes a base insulating layer including silicon nitride over a substrate; a gate wiring formed over the base insulating layer and formed using a stack of a conductive layer including Cu and a conductive layer which includes metal with a high melting point and covers the conductive layer including Cu; a gate insulating layer including silicon nitride over the gate wiring; an island-shaped semiconductor layer over the gate insulating layer; a source electrode and a drain electrode over the island-shaped semiconductor layer; an interlayer insulating layer including silicon nitride over the source electrode and the drain electrode; a source wiring which is formed over the interlayer insulating layer, formed using a stack of a barrier layer having conductivity and a conductive layer including Cu over the barrier layer, and is electrically connected to the source electrode through an opening provided in the interlayer insulating layer; a passivation layer including silicon nitride over the source wiring; and a conductive layer which is formed over the passivation layer and is electrically connected to the drain electrode through an opening provided in the passivation layer and the interlayer insulating layer. In the semiconductor device, the conductive layer including Cu in the gate wiring and the conductive layer including Cu in the source wiring do not overlap with the island-shaped semiconductor layer in which a channel of a thin film transistor is formed.

Another embodiment of the present invention disclosed in this specification is a semiconductor device which includes an active matrix circuit, a driver circuit, and a protective circuit over a substrate. In the semiconductor device, a source wiring, a gate wiring, a common potential wiring, and a power supply line in the active matrix circuit include a wiring layer including Cu which does not overlap with a semiconductor layer of a thin film transistor in the active matrix circuit; thin film transistors in the driver circuit and the protective circuit are connected without using a wiring layer including Cu; and the wiring layer including Cu is sandwiched between insulating layers including silicon nitride.

The semiconductor layer can be formed using an amorphous semiconductor, a microcrystalline semiconductor, a polycrystalline semiconductor, or the like. For example, amorphous silicon or microcrystalline germanium can be used.

By using a conductive layer including Cu for a long lead wiring such as a source wiring that transmits a video signal to each pixel TFT, a gate wiring that controls on/off of each pixel TFT, a storage capacitor line, and a power supply line, which are provided in an active matrix circuit; or a power supply line, a common potential line, a lead line from a terminal portion that inputs/outputs a signal input to/from an external portion, which are provided in a driver circuit; an increase in wiring resistance can be suppressed.

By providing the conductive layer including Cu in such a manner that it does not overlap with the semiconductor layer where a channel region of the TFT is formed, an effect due to diffusion of Cu can be prevented.

By providing insulating layers including silicon nitride over and under the conductive layer including Cu so that the conductive layer including Cu is sandwiched between or surrounded by the insulating layers, diffusion of Cu can be prevented.

Note that a gate in this specification refers to the entire gate electrode and gate wiring or part thereof. The gate wiring is a wiring for electrically connecting a gate electrode of at least one transistor to another electrode or another wiring, and includes a scan line in a display device in its category, for example.

A source refers to the entire source region, source electrode, and source wiring or part thereof. The source region refers to a region in a semiconductor layer, where the resistivity is less than or equal to a given value. The source electrode refers to part of a conductive layer, which is connected to the source region. The source wiring is a wiring for electrically connecting a source electrode of at least one transistor to another electrode or another wiring. For example, in the case where a signal line in a display device is electrically connected to a source electrode, the source wiring includes the signal line in its category.

A drain refers to the entire drain region, drain electrode, and drain wiring or part thereof. The drain region refers to a region in a semiconductor layer, where the resistivity is less than or equal to a given value. The drain electrode refers to part of a conductive layer, which is connected to the drain region. The drain wiring is a wiring for electrically connecting a drain electrode of at least one transistor to another electrode or another wiring. For example, in the case where a signal line in a display device is electrically connected to a drain electrode, the drain wiring includes the signal line in its category.

In this document (the specification, the claims, the drawings, and the like), since a source and a drain of a transistor may interchange depending on the structure, the operating condition, and the like of the transistor, it is difficult to define which is the source or the drain. Therefore, in this document (the specification, the claims, the drawings, and the like), one terminal selected from the source and the drain is referred to as one of the source and drain, while the other terminal is referred to as the other of the source and drain.

Note that a light-emitting device in this specification refers to an image display device, a light-emitting device, or a light source (including a lighting device). In addition, the light-emitting device also refers to a module in which a light-emitting device is connected to a connector such as a flexible printed circuit (FPC), a tape automated bonding (TAB) tape, or a tape carrier package (TCP); a module in which a printed wiring board is provided at the end of a TAB tape or a TCP; and a module in which an integrated circuit (IC) is directly mounted by chip on glass (COG) method onto substrate provided with a light-emitting element.

According to one embodiment of the present invention, in a semiconductor device typified by a display device, favorable display can be performed even when the area of a pixel portion is increased and the area of a display screen is increased. According one embodiment of to the present invention, wiring resistance in the pixel portion can be significantly reduced; thus, an embodiment of the present invention can be applied to even a large-sized screen such as a 60-inch diagonal screen or a 120-inch diagonal screen. Moreover, an embodiment of the present invention can also be applied to a high-definition screen of full high-definition or 4K Digital Cinema.

BRIEF DESCRIPTION OF DRAWINGS

FIGS. 4A to 4D are cross-sectional process views illustrating an embodiment of the present invention.

FIGS. 5A to 5C are cross-sectional process views illustrating an embodiment of the present invention.

FIGS. 12A1 and 12B1 are cross-sectional views and FIGS. 12A2 and 12B2 are plan views illustrating an embodiment of the present invention.

FIGS. 13A1 and 13B1 are cross-sectional views and FIGS. 13A2 and 13B2 are plan views illustrating an embodiment of the present invention.

FIGS. 14A1, 14A2, and 14B illustrate a semiconductor device.

FIGS. 15A and 15B illustrate a semiconductor device.

FIGS. 17A to 17C illustrate semiconductor devices.

BEST MODE FOR CARRYING OUT THE INVENTION

Figure 1A:
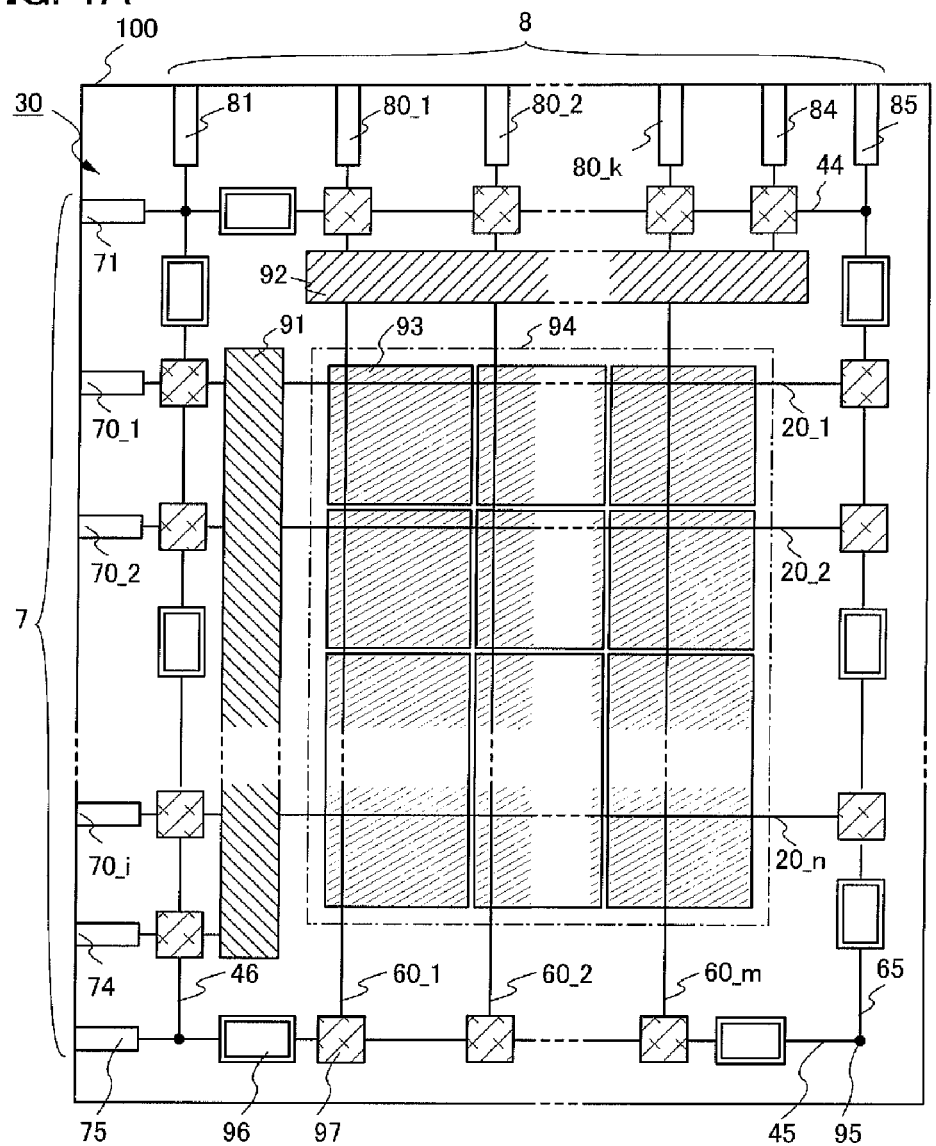
FIGS. 1A and 1B are a plan view and a circuit diagram, respectively, illustrating an embodiment of the present invention.

Embodiments will be described in detail with reference to the accompanying drawings. Note that the present invention is not limited to the following description and it will be readily appreciated by those skilled in the art that modes and details can be modified in various ways without departing from the spirit and the scope of the present invention. Accordingly, the present invention should not be construed as being limited to the description of the embodiments to be given below. Note that in a structure of the present invention described below, like portions or portions having like functions in different drawings are denoted by the like reference numerals and repeated description thereof is omitted.

Embodiment 1

In this embodiment, one embodiment of a display device which includes a pixel portion and a semiconductor element in the periphery of the pixel portion will be described with reference to FIGS. 1A and 1B.

FIG. 1A illustrates a structure of a display device 30. The display device 30 includes a gate terminal portion 7 and a source terminal portion 8 over a substrate 100. The display device 30 is provided with gate wirings (20_1 to 20_n, note that n is a natural number) including the gate wiring 20_1 and the gate wiring 202, and source wirings (60_1 to 60_m, note that m is a natural number) including the source wiring 60_1 and the source wiring 602. Further, in a pixel region 94 of the display device 30, pixels 93 are arranged in a matrix. Note that each of the pixels 93 is connected to at least one gate wiring and one source wiring.

Further, the display device 30 includes a common wiring 44, a common wiring 45, a common wiring 46, and a common wiring 65. For example, the common wiring 45 is connected to the common wiring 65 through a connection portion 95. The common wirings are electrically connected to each other to have the same potential.

In addition, the common wiring 44, the common wiring 45, the common wiring 46, and the common wiring 65 are connected to a terminal 71, a terminal 75, a terminal 81, and a terminal 85. The common wirings each include a common connection portion 96 which can be electrically connected to a counter substrate.

Further, each of gate signal line terminals (70_1 to 70_i, note that i is a natural number) of the gate terminal portion 7 is connected to a gate driver circuit 91 (hereinafter, also referred to as a scan line driver circuit) and connected to the common wiring 46 through a protective circuit 97. In addition, a terminal 74 is connected to the gate driver circuit 91, so that the gate driver circuit 91 is connected to an external power source (not shown). Note that each of the gate wirings (20_1 to 20_n, note that n is a natural number) is connected to the common wiring 65 through the protective circuit 97.

Further, each of source signal line terminals (80_1 to 80_k, note that k is a natural number) of the source terminal portion 8 is connected to a source driver circuit 92 (hereinafter, also referred to as a signal line driver circuit), and connected to the common wiring 44 through the protective circuit 97. In addition, a terminal 84 is connected to the source driver circuit 92, so that the source driver circuit 92 is connected to an external power source (not shown). Each of the source wirings (60_1 60_m, note that m is a natural number) is connected to the common wiring 45 through the protective circuit 97.

The gate driver circuit and the source driver circuit can be formed at the same time as the pixel region using a thin film transistor disclosed in this specification. Moreover, one or both of the gate driver circuit and the source driver circuit may be formed using a single crystal semiconductor film or a polycrystalline semiconductor film over a substrate which is separately prepared, and then mounted by a COG method, a wire bonding method, a TAB method, or the like.

Figure 1B:
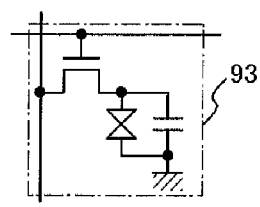

An example of an equivalent circuit that can be applied to the pixel 93 is illustrated in FIG. 1B. The equivalent circuit illustrated in FIG. 1B is an example in the case where a liquid crystal element is used as a display element in the pixel 93.

Figure 2A:
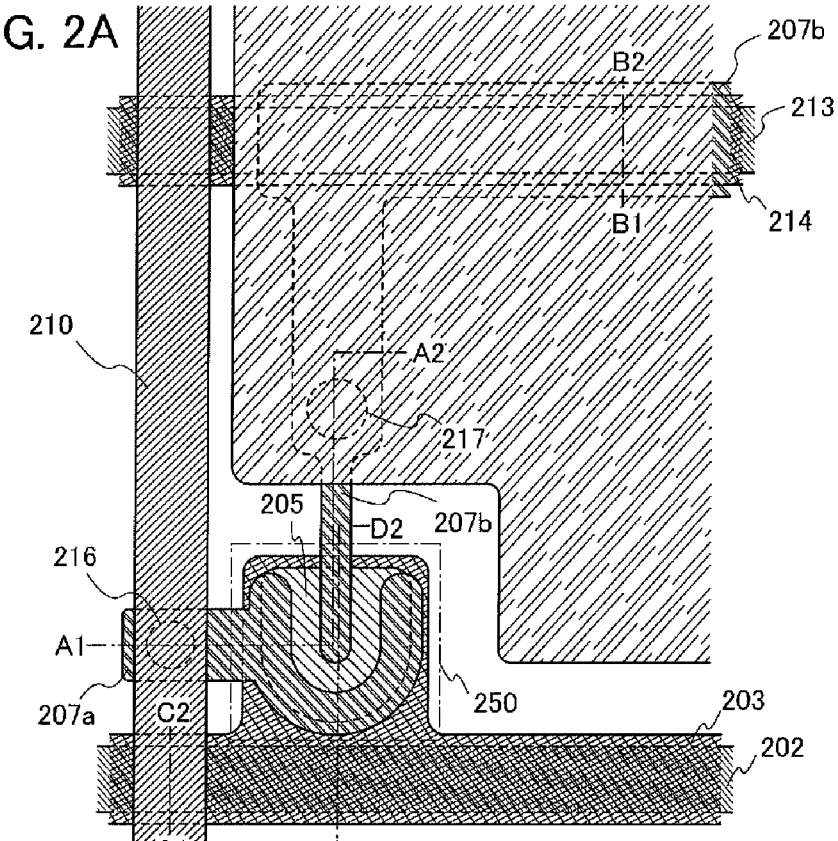
FIG. 2A is a plan view and FIGS. 2B and 2C are cross-sectional views illustrating an embodiment of the present invention.
Figure 2B:
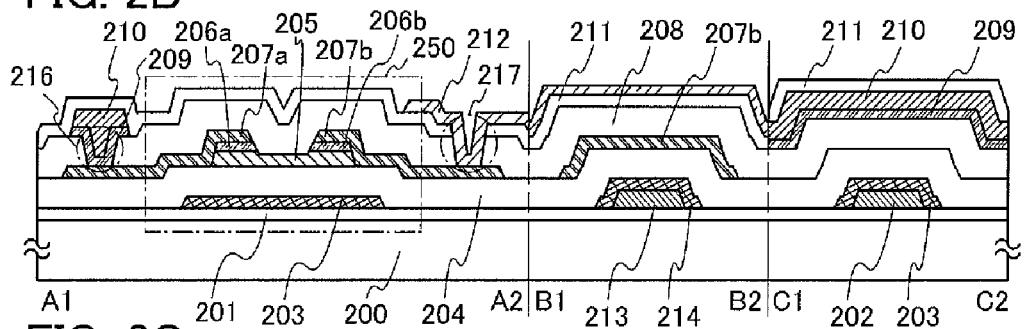
Figure 2C:
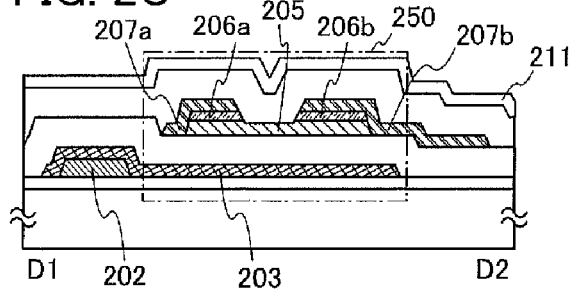

Next, an example of a pixel structure of the display device illustrated in FIGS. 1A and 1B is described with reference to FIGS. 2A to 2C. FIG. 2A is a plan view illustrating a plan structure of the pixel, and FIGS. 2B and 2C are cross-sectional views each illustrating a stacked-layer structure of the pixel. Note that chain lines A1-A2, B1-B2, and C1-C2 in FIG. 2A correspond to cross sections A1-A2, B1-B2, and C1-C2 in FIG. 2B, respectively. Chain line D1-D2 in FIG. 2A corresponds to cross section D1-D2 in FIG. 2C.

In cross section A1-A2 and cross section D1-D2, a stacked-layer structure of a thin film transistor 250 used in the pixel and a stacked-layer structure of a gate wiring 202 and a gate wiring 203 are illustrated. The thin film transistor 250 has a kind of bottom-gate structure called a channel-etched type In cross section A1-A2 and cross section D1-D2, an insulating layer 201 is provided over a substrate 200; the gate wiring 202 is provided over the insulating layer 201; the gate wiring 203 is provided over the gate wiring 202; an insulating layer 204 is provided over the gate wiring 203; a semiconductor layer 205 is provided over the insulating layer 204; a pair of impurity semiconductor layers 206a and 206b is provided over the semiconductor layer 205; a pair of electrodes 207a and 207b is provided over the impurity semiconductor layers 206a and 206b; an insulating layer 208 is provided over the electrode 207a, the electrode 207b, and the semiconductor layer 205; a source wiring 209 is in contact with the electrode 207a through an opening 216 provided in the insulating layer 208; a source wiring 210 is provided over the source wiring 209; an insulating layer 211 is provided over the source wiring 210; and an electrode 212 is in contact with the electrode 207b through an opening 217 provided in the insulating layer 211 and the insulating layer 208.

Further, in cross section B1-B2, a stacked-layer structure of a storage capacitor (also referred to as a Cs capacitor) is illustrated. In cross section B1-B2, the insulating layer 201 over the substrate 200, a storage capacitor wiring 213 over the insulating layer 201, a storage capacitor wiring 214 over the storage capacitor wiring 213, the insulating layer 204 over the storage capacitor wiring 214, the electrode 207b over the insulating layer 204, the insulating layer 208 over the electrode 207b, the insulating layer 211 over the insulating layer 208, and the electrode 212 over the insulating layer 211 are illustrated.

Further, in cross section C1-C2, a stacked-layer structure in a wiring intersection portion of the gate wiring and the source wiring is illustrated. In cross section C1-C2, the insulating layer 201 over the substrate 200, the gate wiring 202 over the insulating layer 201, the gate wiring 203 over the gate wiring 202, the insulating layer 204 over the gate wiring 203, the insulating layer 208 over the insulating layer 204, the source wiring 209 over the insulating layer 208, the source wiring 210 over the source wiring 209, and the insulating layer 211 over the source wiring 210 are illustrated.

Note that in the wiring intersection portion, a semiconductor layer may be formed between the insulating layer 204 and the insulating layer 208. With such a structure, the distance in the film thickness direction between the gate wiring and the source wiring can be increased, and thus parasitic capacitance in the wiring intersection portion can be reduced.

Figure 3A:
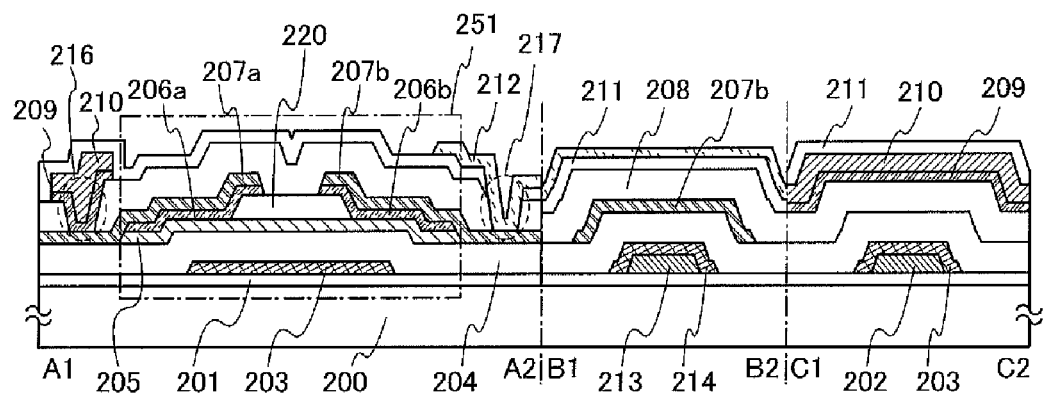
FIGS. 3A and 3B are cross-sectional views illustrating an embodiment of the present invention.
Figure 3B:
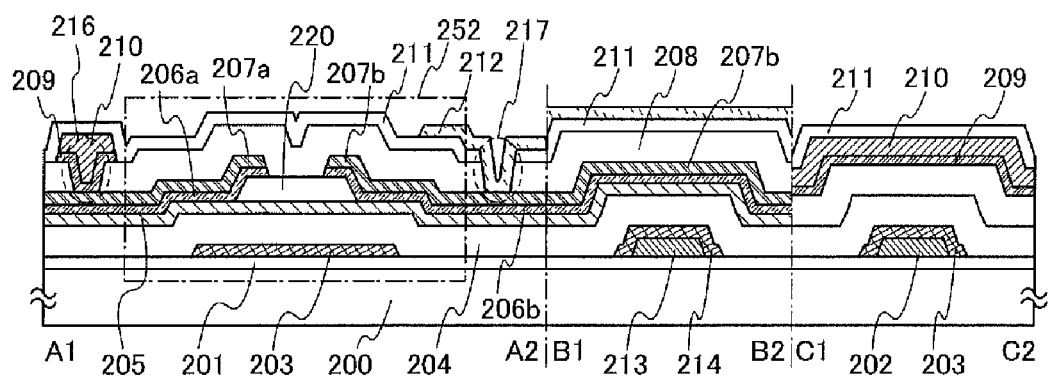

Further, an embodiment of the present invention is not limited to the pixel structure illustrated in FIG. 2B. FIGS. 3A and 3B each illustrate an example of a pixel structure different from that of FIG. 2B. Each of a thin film transistor 251 and a thin film transistor 252, which are respectively illustrated in FIGS. 3A and 3B, is one type of a bottom-gate thin film transistor and can be called a channel-protective thin film transistor.

The thin film transistor 251 and the thin film transistor 252 each include the insulating layer 201 provided over the substrate 200, the gate wiring 203 provided over the insulating layer 201, the insulating layer 204 provided over the gate wiring 203, the semiconductor layer 205 provided over the insulating layer 204, an insulating layer 220 provided over the semiconductor layer 205, the pair of impurity semiconductor layers 206a and 206b which are in contact with the semiconductor layer 205 and provided over the insulating layer 220, the pair of electrodes 207a and 207b provided over the impurity semiconductor layers 206a and 206b, the insulating layer 208 provided over the electrodes 207a and 207b, the source wiring 209 which is in contact with the electrode 207a through the opening 216 provided in the insulating layer 208, the source wiring 210 provided over the source wiring 209, the insulating layer 211 provided over the source wiring 210, and the electrode 212 which is in contact with the electrode 207b through the opening 217 provided in the insulating layer 211 and the insulating layer 208.

In the channel-protective thin film transistor, the insulating layer 220 is formed in contact with a region of the semiconductor layer 205 where a channel is formed before the impurity semiconductor layers 206a and 206b are formed. The insulating layer 220 serves as a channel protective layer and can prevent part of the semiconductor layer 205 which is to be a channel formation region from being removed when an impurity semiconductor layer 206 is etched. Although an additional step of forming the insulating layer 220 is required for the channel-protective thin film transistor compared to a channel-etched thin film transistor, removal of part of the semiconductor layer 205 can be prevented during the etching of the impurity semiconductor layer 206; accordingly, thin film transistors with excellent electric characteristics and small variations can be formed.

FIG. 3A illustrates a cross-sectional structure of the thin film transistor 251 in which an island-shaped semiconductor layer is formed before the electrodes 207a and 207b are formed. FIG. 3B illustrates a cross-sectional structure of the thin film transistor 252 in which an island-shaped semiconductor layer is not formed before the electrodes 207a and 207b are formed and the impurity semiconductor layer 206 and the semiconductor layer 205 are selectively removed using the electrodes 207a and 207b as a mask.

In the structure illustrated in FIG. 3B, a photolithography step of forming the island-shaped semiconductor layer can be omitted, but the impurity semiconductor layer 206 and the semiconductor layer 205 remain in a storage capacitor portion in cross section B1-B2.

Although not shown, the insulating layer 220 may be formed in the wiring intersection portion in cross section C1-C2 in FIGS. 3A and 3B. By forming the insulating layer 220 in the wiring intersection portion, the distance in the film thickness direction between the gate wiring and the source wiring can be increased, and thus parasitic capacitance in the wiring intersection can be reduced. Note that a semiconductor layer may be formed in the wiring intersection portion, in addition to the insulating layer 220. The insulating layer 220 can be formed by a method similar to the method for forming another insulating layer.

By forming the gate wiring 202 and the source wiring 210 using a conductive material including Cu, an increase in wiring resistance can be prevented. Further, by forming the gate wiring 203 using a conductive material including an element with a higher melting point than Cu, such as tungsten (W), tantalum (Ta), molybdenum (Mo), titanium (Ti), or chromium (Cr), so as to be in contact with and cover the gate wiring 202, migration of the gate wiring 202 can be suppressed and the reliability of the semiconductor device can be improved. Furthermore, by providing insulating layers including silicon nitride as the insulating layers under and over the gate wiring 202 including Cu in order that the gate wiring 202 may be sandwiched between or surrounded by the insulating layers, Cu diffusion from the gate wiring 202 can be prevented.

In addition, the gate wiring 202 is provided in such a manner that it does not overlap with the semiconductor layer 205 in which a channel of the thin film transistor is formed, and part of the gate wiring 203 which is in contact with the gate wiring 202 is extended to overlap with the semiconductor layer 205 and serve as a gate electrode. With such a structure, an effect of Cu included in the gate wiring 202 on the thin film transistor can be further reduced.

Embodiment 2

In this embodiment, a manufacturing process of a pixel portion in the display device described in Embodiment 1 will be described with reference to FIGS. 4A to 4D and FIGS. 5A to 5C. Note that cross sections A1-A2, B1-B2, C1-C2, and D1-D2 in FIGS. 4A to 4D and FIGS. 5A to 5C are cross-sectional views taken along chain lines A1-A2, B1-B2, C1-C2, and D1-D2 in FIG. 2A, respectively.

First, as a base insulating layer, the insulating layer 201 including silicon nitride is formed with a thickness of 50 nm to 300 nm inclusive, preferably 100 nm to 200 nm inclusive over the substrate 200. As the substrate 200, in addition to a glass substrate and a ceramic substrate, a plastic substrate or the like with enough heat resistance to withstand a process temperature in this manufacturing process can be used. In the case where the substrate does not need a light-transmitting property, a metal substrate, such as a stainless steel alloy substrate, provided with an insulating film on its surface may be used. As a glass substrate, an alkali-free glass substrate of barium borosilicate glass, aluminoborosilicate glass, aluminosilicate glass, or the like may be used. Alternatively, a quartz substrate, a sapphire substrate, or the like can be used. Further, as for the substrate 200, a glass substrate with any of the following sizes can be used: the 3rd generation (550 mm×650 mm), the 3.5th generation (600 mm×720 mm or 620 mm×750 mm), the 4th generation (680×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), or the 10th generation (2950 mm×3400 mm). In this embodiment, aluminoborosilicate glass is used for the substrate 200.

The insulating layer 201 can be formed as a single layer or a stacked layer of a silicon nitride film and/or a silicon nitride oxide film. Note that in this specification, silicon nitride oxide refers to silicon that includes more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. The insulating layer 201 can be formed by a sputtering method, a CVD method, a coating method, a printing method, or the like as appropriate. In this embodiment, a 100-nm-thick silicon nitride film is formed as the insulating layer 201.

Then, a conductive film including Cu is formed with a thickness of 100 nm to 500 nm inclusive, preferably 200 nm to 300 nm inclusive over the insulating layer 201 by a sputtering method, a vacuum evaporation method, or a plating method. A mask is formed over the conductive film by a photolithography method, an ink jetting method, or the like and the conductive film is etched using the mask; thus, the gate wiring 202 and the storage capacitor wiring 213 can be formed. Alternatively, the gate wiring 202 and the storage capacitor wiring 213 can be formed by discharging a conductive nanopaste of copper or the like over the substrate by an ink jetting method and baking the conductive nanopaste.

In order to improve adhesion of the gate wiring 202, a layer of metal such as W, Ta, Mo, Ti, or Cr, a layer of an alloy including a combination of any of these elements, or a layer of nitride or oxide of any of these elements may be formed between the insulating layer 201 and the gate wiring 202.

Further, in the formation of the conductive film including Cu by a sputtering method, a target material is not limited to a pure Cu material, and a Cu alloy material in which an element such as W, Ta, Mo, Ti, Cr, Al, zirconium (Zr), or calcium (Ca) is added alone or in combination to Cu at 10 wt % or less, preferably 2 wt % or less can be used. By using a Cu alloy material, adhesion of a Cu wiring can be improved or migration such as hillocks can be less likely to occur.

A rare gas typified by Ar can be used as a sputtering gas; if a rare gas to which oxygen is added is used as a sputtering gas, Cu oxide is formed at the interface with the underlying layer, whereby adhesion can be improved. At this time, by using a target material to which an element which is oxidized more easily than Cu is added, adhesion can be further improved. Note that since Cu oxide has higher resistance than Cu, it is preferable that a rare gas to which oxygen is added be used as a sputtering gas only at the beginning of sputtering, and then only a rare gas be used for sputtering.

In this embodiment, a 250-nm-thick Cu film is formed by a sputtering method over the insulating layer 201 and the Cu film is selectively etched using a resist mask formed by a first photolithography step, whereby the gate wiring 202 and the storage capacitor wiring 213 are formed (see FIG. 4A).

Then, a conductive film of an element with a higher melting point than Cu, such as W, Ta, Mo, Ti, or Cr, or an alloy or the like including a combination of any of these elements is formed with a thickness of 5 nm to 200 nm inclusive, preferably 10 nm to 100 nm inclusive by a sputtering method, a vacuum evaporation method, or the like over the gate wiring 202 and the storage capacitor wiring 213. The conductive film is not limited to a single-layer film including any of the above elements and can be a stacked-layer film of two or more layers. In this embodiment, a 200-nm-thick single layer of molybdenum is formed as the conductive film.

Then, a mask is formed over the conductive film by a photolithography method, an ink jetting method, or the like, and then the conductive film is etched using the mask; thus, the gate wiring 203 and the storage capacitor wiring 214 can be formed. In this embodiment, the conductive film is selectively etched using a resist mask formed by a second photolithography step, whereby the gate wiring 203 and the storage capacitor wiring 214 are formed (see FIG. 4B).

By forming a gate wiring and a storage capacitor wiring with a structure in which a conductive material including an element with a higher melting point than Cu covers a conductive material including Cu, migration of the layer including Cu is suppressed; thus, the reliability of the semiconductor device can be improved. In particular, when a gate wiring of a bottom-gate thin film transistor, which is easily affected by heat load of the following steps or stress of stacked films, has the above structure so as to be less affected by them, the reliability of the semiconductor device can be improved.

Then, the insulating layer 204 serving as a gate insulating layer is formed with a thickness of 50 nm to 800 nm inclusive, preferably 100 nm to 600 nm inclusive over the gate wiring 203 and the storage capacitor wiring 214. The insulating layer 204 can be formed by a method similar to the method for forming the insulating layer 201. In this embodiment, a 500-nm-thick silicon nitride film is formed as the insulating layer 204. The insulating layer 204 also serves as a protective layer. By providing insulating layers including silicon nitride as the insulating layers under and over the gate wiring 202 including Cu in order that the gate wiring 202 may be sandwiched between or surrounded by the insulating layers, Cu diffusion from the gate wiring 202 can be prevented.

Then, the semiconductor layer 205 is formed with a thickness of 30 nm to 300 nm inclusive, preferably 50 nm to 200 nm inclusive over the insulating layer 204. The semiconductor layer 205 can be formed of a semiconductor layer with an amorphous, microcrystalline, or polycrystalline crystal structure by a known method such as a CVD method, a sputtering method, or a laser annealing method. For example, a layer of an amorphous semiconductor or a microcrystalline semiconductor can be formed using a deposition gas diluted with hydrogen by a plasma CVD method. As a deposition gas, a gas including silicon or germanium can be used. As a deposition gas including silicon, silane ($SiH_4$), disilane ($Si_2H_6$), dichlorosilane ($SiH_2Cl_2$), $SiHCl_3$, silicon chloride ($SiCl_4$), silicon fluoride ($SiF_4$), or the like can be used. As a deposition gas including germanium, germane (GeH$_4$), digermane (Ge$_2$H$_6$), germane fluoride (GeF$_4$), or the like can be used.

A polycrystalline semiconductor layer can be formed by forming an amorphous semiconductor layer or a microcrystalline semiconductor layer, and then subjecting the formed semiconductor layer to heat treatment at 600° C. or more, RTA treatment, or laser light irradiation. In crystallization by RTA treatment or laser light irradiation, a semiconductor film can be instantaneously heated; therefore, it is particularly effective in the case of forming a polycrystalline semiconductor over a substrate having a low strain point. In this embodiment, a 150-nm-thick amorphous silicon layer is formed by a plasma CVD method as the semiconductor layer 205.

The semiconductor layer 205 can be formed using an intrinsic semiconductor (an i-type semiconductor), for example. An intrinsic semiconductor ideally is a semiconductor which does not include impurities and whose Fermi level lies substantially in the middle of the forbidden band, but in this specification, a semiconductor to which an impurity serving as a donor (e.g., phosphorus (P)) or an impurity serving as an acceptor (e.g., boron (B)) is added so that Fermi level may lie in the middle of the forbidden band also is an intrinsic semiconductor.

Further, even when Fermi level of the semiconductor layer 205 is shifted from the middle of the forbidden band by addition of an impurity serving as a donor or an acceptor to the semiconductor layer 205 so as to make the thin film transistor behave as an enhancement-type or depletion-type thin film transistor, the semiconductor layer 205 also is an intrinsic semiconductor in this specification.

Then, the impurity semiconductor layer 206 is formed with a thickness of 10 nm to 200 nm inclusive, preferably 30 nm to 100 nm inclusive over the semiconductor layer 205. The impurity semiconductor layer 206 can be formed by, for example, a plasma CVD method using a deposition gas diluted with hydrogen and also using a gas including an element imparting conductivity to the semiconductor layer.

In order to add p-type conductivity to the semiconductor layer, a gas including boron (B) such as borane (BH$_3$) or diborane (B$_2$H$_6$) can be used. In order to add n-type conductivity to the semiconductor layer, a gas including phosphorus (P) such as phosphine (PH$_3$) can be used.

Alternatively, the impurity semiconductor layer 206 can be formed by adding an element imparting conductivity to a surface of the semiconductor layer 205 by an ion implantation method or a plasma doping method.

By successively forming the insulating layer 204, the semiconductor layer 205, and the impurity semiconductor layer 206 without exposure to air, attachment of contaminants especially to an interface between the insulating layer 204 serving as a gate insulating film and the semiconductor layer 205 can be prevented; thus, characteristics of the thin film transistors can be improved. In this embodiment, a 50-nm-thick n-type amorphous silicon layer is formed as the impurity semiconductor layer 206 by a plasma CVD method.

Then, a mask is formed over the impurity semiconductor layer 206 by a photolithography method, an ink jetting method, or the like and the semiconductor layer 205 and the impurity semiconductor layer 206 are selectively etched using the mask to provide the semiconductor layer 205 having an island shape and the impurity semiconductor layer 206 having an island shape. In this embodiment, the semiconductor layers are selectively etched using a resist mask formed by a third photolithography step to be the semiconductor layer 205 having an island shape and the impurity semiconductor layer 206 having an island shape (see FIG. 4C).

Then, although not shown in FIGS. 2A to 2C, FIGS. 3A and 3B, FIGS. 4A to 4D, and FIGS. 5A to 5C, an opening (also referred to as a contact hole) for connecting the gate wiring 203 to the electrode 207a or the electrode 207b which will be described later is formed in the insulating layer 204. The contact hole is formed by forming a mask over the insulating layer 204 by a photolithography method, an ink jetting method, or the like, and then selectively etching the insulating layer 204 using the mask. Here, the insulating layer 204 is selectively etched using a resist mask formed by a fourth photolithography step, whereby a contact hole is formed.

Note that the contact hole may be formed by the fourth photolithography step after the formation of the insulating layer 204 and before the formation of the semiconductor layer 205.

Then, a conductive film of W, Ta, Mo, Ti, Cr, Al, or the like or a conductive film of an alloy or the like including a combination of any of these elements is formed with a thickness of 100 nm to 500 nm inclusive, preferably 200 nm to 300 nm inclusive by a sputtering method, a vacuum evaporation method, or the like over the impurity semiconductor layer 206. The conductive film is not limited to a single-layer film including any of the above elements and can be a stacked-layer film of two or more layers. Note that inclusion of Cu in this conductive film is prevented as much as possible. If this conductive film includes Cu, Cu may be diffused into the semiconductor layer in the formation of the electrodes 207a and 207b which is performed later.

Then, a mask is formed over the conductive film by a photolithography method, an ink jetting method, or the like and the conductive film is etched using the mask; thus, the electrode 207a serving as a source electrode and the electrode 207b serving as the drain electrode can be formed. In this embodiment, a 200-nm-thick Ti film is formed by a sputtering method as the conductive film, and then the conductive film is selectively etched by a dry etching method using a resist mask formed by a fifth photolithography step, whereby the electrodes 207a and 207b are formed.

Then, without removing the resist mask, part of the semiconductor layer 205 and part of the impurity semiconductor layer 206 are etched to form the impurity semiconductor layer 206a and the impurity semiconductor layer 206b. In this embodiment, without removing the resist mask, part of the semiconductor layer 205 and part of the impurity semiconductor layer 206 are etched by a dry etching method, whereby the impurity semiconductor layers 206a and 206b are formed (see FIG. 4D). Alternatively, part of the semiconductor layer 205 and part of the impurity semiconductor layer 206 may be etched using the electrodes 207a and 207b as a mask after the resist mask is removed.

Note that, alternatively, wet etching for etching the conductive film and dry etching for etching part of the semiconductor layer 205 and part of the impurity semiconductor layer 206 may be successively performed. The impurity semiconductor layer 206a serves as a source region and the impurity semiconductor layer 206b serves as a drain region. Further, part of the semiconductor layer 205 between the impurity semiconductor layer 206a and the impurity semiconductor layer 206b serves as a channel region.

Then, the insulating layer 208 is formed with a thickness of 50 nm to 800 nm inclusive, preferably 100 nm to 600 nm inclusive. The insulating layer 208 can be formed by a method similar to the method for forming the insulating layer 201. In this embodiment, a 400-nm-thick silicon nitride film is formed as the insulating layer 208.

Then, the opening 216 (also referred to as a contact hole) for connecting the electrode 207a to the source wiring 209 is formed in the insulating layer 208. The contact hole is formed by forming a mask over the insulating layer 208 by a photolithography method, an ink jetting method, or the like, and then selectively etching the insulating layer 208 using the mask. In this embodiment, the insulating layer 208 is selectively etched using a resist mask formed by a sixth photolithography step, whereby a contact hole is formed.

Then, a conductive film for the formation of the source wiring 209 is formed using an element with a higher melting point than Cu, such as W, Ta, Mo, Ti, or Cr, or an alloy or the like including a combination of any of these elements with a thickness of 5 nm to 200 nm inclusive, preferably 10 nm to 100 nm inclusive by a sputtering method, a vacuum evaporation method, or the like. Alternatively, a film of tantalum nitride, titanium nitride, molybdenum nitride, or the like may be formed by a reactive sputtering method.

Then, a conductive film including Cu is formed with a thickness of 100 nm to 500 nm inclusive, preferably 200 nm to 300 nm inclusive by a sputtering method, a vacuum evaporation method, or a plating method. A mask is formed over the conductive film by a photolithography method, an ink jetting method, or the like and the conductive film including Cu and the conductive film for the formation of the source wiring 209 are etched using the mask; thus the source wiring 209 and the source wiring 210 can be formed.

In this embodiment, a 50-nm-thick titanium nitride film is used as the conductive film for the formation of the source wiring 209 and a 250-nm-thick Cu film is used as the conductive film for the formation of the source wiring 210, and the conductive films are selectively etched using a resist mask formed by a seventh photolithography step, whereby the source wiring 209 and the source wiring 210 are formed (see FIG. 5A).

The source wiring 209 also serves as a barrier layer for preventing diffusion of Cu. By forming a source wiring with a stacked-layer structure having a layer including Cu and a layer including an element with a higher melting point than Cu, migration of the layer including Cu is suppressed; thus, the reliability of the semiconductor device can be improved. Further, a structure is also acceptable in which another layer including an element with a higher melting point than Cu is also formed over the source wiring 210 so that the layer including Cu is sandwiched between the layers including an element with a higher melting point than Cu. Note that the source wiring may be a single layer including Cu, depending on the usage environment or the usage condition of the semiconductor device. The layer including Cu can be formed by a method similar to the method for forming the gate wiring 202 to have a structure similar to the structure of the gate wiring 202.

Then, the insulating layer 211 is formed with a thickness of 50 nm to 300 nm inclusive, preferably 100 nm to 200 nm inclusive. The insulating layer 211 can be formed by a method similar to the method for forming the insulating layer 201. The insulating layer 211 also serves as a passivation layer which prevents an effect of contamination substances from the outside on the thin film transistors. In this embodiment, a 10-nm-thick silicon nitride film is formed as the insulating layer 211. The insulating layer 211 also serves as a protective layer. By providing insulating layers including silicon nitride as the insulating layers under and over the source wiring 210 including Cu in order that the source wiring 210 may be sandwiched between or surrounded by the insulating layers, Cu diffusion from the source wiring 210 can be prevented (see FIG. 5B).

Then, a contact hole for connecting the electrode 207b to the electrode 212 serving as a pixel electrode is formed in the insulating layer 211 and the insulating layer 208. The contact hole is formed by forming a mask over the insulating layer 211 by a photolithography method, an ink jetting method, or the like, and then selectively etching the insulating layers 211 and 208 using the mask. In this embodiment, the insulating layers 211 and 208 are selectively etched using a resist mask formed by an eighth photolithography step, whereby a contact hole (the opening 217) is formed.

Then, a light-transmitting conductive film is formed with a thickness of 30 nm to 200 nm inclusive, preferably 50 nm to 100 nm inclusive by a sputtering method, a vacuum evaporation method, or the like. A mask is formed over the conductive film by a photolithography method, an ink jetting method, or the like, and then the conductive film is etched using the mask; thus, the electrode 212 which serves as a pixel electrode can be formed.

For the light-transmitting conductive film, a light-transmitting conductive material such as indium oxide including tungsten oxide, indium zinc oxide including tungsten oxide, indium oxide including titanium oxide, indium tin oxide including titanium oxide, iridium tin oxide (hereinafter, also referred to as ITO), indium zinc oxide (hereinafter, also referred to as IZO), or indium tin oxide to which silicon oxide is added can be used.

Alternatively, the light-transmitting conductive film can be formed using a conductive composition including a conductive high molecule (also referred to as a conductive polymer). The pixel electrode formed using a conductive composition preferably has a sheet resistance of 10000 Ω/square or less and a light transmittance of 70% or more at a wavelength of 550 nm. Further, the resistivity of the conductive high molecule included in the conductive composition is preferably 0.1 Ω·cm or less.

In this embodiment, an 80-nm-thick ITO film is formed as the light-transmitting conductive film, and then the light-transmitting conductive film is selectively etched using a resist mask formed by a ninth photolithography step, whereby the electrode 212 which serves as a pixel electrode is formed (see FIG. 5C).

By the above steps, an increase in wiring resistance can be suppressed, and a semiconductor device typified by a display device with excellent display quality can be provided. In addition, by providing insulating layers including silicon nitride as the insulating layers under and over the conductive layer including Cu in order that the conductive layer including Cu may be sandwiched between or surrounded by the insulating layers, Cu diffusion can be prevented and a highly reliable semiconductor device can be provided.

According to this embodiment, a method for manufacturing a thin film transistor with sufficient reliability whose threshold voltage is controlled, operation speed is high, and manufacturing process is relatively simple can be provided.

Here, a photolithography step using a multi-tone mask will be described with reference to FIGS. 6A to 6D and FIGS. 7A to 7E. A multi-tone mask is a photomask which can perform three levels of light exposure to obtain an exposed portion, a half-exposed portion, and an unexposed portion. Light has a plurality of intensities after passing through a multi-tone mask. One-time light exposure and development process with a multi-tone mask can form a resist mask with regions of plural thicknesses (typically, two thicknesses). Accordingly, by using a multi-tone mask, the number of photomasks can be reduced.

Figure 6A:
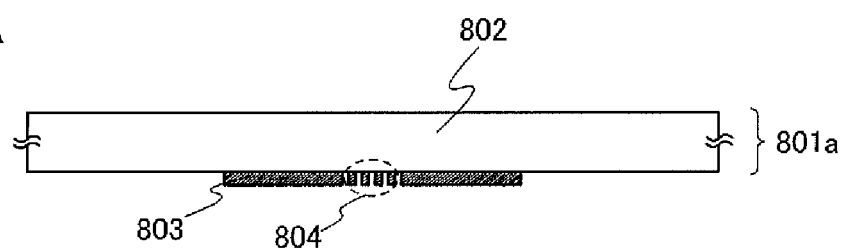
FIGS. 6A to 6D illustrate multi-tone masks.
Figure 6B:
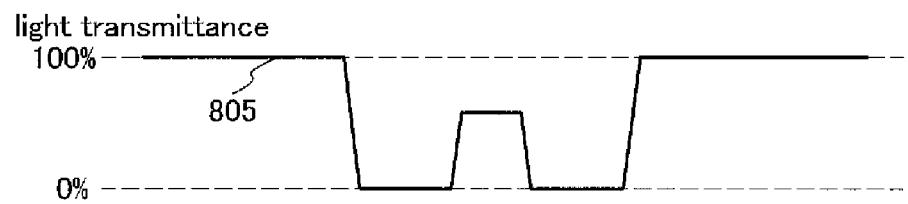
Figure 6C:
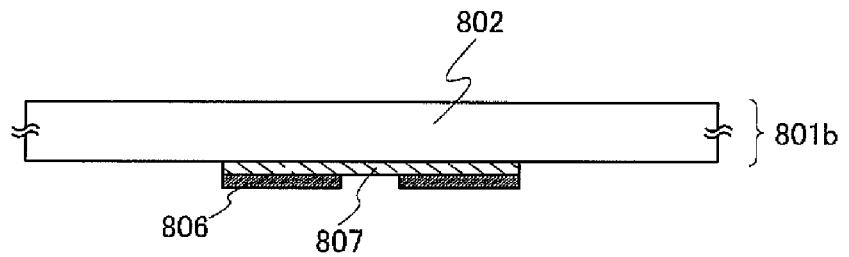

As typical examples of the multi-tone mask, a gray-tone mask 801a illustrated in FIG. 6A and a half-tone mask 801b illustrated in FIG. 6C are given.

The gray-tone mask 801a includes a light-transmitting substrate 802, and a light-blocking portion 803 and a diffraction grating 804 which are formed on the light-transmitting substrate 802. The light transmittance of the light-blocking portion 803 is 0%. On the other hand, the diffraction grating 804 has a light-transmitting portion in a slit form, a dot form, a mesh form, or the like with intervals which are equal to or less than the resolution limit of light used for the light exposure; thus, the light transmittance can be controlled. The diffraction grating 804 can have regularly-arranged slits, dots, or meshes, or irregularly-arranged slits, dots, or meshes.

As the light-transmitting substrate 802, a light-transmitting substrate such as a quartz substrate can be used. The light-blocking portion 803 and the diffraction grating 804 can be formed using a light-blocking material which absorbs light, such as chromium or chromium oxide.

When the gray-tone mask 801a is irradiated with light for exposure, a light transmittance 805 of the light-blocking portion 803 is 0% and the light transmittance 805 of a region where neither the light-blocking portion 803 nor the diffraction grating 804 is provided is 100% as shown in FIG. 6B. The light transmittance 805 of a region where the diffraction grating 804 is provided can be controlled in the range of 10% to 70%. The light transmittance of the diffraction grating 804 can be controlled by adjusting the interval and pitch of slits, dots, or meshes of the diffraction grating.

As shown in FIG. 6C, the half-tone mask 801b includes the light-transmitting substrate 802, and a semi-light-transmitting portion 807 and a light-blocking portion 806 which are formed on the light-transmitting substrate 802. The semi-light-transmitting portion 807 can be formed using MoSiN, MoSi, MoSiO, MoSiON, CrSi, or the like. The light-blocking portion 806 can be formed using a light-blocking material which absorbs light, such as chromium or chromium oxide.

Figure 6D:
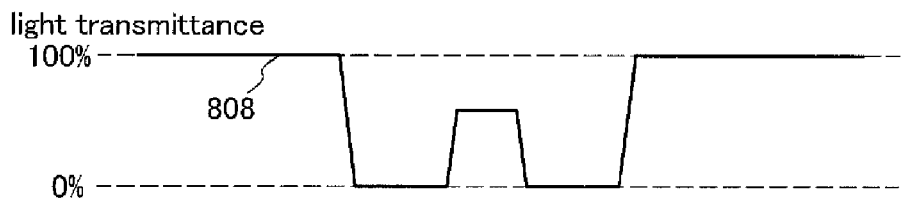

When the half-tone mask 801b is irradiated with light for exposure, a light transmittance 808 of the light-blocking portion 806 is 0% and the light transmittance 808 of a region where neither the light-blocking portion 806 nor the semi-light-transmitting portion 807 is provided is 100% as shown in FIG. 6D. The light transmittance 808 of a region where the semi-light-transmitting portion 807 is provided can be controlled in the range of 10% to 70%. The light transmittance of the semi-light-transmitting portion 807 can be controlled by a material of the semi-light-transmitting portion 807.

Next, with reference to FIGS. 7A to 7E, an example in which the third photolithography step and the fifth photolithography step are replaced with one photolithography step using a multi-tone mask will be described.

In the third photolithography step, after the semiconductor layer 205 and the impurity semiconductor layer 206 are formed over the insulating layer 204, they are processed into island-shaped semiconductor layers. In this example, however, the semiconductor layer 205 and the impurity semiconductor layer 206 are not processed into island-shaped semiconductor layers and formation of an electrode layer 207 over the impurity semiconductor layer 206 follows the formation of the impurity semiconductor layer 206. Then, a resist mask 231 having a depressed portion and a projected portion is formed over the electrode layer 207 using a multi-tone mask (see FIG. 7A).

The resist mask 231 can also be referred to as a resist mask including a plurality of regions (here, two regions) having different thicknesses. In the resist mask 231, a thick region is called a projected portion of the resist mask 231, and a thin region is called a depressed portion of the resist mask 231.

In the resist mask 231, a projected portion is formed in a region where the electrode 207a serving as a source electrode and the electrode 207b serving as a drain electrode are formed and a depressed portion is formed in a region between those regions where the electrode 207a and the electrode 207b are formed.

Figure 7A:
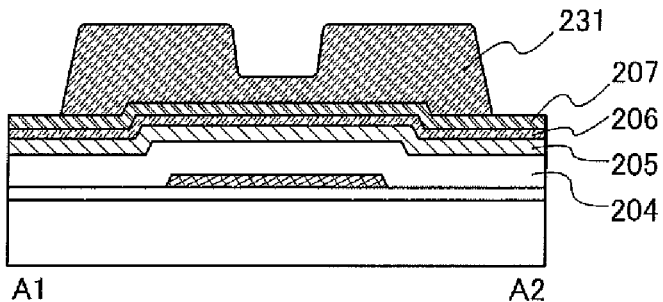
FIGS. 7A to 7E are cross-sectional process views illustrating an embodiment of the present invention.
Figure 7B:
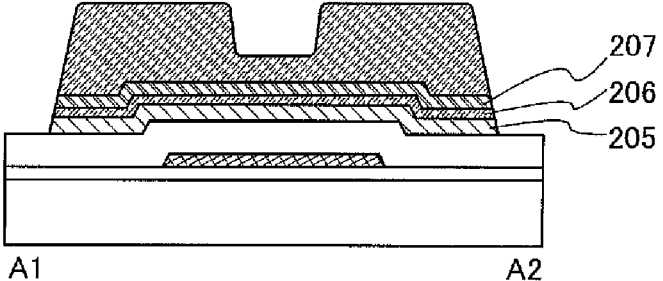
Figure 7C:
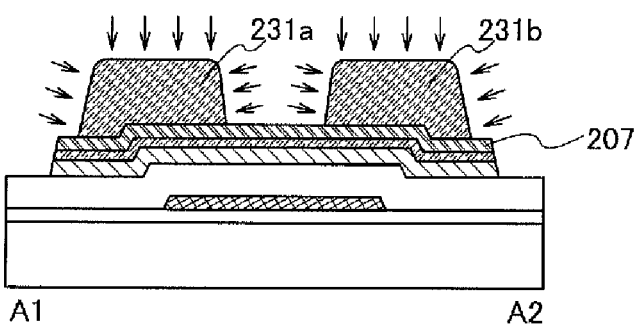
Figure 7D:
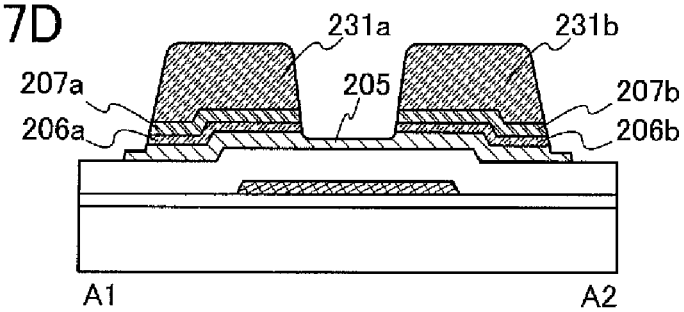

Then, the electrode layer 207, the impurity semiconductor layer 206, and the semiconductor layer 205 are selectively etched at the same time using the resist mask 231 to form the semiconductor layer 205 having an island shape and the impurity semiconductor layer 206 having an island shape (see FIG. 7B).

Then, the resist mask 231 is reduced (downsized) to form resist masks 231a and 231b. In order to reduce (downsize) the resist mask, oxygen plasma ashing or the like may be performed. When the resist mask is reduced (downsized), part of the electrode layer 207 which is between the resist masks 231a and 231b is exposed (see FIG. 7C).

Then, part of the electrode layer 207 and part of the impurity semiconductor layer 206 which are between the resist masks 231a and 231b are selectively etched using the resist masks 231a and 231b to provide the impurity semiconductor layer 206a, the impurity semiconductor layer 206b, the electrode 207a, and the electrode 207b. Note that the semiconductor layer 205 is partly etched at this time to be a semiconductor layer having a groove (a depressed portion). In addition, edges of the semiconductor layer 205 extend beyond edges of the electrode 207a and the electrode 207b. In addition, the thickness of the extending portion of the semiconductor layer 205 is smaller than that of a portion of the semiconductor layer 205 which overlaps with the electrode 207a or 207b (see FIG. 7D).

Figure 7E:
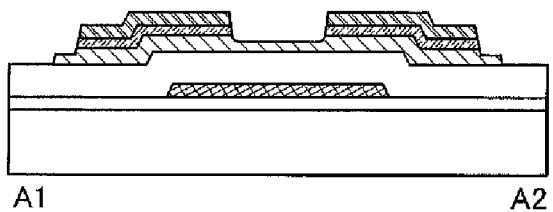

Then, the resist masks 231a and 231b are removed (see FIG. 7E). By using the multi-tone mask, a plurality of photolithography steps can be replaced with one photolithography step. Accordingly, the productivity of a semiconductor device can be improved.

Note that this embodiment can be combined with any other embodiments disclosed in this specification as appropriate.

Embodiment 3

In this embodiment, an example of a structure of a thin film transistor used for the gate driver circuit 91 or the source driver circuit 92 of the display device 30 which is described in Embodiment 1 with reference to FIGS. 1A and 1B will be described.

A driver circuit for driving a pixel portion is formed using an inverter circuit, a capacitor, a resistor, and the like. In this embodiment, a structure of an inverter circuit which includes two thin film transistors as thin film transistors used in the driver circuit is described. When the inverter circuit is formed using two n-channel TFTs in combination, there are an inverter circuit having two enhancement type TFTs (hereinafter, referred to as an EEMOS circuit) and an inverter circuit having a combination of an enhancement type transistor and a depletion type transistor (hereinafter, referred to as an EDMOS circuit). Note that an n-channel TFT whose threshold voltage is positive is referred to as an enhancement type transistor, and an n-channel TFT whose threshold voltage is negative is referred to as a depletion type transistor, throughout this specification.

Figure 8A:
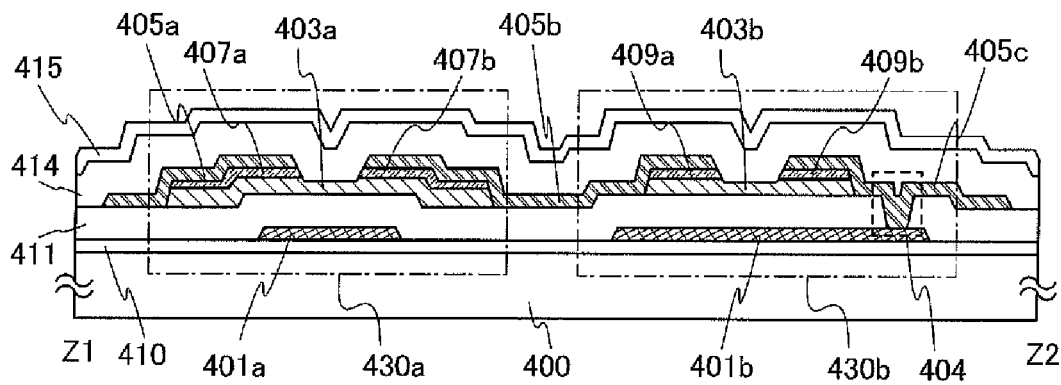
FIGS. 8A to 8C are a cross-sectional view, a circuit diagram, and a plan view, respectively, illustrating an embodiment of the present invention.
Figure 8B:
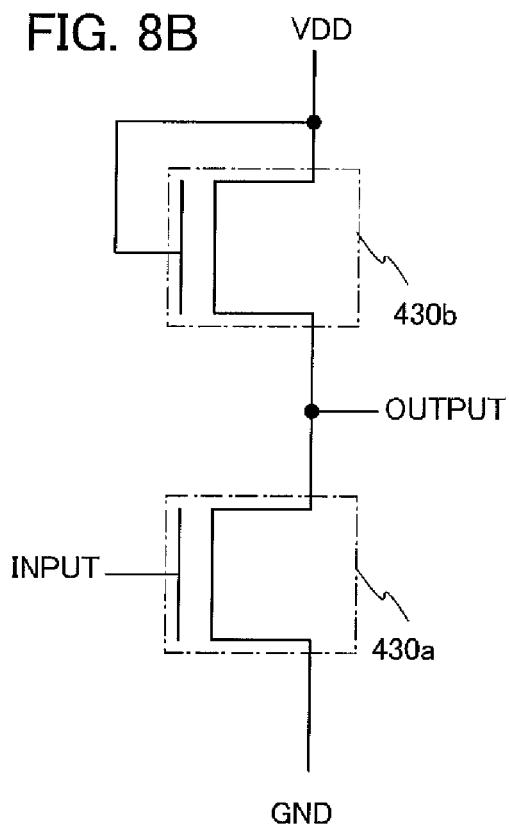
Figure 8C:
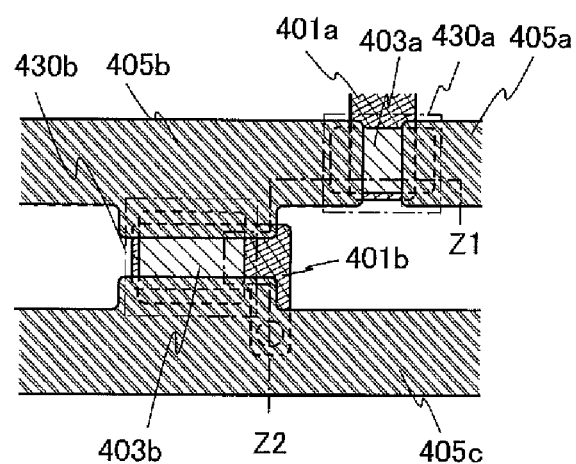

FIG. 8A illustrates a cross-sectional structure of the inverter circuit in the driver circuit. Further, FIG. 8C is a plan view of the inverter circuit of the driver circuit. FIG. 8A illustrates a cross section taken along chain line Z1-Z2 in FIG. 8C. Note that a first thin film transistor 430a and a second thin film transistor 430b illustrated in FIGS. 8A to 8C are inverted staggered thin film transistors having a bottom gate structure.

In the first thin film transistor 430a illustrated in FIG. 8A, a first gate wiring 401a is provided over a substrate 400 provided with an insulating layer 410, an insulating layer 411 is provided over the first gate wiring 401a, a first semiconductor layer 403a is provided over the insulating layer 411, a pair of impurity semiconductor layers 407a and 407b is provided over the first semiconductor layer 403a, and an electrode 405a and an electrode 405b are provided over the pair of impurity semiconductor layers 407a and 407b. In a similar manner, in the second thin film transistor 430b, a second gate wiring 401b is provided over the substrate 400 provided with the insulating layer 410, the insulating layer 411 is provided over the second gate wiring 401b, a second semiconductor layer 403b is provided over the insulating layer 411, a pair of impurity semiconductor layers 409a and 409b is provided over the second semiconductor layer 403b, and the electrode 405b and an electrode 405c are provided over the pair of impurity semiconductor layers 409a and 409b. Here, the electrode 405c is connected to the second gate wiring 401b through a contact hole 404 formed in the insulating layer 411. Further, an insulating layer 414 and an insulating layer 415 are formed over the electrode 405a, the electrode 405b, and the electrode 405c. Note that the electrode 405a, the electrode 405b, and the electrode 405c are extended as illustrated in FIG. 8C, and also function as wirings which electrically connect the thin film transistors in the driver circuit.

Here, the first gate wiring 401a and the second gate wiring 401b can be formed using a material and a method similar to those of the gate wiring 203 described in Embodiment 1 or 2. The first semiconductor layer 403a and the second semiconductor layer 403b can be formed using a material and a method similar to those of the semiconductor layer 205 described in Embodiment 1 or 2. The impurity semiconductor layers 407a and 407b and the impurity semiconductor layers 409a and 409b can be formed using a material and a method similar to those of the impurity semiconductor layers 206a and 206b described in Embodiment 1 or 2. The electrode 405a, the electrode 405b, and the electrode 405c can be formed using a material and a method similar to those of the pair of electrodes 207a and 207b described in Embodiment 1 or 2. The insulating layer 410, the insulating layer 411, the insulating layer 414, and the insulating layer 415 can be formed using materials and methods similar to those of the insulating layer 201, the insulating layer 204, the insulating layer 208, and the insulating layer 211 described in Embodiment 1 or 2.

Further, the contact hole 404 is formed by forming a mask over the insulating layer 411 and selectively etching the insulating layer 411 using the mask as in the case of the fourth photolithography step described in Embodiment 2. By the direct connection between the electrode 405c and the second gate wiring 401b through the contact hole 404, favorable contact can be obtained, which leads to a reduction in contact resistance. Moreover, as compared to the case where the electrode 405c is connected to the second gate wiring 401b through another conductive film such as a transparent conductive film, the number of contact holes can be reduced; consequently, the area occupied by the thin film transistor can be reduced and the distance between thin film transistors in the driver circuit can be shortened.

As described above, the distance between the thin film transistors in the driver circuit can be shortened and thus wiring resistance can be sufficiently reduced; therefore, a conductive layer including Cu is not necessarily used as a wiring which is electrically connected to a thin film transistor. Accordingly, the distance between the thin film transistor in the driver circuit and a conductive layer including Cu can be long enough, whereby diffusion of Cu into the semiconductor layers can be prevented. However, a long lead wiring such as a power supply line which supplies a power supply potential to each thin film transistor or a common wiring is easily affected by wiring resistance. Thus, a wiring formed using a conductive layer including Cu is preferably used for such wirings.

As described in Embodiment 1, the gate driver circuit 91 is connected to the gate wirings (20_1 to 20_$n$, note that n is a natural number); the source driver circuit 92 is connected to the source wirings (60_1 to 60_$m$, note that m is a natural number); and the gate wirings (20_1 to 20_$n$, note that n is a natural number) and the source wirings (60_1 to 60_$m$, note that m is a natural number) are formed using a conductive layer including Cu. Therefore, even in a display portion where the distance led by those wirings is long, wiring resistance can be sufficiently reduced.

The electrode 405a is a power supply line at a ground potential (a ground power supply line). This power supply line at a ground potential may be a power supply line to which negative voltage VDL is applied (a negative power supply line). The electrode 405c is electrically connected to a power supply line to which positive voltage VDD is applied (a positive power supply line).

An equivalent circuit of the EEMOS circuit is illustrated in FIG. 8B. The circuit connection illustrated in FIGS. 8A and 8C corresponds to the equivalent circuit illustrated in FIG. 8B, and the first thin film transistor 430a and the second thin film transistor 430b are n-channel enhancement transistors as an example.

Further, not being limited to the EEMOS circuit, an EDMOS circuit can be manufactured by forming the first thin film transistor 430a to be an n-channel enhancement transistor and forming the second thin film transistor 430b to be an n-channel depletion transistor. In that case, instead of the electrode 405c, the electrode 405b is connected to the second gate wiring 401b.

In order to manufacture an n-channel enhancement transistor and an n-channel depletion transistor over one substrate, for example, the first semiconductor layer 403a and the second semiconductor layer 403b are formed using different materials or under different conditions. An EDMOS circuit may be formed in such a manner that gate electrodes for controlling the threshold value are provided over the semiconductor layers to control the threshold value, and voltage is applied to the gate electrodes for controlling the threshold value so that one of the TFTs is normally on while the other TFT is normally off.

Note that the structure described in this embodiment can be combined with any of the structures described in the other embodiments as appropriate.

Embodiment 4

In this embodiment, a protective circuit using a semiconductor element will be described with reference to FIGS. 9A and 9B and FIG. 10. In addition, a structure of a connection portion where common wirings between which an insulating film is provided are connected will be described with reference to FIGS. 11A and 11B.

Figure 9A:
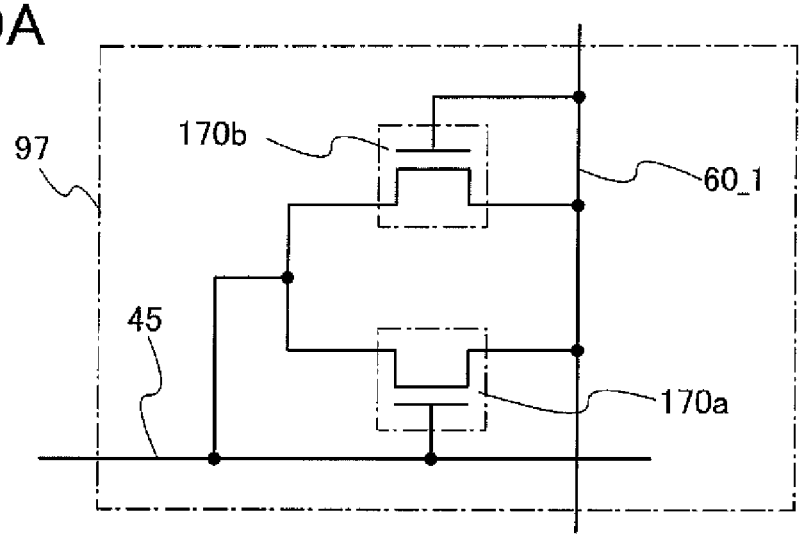
FIGS. 9A and 9B are a circuit diagram and a plan view, respectively, illustrating an embodiment of the present invention.
Figure 10:
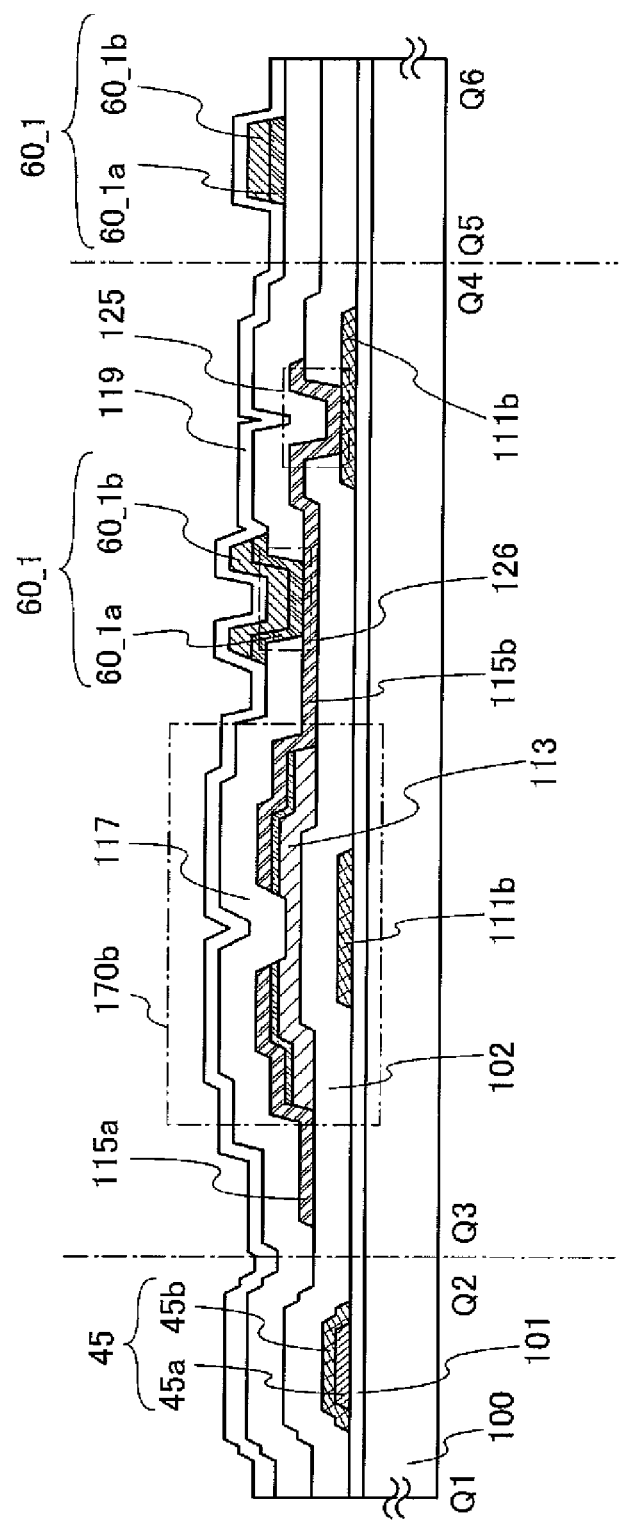
FIG. 10 is a cross-sectional view illustrating an embodiment of the present invention.

An example of a circuit that can be applied to the protective circuit 97 is illustrated in FIG. 9A. This protective circuit includes non-linear elements 170a and 170b. Each of the non-linear elements 170a and 170b includes a two-terminal element such as a diode or a three-terminal element such as a transistor. For example, the non-linear element can be formed through the same process as the transistor in the pixel portion.

For example, characteristics similar to those of a diode can be obtained by electrically connecting a gate to a drain of the non-linear element.

A first terminal (gate) and a third terminal (drain) of the non-linear element 170a are connected to the common wiring 45, and a second terminal (source) thereof is connected to the source wiring 60_1. A first terminal (gate) and a third terminal (drain) of the non-linear element 170b are connected to the source wiring 60_1, and a second terminal (source) thereof is connected to the common wiring 45. That is, the protective circuit illustrated in FIG. 9A has a structure in which the two transistors are each connected to the common wiring 45 and the source wiring 60_1 so as to have opposite rectifying directions. In other words, a transistor whose rectifying direction is from the common wiring 45 to the source wiring 60_1 and a transistor whose rectifying direction is from the source wiring 60_1 to the common wiring 45 are connected between the common wiring 45 and the source wiring 60_1.

In the above protective circuit, when the source wiring 60_1 is positively or negatively charged due to static electricity or the like, current flows in a direction that cancels the charge. For example, when the source wiring 60_1 is positively charged, current flows in a direction in which the positive charge is released to the common wiring 45. Owing to this operation, electrostatic breakdown or a shift in the threshold voltage of a pixel transistor connected to the charged source wiring 60_1 can be prevented. Moreover, it is possible to prevent dielectric breakdown of an insulating layer between the charged source wiring 60_1 and another wiring that intersect with each other.

Note that the protective circuit is not limited to the above structure. For example, a structure in which a plurality of transistors whose rectifying direction is from the common wiring 45 to the source wiring 60_1 and a plurality of transistors whose rectifying direction is from the source wiring 60_1 to the common wiring 45 are connected may be employed. By connecting the common wiring 45 and the source wiring 60_1 with a plurality of non-linear elements, charges can be prevented from being directly applied to the source wiring 60_1 not only in the case where surge voltage is applied to the source wiring 60_1 but also in the case where the common wiring 45 is charged due to static electricity or the like. In addition, a protective circuit can be configured using an odd number of non-linear elements.

Although FIG. 9A illustrates an example of the protective circuit provided for the source wiring 60_1 and the common wiring 45, a similar configuration can be applied to a protective circuit for another portion. Note that the protective circuit of FIG. 9A can be manufactured by applying a semiconductor element of one embodiment of the present invention to the non-linear element 170a and the non-linear element 170b.

Next, an example in which a protective circuit is formed over a substrate with the use of a semiconductor element of one embodiment of the present invention is described with reference to FIG. 9B and FIG. 10. Note that FIG. 9B is an example of a plan view of wirings and a connection portion between the wirings, and FIG. 10 is a cross-sectional view taken along line Q1-Q2, line Q3-Q4, and line Q5-Q6 in FIG. 9B.

Figure 9B:
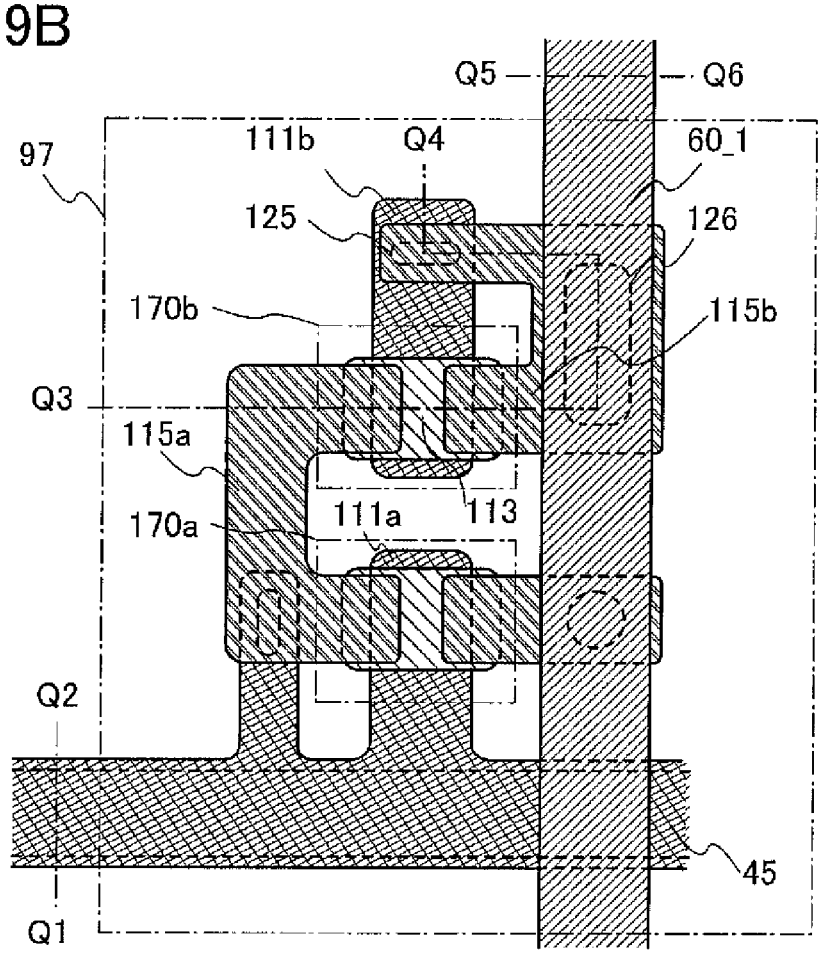

FIG. 9B is a plan view of a portion where the common wiring 45 and the source wiring 60_1 are connected with the non-linear element 170a and the non-linear element 170b and illustrates an example of a structure of the protective circuit 97.

The non-linear element 170a includes a gate wiring 111a, and the gate wiring 111a is connected to the common wiring 45. One of a source electrode and a drain electrode of the non-linear element 170a is connected to the source wiring 60_1, and the other thereof is formed of a first electrode 115a. Further, the first electrode 115a is connected to the common wiring 45.

The non-linear element 170b includes a gate wiring 111b, and the gate wiring 111b is connected to the source wiring 60_1 through a contact hole 126, a second electrode 115b, and a contact hole 125. A source electrode and a drain electrode of the non-linear element 170b are formed of the first electrode 115a and the second electrode 115b. Further, the non-linear element 170b includes a semiconductor layer 113.

Next, structures of the common wiring 45, the source wiring 60_1, and the non-linear element 170b are described with reference to FIG. 10.

The common wiring 45 is formed using the same wiring layer as the gate wiring. The common wiring 45 is formed so that a gate wiring 45a and a gate wiring 45b are stacked over an insulating layer 101 which is provided over the substrate 100. Note that an insulating layer 102 is formed over the gate wiring 45b, an insulating layer 117 is provided over the insulating layer 102, and an insulating layer 119 is formed over the insulating layer 117.

The source wiring 60_1 is formed over the insulating layer 117. The source wiring 60_1 is formed so that a source wiring 60_1a and a source wiring 60_1b are stacked in this order. Note that an insulating layer 119 is formed over the source wiring 60_1.

The non-linear element 170b includes the gate wiring 111b over the insulating layer 101 which is provided over the substrate 100, the insulating layer 102 over the gate wiring 111b, the semiconductor layer 113 over the gate wiring 111b with the insulating layer 102 interposed therebetween, and the electrode 115a and the electrode 115b which are in contact with the semiconductor layer 113 and end portions of which overlap with the gate wiring 111b. In addition, the insulating layer 117 is formed to overlap with the gate wiring 111b and be in contact with the semiconductor layer 113 which is between the end portions of the electrodes 115a and the electrode 115b, and the insulating layer 119 is formed over the insulating layer 117.

The electrode 115b is connected to the gate wiring 111b through the contact hole 125 provided in the insulating layer 102. In addition, the electrode 115b is connected to the source wiring 60_1 through the contact hole 126. The insulating layer 119 is formed over the insulating layer 117 and the source wiring 60_1.

For the conductive film serving as the electrode 115a and the electrode 115b, an element selected from Ti, Mo, W, Al, Cr, Cu, and Ta, an alloy including any of these elements as a component, an alloy including any of these elements in combination, or the like is used. The conductive film is not limited to a single-layer film including any of the above elements and can be a stacked-layer film of two or more layers.

Note that the non-linear element 170a and the non-linear element 170b have the same structure in the main portion. The non-linear element 170b can have the same structure as the thin film transistor in the pixel portion, which is described in Embodiment 1 or 2. Therefore, a detailed description of the non-linear element 170a and the non-linear element 170b is omitted in this embodiment. In addition, the non-linear elements 170a and 170b and the above thin film transistor can be manufactured over one substrate through the same process.

Figure 11A:
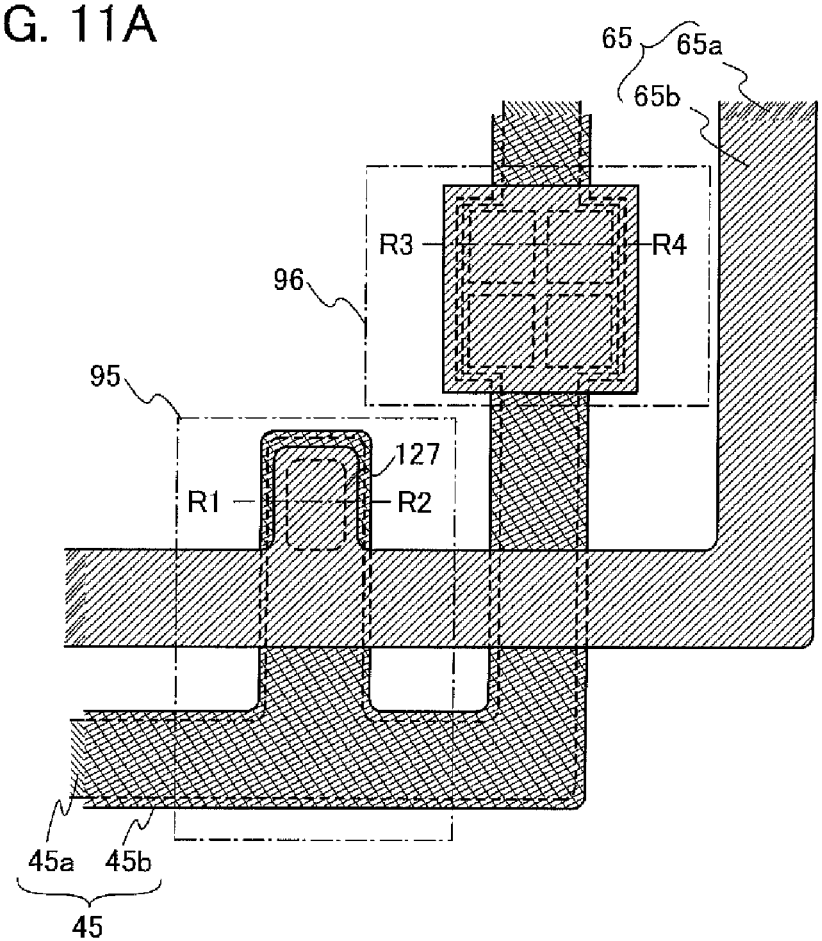
FIG. 11A is a plan view and FIG. 11B is a cross-sectional view illustrating an embodiment of the present invention.
Figure 11B:
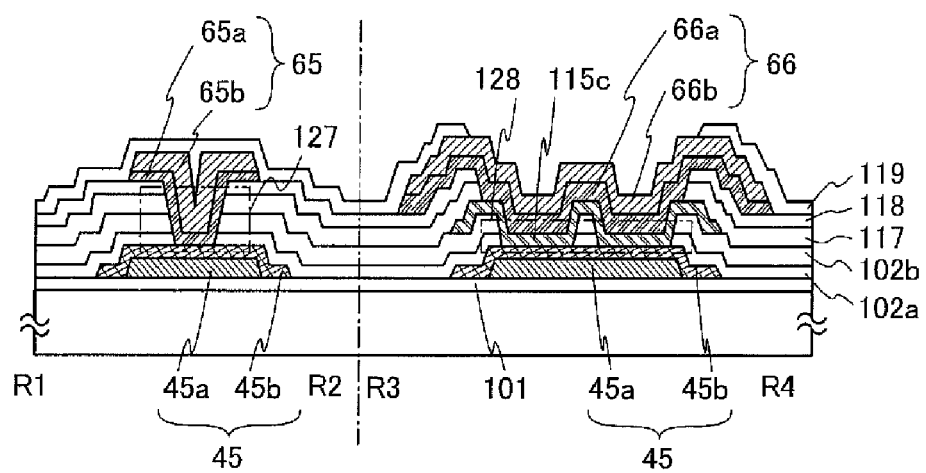

An example of a connection between the common wirings is described with reference to FIGS. 11A and 11B. Note that FIG. 11A is an example of a plan view of wirings and a connection portion between the wirings, and FIG. 11B is a cross-sectional view taken along line R1-R2 and line R3-R4 in FIG. 11A.

As described above, the common wiring 45 has a structure in which the gate wiring 45a and the gate wiring 45b are stacked in this order. The common wiring 65 has the same structure as the source wiring 60_1. In other words, the common wiring 65 has a structure in which a source wiring 65a and a source wiring 65b are stacked in this order; and the source wiring 65a is formed using the same conductive film as the source wiring 60_1a, and the source wiring 65b is formed using the same conductive film as the source wiring 60_1b.

In the connection portion 95, the common wiring 45 and the common wiring 65 are electrically connected to each other. The connection portion 95 is described with reference to FIG. 11B. The common wiring 45 and the common wiring 65 are connected to each other through a contact hole 127 formed in the insulating layers 102a and 102b, the insulating layer 117, and the insulating layer 118.

In the connection portion 95, the gate wiring 45b and the source wiring 65a which include a conductive material including an element with a higher melting point than Cu are connected to each other, and thus a highly reliable connection is realized. Furthermore, the gate wiring 45a and the source wiring 65b which are formed using a conductive material including Cu suppress an increase in wiring resistance of the common wiring 45 and the common wiring 65.

The common connection portion 96 is provided in a region outside the pixel portion and is electrically connected to a substrate provided with a connection portion which faces the common connection portion 96 with conductive particles (such as plastic particles plated with gold) interposed therebetween. An example in which the common connection portion 96 is formed over the conductive layer where the gate wiring 45a and the gate wiring 45b are stacked in this order is described with reference to FIG. 11B.

The common connection portion 96 is electrically connected to the common wiring 45. Over the conductive layer in which the gate wiring 45a and the gate wiring 45b are stacked in this order, an electrode 115c is formed with the insulating layers 102a and 102b interposed therebetween and is electrically connected to the conductive layer through a contact hole 128 that is formed in the insulating layers 102a and 102b. In addition, a conductive layer 66 which has the same structure as the common wiring 65 is formed over the electrode 115c with the insulating layer 117 and the insulating layer 118 interposed therebetween and is electrically connected to the electrode 115c through a contact hole that is formed in the insulating layer 117 and the insulating layer 118.

The gate wiring 45a and the source wiring 60_1b which are connected to the protective circuit described as an example in this embodiment are formed using a conductive material including Cu and thus have low wiring resistance.

By forming the gate wiring 45b using a conductive material including an element with a higher melting point than Cu, such as W, Ta, Mo, Ti, or Cr, so as to be in contact with and cover the gate wiring 45a, migration of the gate wiring 45a can be suppressed and the reliability of the semiconductor device can be improved. Further, by providing insulating layers including silicon nitride as the insulating layers under and over the gate wiring 45a including Cu in order that the gate wiring 45a including Cu may be sandwiched between or surrounded by the insulating layers, Cu diffusion from the gate wiring 45a can be prevented.

The protective circuit described as an example in this embodiment has a structure in which a first terminal (gate) of a non-linear element is directly connected to a second terminal (source) or a third terminal (drain) thereof through one contact hole. As a result, only one interface and one contact hole are formed for one connection, which are fewer than the numbers of interfaces and contact holes in the case of forming a connection through another wiring layer.

Note that when the number of interfaces needed for a connection is small, electric resistance can be suppressed. In addition, when the number of contact holes needed for a connection is small, the area occupied by the connection portion can be suppressed.

Accordingly, connection resistance can be suppressed in the protective circuit described as an example in this embodiment, which results in stable operation of the protective circuit. Moreover, since a connection is formed using only one contact hole, the area occupied by the protective circuit can be reduced and thus the size of the display device can be reduced.

Note that this embodiment can be combined with any other embodiments disclosed in this specification as appropriate.

Embodiment 5

In this embodiment, as for the display device described in Embodiment 1 with reference to FIGS. 1A and 1B, examples of structures of a gate signal line terminal in the gate terminal portion 7 and a source signal line terminal in the source terminal portion 8 will be described.

FIGS. 12A1 and 12A2 are a cross-sectional view and a plan view of the gate signal line terminal, respectively. FIG. 12A1 is a cross-sectional view taken along line C1-C2 in FIG. 12A2. In the gate signal line terminal, as illustrated in FIG. 12A1, an insulating layer 360 is formed over a substrate 300; a gate wiring 351a is formed over the insulating layer 360; a gate wiring 351b is formed to cover an end portion of the gate wiring 351a; an insulating layer 361, an insulating layer 364, and an insulating layer 365 are formed over the gate wiring 351b; and a transparent conductive layer 355 is formed over the insulating layer 365 and the gate wiring 351b. Here, the gate wiring 351a and the gate wiring 351b are collectively referred to as a gate wiring 351, and the gate wiring 351b serves as a first terminal of the gate signal line terminal. In addition, end portions of the insulating layers 361, 364, and 365 are patterned, so that an end portion of the gate wiring 351b is exposed and in direct contact with the transparent conductive layer 355. The transparent conductive layer 355 which is in direct contact with the end portion of the gate wiring 351b serving as the first terminal is a connection terminal electrode which serves as an input terminal. Here, the gate wiring 351a, the gate wiring 351b, and the transparent conductive layer 355 can be formed using materials and methods similar to those of the gate wiring 202, the gate wiring 203, and the electrode 212 which are described in Embodiments 1 and 2, respectively. In addition, the insulating layer 360, the insulating layer 361, the insulating layer 364, and the insulating layer 365 can be formed using materials and methods similar to those of the insulating layer 201, the insulating layer 204, the insulating layer 208, and the insulating layer 211 which are described in Embodiments 1 and 2, respectively.

By forming the gate wiring 351a using a conductive material including Cu, wiring resistance in the gate signal line terminal and a wiring led from the gate signal line terminal can be reduced. Further, by forming the gate wiring 351b using a conductive material including an element with a higher melting point than Cu, such as W, Ta, Mo, Ti, or Cr, so as to be in contact with and cover the gate wiring 351a, migration of the gate wiring 351a can be suppressed and the reliability of the semiconductor device can be improved. Furthermore, by providing insulating layers including silicon nitride as the insulating layers under and over the gate wiring 351a including Cu in order that the gate wiring 351a may be sandwiched between or surrounded by the insulating layers, Cu diffusion from the gate wiring 351a can be prevented.

Further, FIGS. 12B1 and 12B2 are a cross-sectional view and a plan view of the source signal line terminal, respectively. FIG. 12B1 is a cross-sectional view taken along line D1-D2 in FIG. 12B2. In the source signal line terminal, as illustrated in FIG. 12B1, the insulating layer 360 and the insulating layer 361 are formed over the substrate 300, an electrode 352 is formed over the insulating layer 361, the insulating layer 364 is formed over the electrode 352, a source wiring 354a is formed over the insulating layer 364, a source wiring 354b is formed over the source wiring 354a, the insulating layer 365 is formed over the source wiring 354b, and the transparent conductive layer 355 is formed over the insulating layer 365 and the electrode 352. Here, the source wiring 354a and the source wiring 354b are collectively referred to as a source wiring 354. In addition, end portions of the insulating layers 364 and 365 are patterned, so that an end portion of the electrode 352 is exposed and in direct contact with the transparent conductive layer 355. A contact hole is formed in the insulating layer 364, through which the electrode 352 serving as a second terminal of the source signal line terminal and the source wiring 354 are connected to each other. The transparent conductive layer 355 which is in direct contact with the end portion of the electrode 352 serving as the second terminal is a connection terminal electrode which serves as an input terminal. Here, the electrode 352, the source wiring 354a, the source wiring 354b, and the transparent conductive layer 355 can be formed using materials and methods similar to those of the pair of electrodes 207a and 207b, the source wiring 209, the source wiring 210, and the electrode 212 which are described in Embodiments 1 and 2, respectively. Further, the insulating layer 360, the insulating layer 361, the insulating layer 364, and the insulating layer 365 can be formed using materials and methods similar to those of the insulating layer 201, the insulating layer 204, the insulating layer 208, and the insulating layer 211 which are described in Embodiments 1 and 2, respectively.

By forming the source wiring 354b using a conductive material including Cu, wiring resistance in the source signal line terminal and a wiring led from the source signal line terminal can be reduced. Further, by forming the source wiring 354a using a conductive material including an element with a higher melting point than Cu, such as W, Ta, Mo, Ti, or Cr, an alloy including any of these elements in combination, tantalum nitride, titanium nitride, molybdenum nitride, or the like, so as to be in contact with the source wiring 354b, migration of the source wiring 354b can be suppressed and the reliability of the semiconductor device can be improved. Furthermore, by providing insulating layers including silicon nitride as the insulating layers under and over the source wiring 354b including Cu in order that the source wiring 354b may be sandwiched between or surrounded by the insulating layers, Cu diffusion from the source wiring 354b can be prevented.

Although FIGS. 12A1 and 12A2 illustrate an example where the gate wiring 351b which is the first terminal and included in the gate wiring 351 having a stacked-layer structure is connected to the transparent conductive layer 355 serving as the input terminal, this embodiment is not limited thereto. As illustrated in FIGS. 13A1 and 13A2, a structure in which the first terminal includes only the gate wiring 351a and the gate wiring 351a is in direct contact with the transparent conductive layer 355 may be employed. Here, FIG. 13A1 is a cross-sectional view taken along line C1-C2 in FIG. 13A2.

Furthermore, although FIGS. 12B1 and 12B2 illustrate an example where the source wiring 354 is connected to the transparent conductive layer 355 serving as the input terminal through the electrode 352 which is the second terminal, this embodiment is not limited thereto. As illustrated in FIGS. 13B1 and 13B2, the source wiring 354b in the source wiring 354 serving as the second terminal may be in direct contact with the transparent conductive layer 355. Here, FIG. 13B1 is a cross-sectional view taken along line D1-D2 in FIG. 13B2.

A plurality of gate wirings, source wirings, and capacitor wirings are provided depending on the pixel density. In the terminal portion, a plurality of first terminals at the same potential as the gate wiring, a plurality of second terminals at the same potential as the source wiring, a plurality of third terminals at the same potential as the capacitor wiring, and the like are arranged. The number of each of the terminals may be any number, and the number of terminals may be determined by a practitioner as appropriate.

Note that the structure described in this embodiment can be combined with any of the structures described in the other embodiments as appropriate.

Embodiment 6

In this embodiment, an example will be described below in which at least some of driver circuits and a thin film transistor placed in a pixel portion are formed over one substrate.

The thin film transistor placed in the pixel portion is formed as described in Embodiments 1 and 2. Since the thin film transistor described in Embodiments 1 and 2 is an n-channel TFT, some of driver circuits that include n-channel TFTs among the driver circuits are formed over the substrate where the thin film transistor in the pixel portion is formed.

Figure 18A:
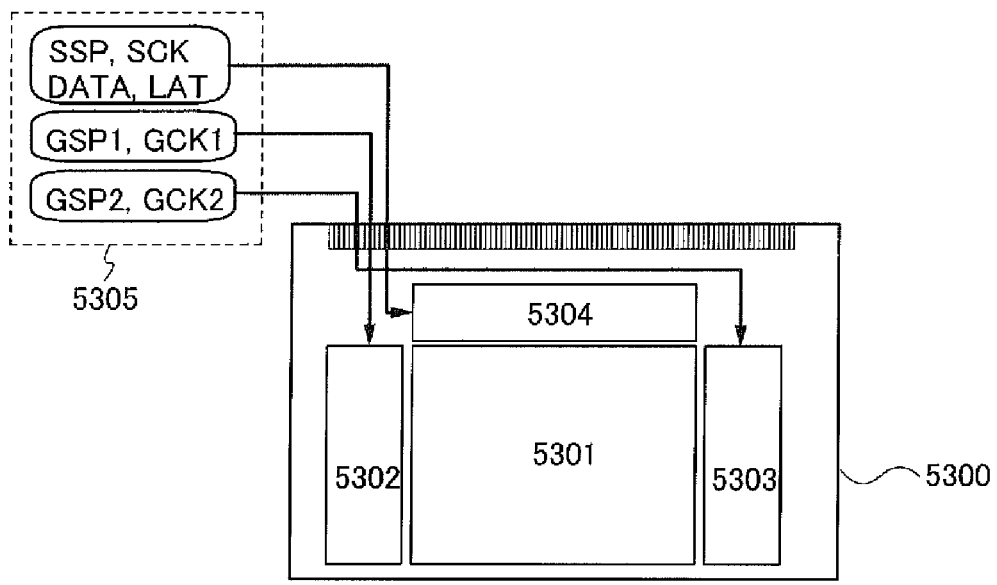
FIGS. 18A and 18B are block diagrams each illustrating a display device.

FIG. 18A illustrates an example of a block diagram of an active matrix display device. A pixel portion 5301, a first scan line driver circuit 5302, a second scan line driver circuit 5303, and a signal line driver circuit 5304 are provided over a substrate 5300 in the display device. In the pixel portion 5301, a plurality of signal lines extended from the signal line driver circuit 5304 are placed and a plurality of scan lines extended from the first scan line driver circuit 5302 and the second scan line driver circuit 5303 are placed. Note that pixels each having a display element are arranged in cross regions of the scan lines and the signal lines to form a matrix. The substrate 5300 of the display device is connected to a timing control circuit 5305 (also referred to as a controller or a control IC) via a connection portion such as a flexible printed circuit (FPC).

In FIG. 18A, the first scan line driver circuit 5302, the second scan line driver circuit 5303, and the signal line driver circuit 5304 are formed over the substrate 5300 where the pixel portion 5301 is formed. Consequently, the number of components of a driver circuit and the like that are provided outside is reduced, so that costs can be reduced. Further, if the driver circuit is provided outside the substrate 5300, wirings would need to be extended and the number of connections of wirings would be increased, but by providing the driver circuit over the substrate 5300, the number of connections of the wirings can be reduced. Accordingly, improvement in reliability and yield can be achieved.

Note that the timing control circuit 5305 supplies, for example, a first scan line driver circuit start signal (GSP1) and a scan line driver circuit clock signal (GCK1) to the first scan line driver circuit 5302. Furthermore, the timing control circuit 5305 supplies, for example, a second scan line driver circuit start signal (GSP2) (which is also referred to as a start pulse) and a scan line driver circuit clock signal (GCK2) to the second scan line driver circuit 5303. Moreover, the timing control circuit 5305 supplies a signal line driver circuit start signal (SSP), a signal line driver circuit clock signal (SCK), video signal data (DATA, also simply referred to as a video signal), and a latch signal (LAT) to the signal line driver circuit 5304. Each clock signal may be a plurality of clock signals with different phases or may be supplied together with an inverted clock signal (CKB). Note that one of the first scan line driver circuit 5302 and the second scan line driver circuit 5303 can be omitted.

Figure 18B:
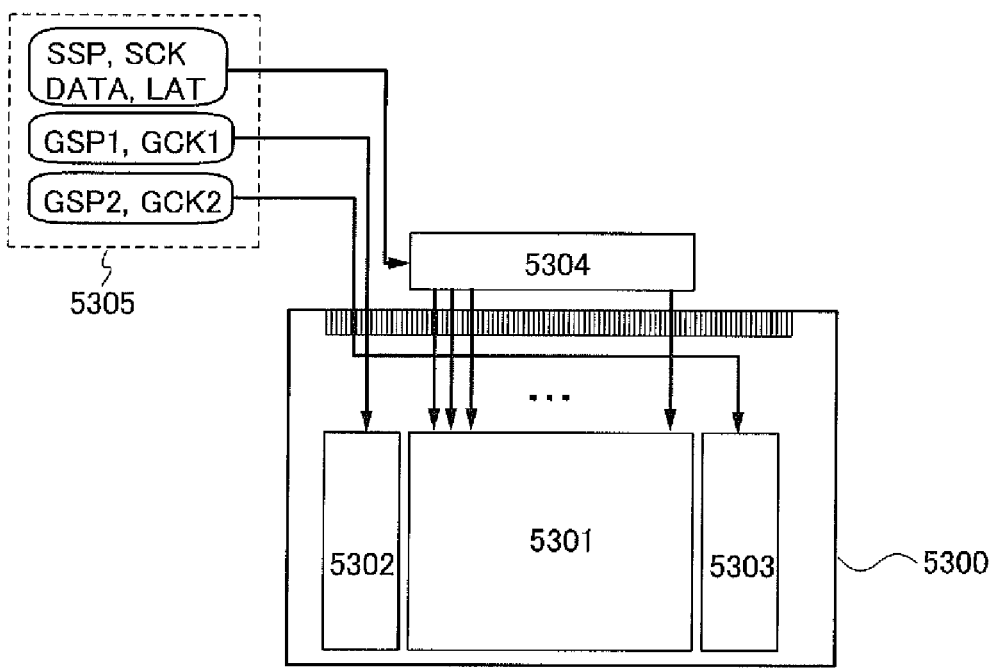

FIG. 18B illustrates a structure in which circuits with lower driving frequency (e.g., the first scan line driver circuit 5302 and the second scan line driver circuit 5303) are formed over the substrate 5300 where the pixel portion 5301 is formed, and the signal line driver circuit 5304 is formed over a substrate which is different from the substrate 5300 where the pixel portion 5301 is formed. With this structure, the driver circuits formed over the substrate 5300 can be formed using thin film transistors whose field effect mobility is lower than that of transistors including a single crystal semiconductor. Thus, an increase in size of the display device, a reduction in the number of steps, a reduction in cost, an improvement in yield, or the like can be achieved.

Figure 19A:
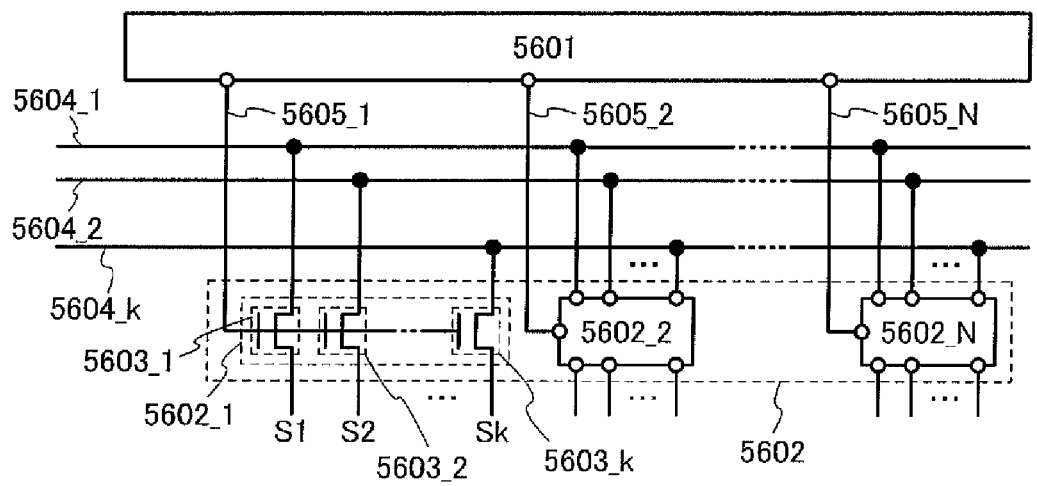
FIG. 19A illustrates a configuration of a signal line driver circuit and FIG. 19B is a timing diagram of operation thereof.
Figure 19B:
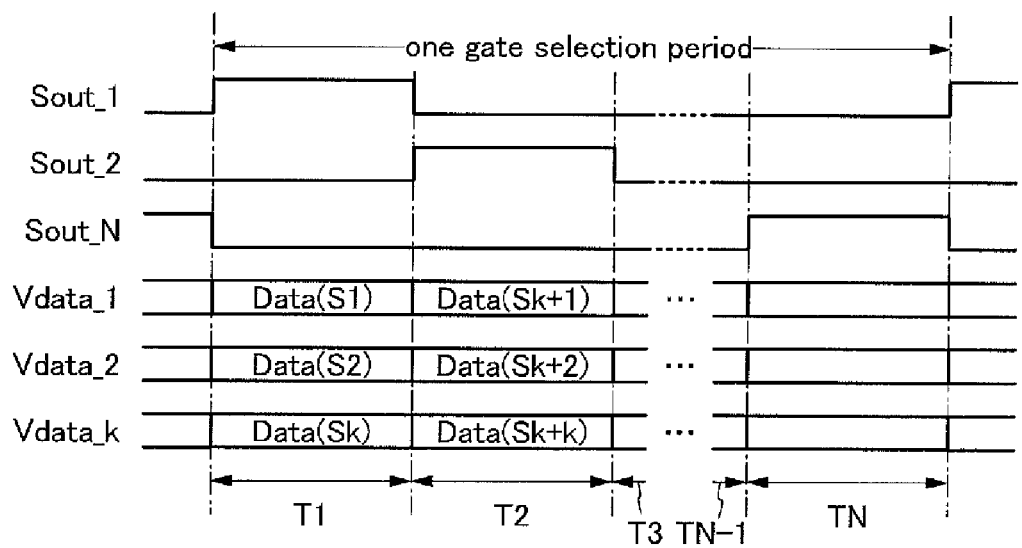

The thin film transistors in Embodiments 1 and 2 are n-channel TFTs. FIGS. 19A and 19B illustrate an example of a structure and operation of a signal line driver circuit formed using n-channel TFTs.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of thin film transistors 5603_1 to 5603_*k* (k is a natural number). The example where the thin film transistors 5603_1 to 5603_*k* are n-channel TFTs will be described below.

A connection relation in the signal line driver circuit is described by using the switching circuit 5602_1 as an example. First terminals of the thin film transistors 5603_1 to 5603_*k* are connected to wirings 5604_1 to 5604_*k*, respectively. Second terminals of the thin film transistors 5603_1 to 5603_*k* are connected to signal lines S1 to Sk, respectively. Gates of the thin film transistors 5603_1 to 5603_*k* are connected to a wiring 5605_1.

The shift register 5601 has a function of sequentially selecting the switching circuits 5602_1 to 5602_N by sequentially outputting H-level signals (also referred to as H signals or signals at a high power supply potential level) to wirings 5605_1 to 5605_N.

The switching circuit 5602_1 has a function of controlling electrical continuity between the wirings 5604_1 to 5604_*k* and the signal lines S1 to Sk (electrical continuity between the first terminals and the second terminals), that is, a function of controlling whether potentials of the wirings 5604_1 to 5604_*k* are supplied to the signal lines S1 to Sk. In this manner, the switching circuit 5602_1 serves as a selector. Moreover, the thin film transistors 5603_1 to 5603_*k* have functions of controlling electrical continuity between the wirings 5604_1 to 5604_*k* and the signal lines S1 to Sk, respectively, that is, functions of supplying potentials of the wirings 5604_1 to 5604_*k* to the signal lines S1 to Sk, respectively. In this manner, each of the thin film transistors 5603_1 to 5603_*k* serves as a switch.

The video signal data (DATA) is input to each of the wirings 5604_1 to 5604_*k*. The video signal data (DATA) is an analog signal that corresponds to an image signal or image data in many cases.

Next, the operation of the signal line driver circuit in FIG. 19A is described with reference to a timing diagram in FIG. 19B. FIG. 19B illustrates examples of signals Sout_1 to Sout_N and signals Vdata_1 to Vdata_*k*. The signals Sout_1 to Sout_N are examples of output signals from the shift register 5601. The signals Vdata_1 to Vdata_k are examples of signals input to the wirings 5604_1 to 5604_*k*. Note that one operation period of the signal line driver circuit corresponds to one gate selection period in a display device. One gate selection period is, for example, divided into periods T1 to TN. Each of the periods T1 to TN is a period for writing the video signal data (DATA) into pixels in a selected row.

Note that signal waveform distortion and the like in each structure illustrated in drawings and the like in this embodiment are exaggerated for simplicity in some cases. Therefore, this embodiment is not necessarily limited to the scale illustrated in the drawings and the like.

In the periods T1 to TN, the shift register 5601 sequentially outputs H-level signals to the wirings 5605_1 to 5605_N. For example, in the period T1, the shift register 5601 outputs an H-level signal to the wiring 5605_1. Then, the thin film transistors 5603_1 to 5603_*k* are turned on, so that the wirings 5604_1 to 5604_*k* and the signal lines S1 to Sk are brought into conduction. At this time, Data(S1) to Data(Sk) are input to the wirings 5604_1 to 5604_*k*, respectively. The Data(S1) to Data(Sk) are written into pixels in a first to kth columns in the selected row through the thin film transistors 5603_1 to 5603_*k*, respectively. In such a manner, in the periods T1 to TN, the video signal data (DATA) are sequentially written into the pixels in the selected row by k columns.

The video signal data (DATA) are written into pixels by a plurality of columns as described above, whereby the number of video signal data (DATA) or the number of wirings can be reduced. Consequently, the number of connections with an external circuit can be reduced. Moreover, by writing video signals into pixels by a plurality of columns, writing time can be extended and insufficient writing of video signals can be prevented.

Note that any of the circuits formed using the thin film transistors in Embodiment 3 can be used for the shift register 5601 and the switching circuit 5602. In that case, all the transistors included in the shift register 5601 can be n-channel transistors or all the transistors included in the shift register 5601 can be p-channel transistors.

One embodiment of a shift register which is used for part of the scan line driver circuit and/or the signal line driver circuit will be described with reference to FIGS. 20A to 20C and FIGS. 21A and 21B.

The scan line driver circuit includes a shift register. Additionally, the scan line driver circuit may include a level shifter, a buffer, or the like in some cases. In the scan line driver circuit, a clock signal (CK) and a start pulse signal (SP) are input to the shift register, so that a selection signal is generated. The selection signal generated is buffered and amplified by the buffer, and the resulting signal is supplied to a corresponding scan line. Gate electrodes of transistors in pixels of one line are connected to the scan line. Since the transistors in the pixels of one line have to be turned on at the same time, a buffer that can supply a large current is used.

Figure 20A:
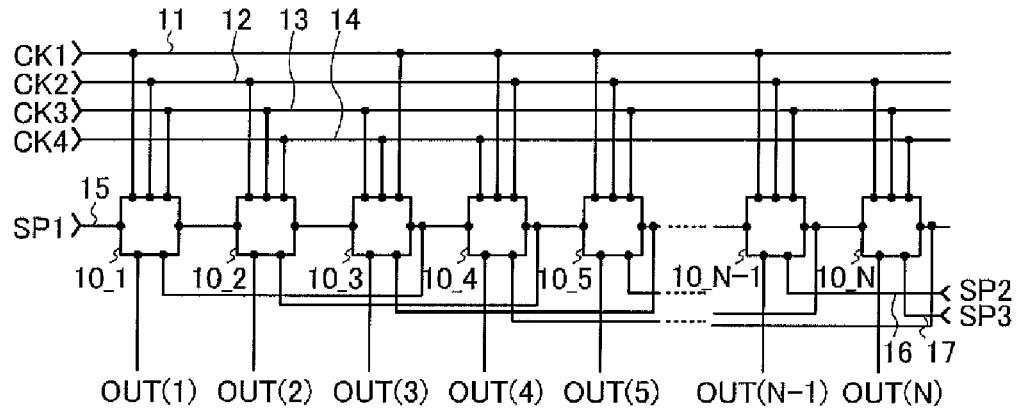
FIGS. 20A to 20C are circuit diagrams illustrating a configuration of a shift register.

The shift register includes a first to Nth pulse output circuits 10_1 to 10_N (N is a natural number equal to or greater than 3) (see FIG. 20A). In the shift register illustrated in FIG. 20A, a first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to Nth pulse output circuits 10_1 to 10_N. A start pulse SP1 (a first start pulse) is input from a fifth wiring 15 to the first pulse output circuit 10_1. To the nth pulse output circuit 10_n of the second or subsequent stage (n is a natural number greater than or equal to 2 and less than or equal to N), a signal from the pulse output circuit of the preceding stage (such a signal is referred to as a preceding-stage signal OUT(n−1) where n is a natural number greater than or equal to 2 and less than or equal to IV) is input. To the first pulse output circuit 10_1, a signal from the third pulse output circuit 10_3 of the stage following the next stage is input. Similarly, to the nth pulse output circuit 10_n of the second or subsequent stage, a signal from the (n+2)th pulse output circuit 10_(n+2) of the stage following the next stage (such a signal is referred to as a subsequent-stage signal OUT(n+2)) is input. Therefore, the pulse output circuits of the respective stages output first output signals (OUT(1)(SR) to OUT(N)(SR)) to be input to the pulse output circuit of the subsequent stage and/or the pulse output circuit of the stage before the preceding stage, and second output signals (OUT(1) to OUT(N)) to be input to another wiring or the like. Note that since the subsequent-stage signal OUT(n+2) is not input to the last two stages of the shift register as illustrated in FIG. 20A, a second start pulse SP2 and a third start pulse SP3 may be input from a sixth wiring 16 and a seventh wiring 17, respectively, to the pulse output circuits of the last two stages, for example. Alternatively, a signal which is additionally generated in the shift register may be used. For example, a structure may be employed in which a (N+1)th pulse output circuit 10_(N+1) and a (N+2)th pulse output circuit 10_(N+2) which do not contribute to pulse output to the pixel portion (such circuits are also referred to as dummy stages) may be provided so that signals corresponding to the second start pulse (SP2) and the third start pulse (SP3) are generated in the dummy stages.

Note that a clock signal (CK) is a signal that alternates between an H level and an L level (also referred to as an L signal or a signal at low power supply potential level) at regular intervals. Here, the first clock signal (CK1) to the fourth clock signal (CK4) are delayed by ¼ cycle sequentially. In this embodiment, driving of the pulse output circuit or the like is controlled with the first to fourth clock signals (CK1) to (CK4). Note that the clock signal may be referred to as GCK or SCK in some cases depending on a driver circuit to which the clock signal is input, but the clock signal is referred to as CK in the following description.

A first input terminal 21, a second input terminal 22, and a third input terminal 23 are electrically connected to any of the first to fourth wirings 11 to 14. For example, in the first pulse output circuit 10_1 in FIG. 20A, the first input terminal 21 is electrically connected to the first wiring 11, the second input terminal 22 is electrically connected to the second wiring 12, and the third input terminal 23 is electrically connected to the third wiring 13. In the second pulse output circuit 102, the first input terminal 21 is electrically connected to the second wiring 12, the second input terminal 22 is electrically connected to the third wiring 13, and the third input terminal 23 is electrically connected to the fourth wiring 14.

Figure 20B:
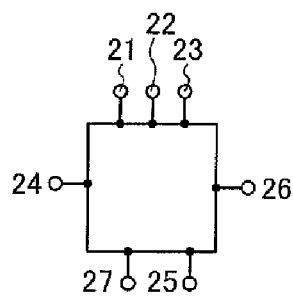

Each of the first to Nth pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 20B). In the first pulse output circuit 10_1, the first clock signal CK1 is input to the first input terminal 21; the second clock signal CK2 is input to the second input terminal 22; the third clock signal CK3 is input to the third input terminal 23; the start pulse is input to the fourth input terminal 24; a subsequent-stage signal OUT(3) is input to the fifth input terminal 25; the first output signal OUT(1)(SR) is output from the first output terminal 26; and the second output signal OUT(1) is output from the second output terminal 27.

Next, an example of a specific circuit configuration of the pulse output circuit will be described with reference to FIG. 20C.

Figure 20C:
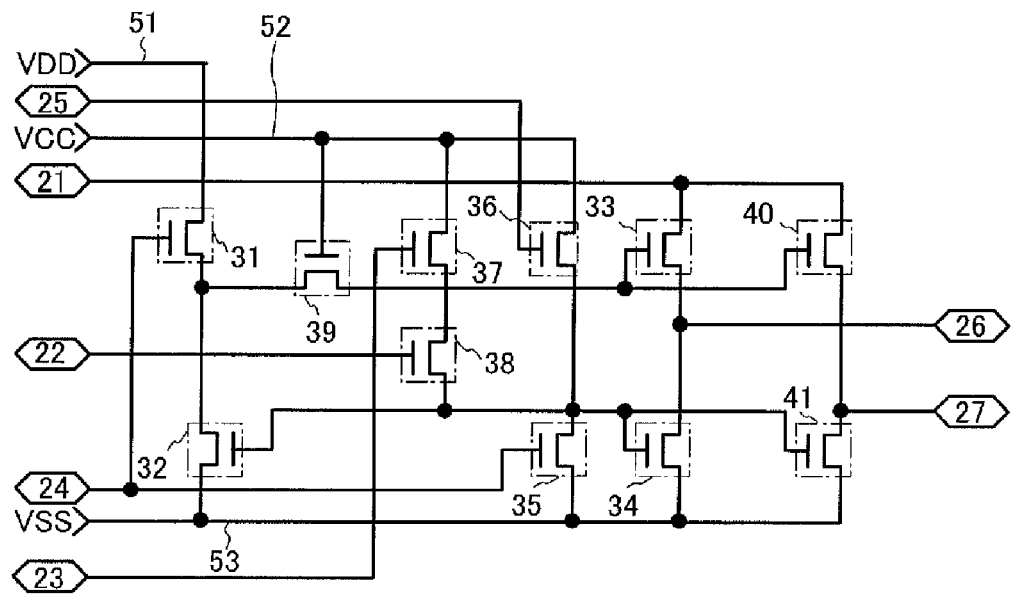

The first pulse output circuit 10_1 includes first to eleventh transistors 31 to 41 (see FIG. 20C). A signal or a power supply potential is supplied to the first to eleventh transistors 41 to 43 from a power supply line 51 to which a first high power supply potential VDD is supplied, a power supply line 52 to which a second high power supply potential VCC is supplied, and a power supply line 53 to which a low power supply potential VSS is supplied, in addition to the first to fifth input terminals 21 to 25, the first output terminal 26, and the second output terminal 27, which are described above. The relation of the power supply potentials of the power supply lines in FIG. 20C is as follows: the first power supply potential VDD is higher than or equal to the second power supply potential VCC, and the second power supply potential VCC is higher than the third power supply potential VSS. Note that the first to fourth clock signals (CK1) to (CK4) each alternate between an H level and an L level at regular intervals; the clock signal at the H level is VDD and the clock signal at the L level is VSS. By making the potential VDD of the power supply line 51 higher than the second power supply potential VCC of the power supply line 52, a potential applied to a gate electrode of a transistor can be lowered without affecting the operation; thus, a shift in the threshold value of the transistor can be reduced and deterioration can be suppressed.

In FIG. 20C, a first terminal of the first transistor 31 is electrically connected to the power supply line 51, a second terminal of the first transistor 31 is electrically connected to a first terminal of the ninth transistor 39, and a gate electrode of the first transistor 31 is electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and a gate electrode of the sixth transistor 36 is electrically connected to the fifth input terminal 25. A first terminal of the seventh transistor 37 is electrically connected to the power supply line 52, a second terminal of the seventh transistor 37 is electrically connected to a second terminal of the eighth transistor 38, and a gate electrode of the seventh transistor 37 is electrically connected to the third input terminal 23. A first terminal of the eighth transistor 38 is electrically connected to the gate electrode of the second transistor 32 and the gate electrode of the fourth transistor 34, and a gate electrode of the eighth transistor 38 is electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and a gate electrode of the ninth transistor 39 is electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34.

In FIG. 20C, a connection point where the gate electrode of the third transistor 33, the gate electrode of the tenth transistor 40, and the second terminal of the ninth transistor 39 are connected is referred to as a node A. A connection point where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B (see FIG. 21A).

Figure 21A:
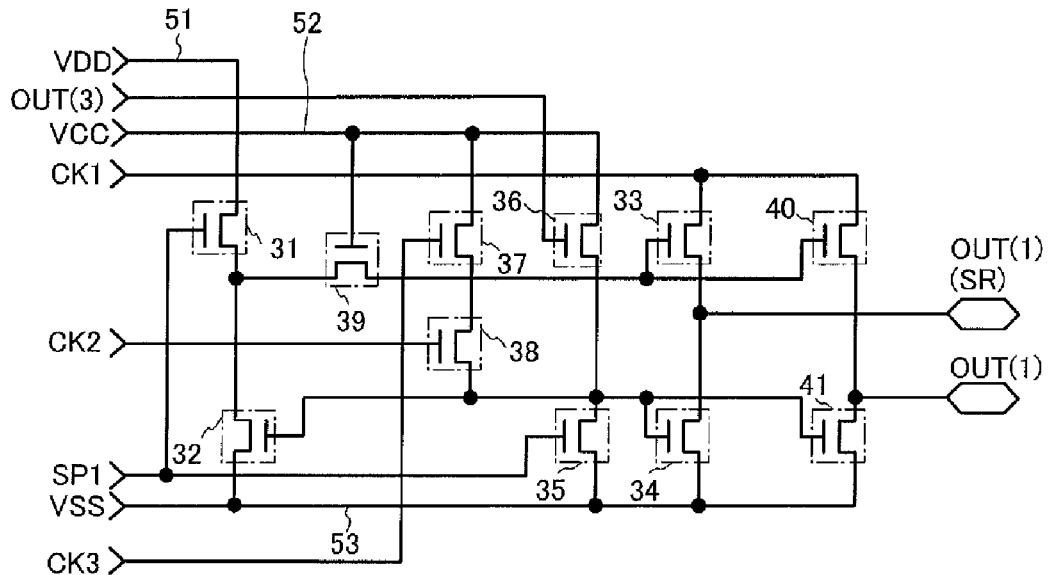
FIG. 21A is a circuit diagram illustrating a shift register and FIG. 21B is a timing diagram of operation thereof

In FIG. 21A, the signals that are input or output to/from the first to fifth input terminals 21 to 25 and the first and second output terminals 26 and 27 in the case where the pulse output circuit illustrated in FIG. 20C is applied to the first pulse output circuit 10_1 are shown.

Specifically, the first clock signal CK1 is input to the first input terminal 21; the second clock signal CK2 is input to the second input terminal 22; the third clock signal CK3 is input to the third input terminal 23; the start pulse is input to the fourth input terminal 24; the subsequent-stage signal OUT(3) is input to the fifth input terminal 25; the first output signal OUT(1)(SR) is output from the first output terminal 26; and the second output signal OUT(1) is output from the second output terminal 27.

Note that a thin film transistor is an element having at least three terminals of a gate, a drain, and a source. The thin film transistor has a semiconductor including a channel region formed in a region overlapping with the gate. Current that flows between the drain and the source through the channel region can be controlled by controlling a potential of the gate. Here, since the source and the drain of the thin film transistor may interchange depending on the structure, the operating condition, and the like of the thin film transistor, it is difficult to define which is a source or a drain. Therefore, a region functioning as the source or the drain is not called the source or the drain in some cases. In that case, for example, such regions may be referred to as a first terminal and a second terminal.

Figure 21B:
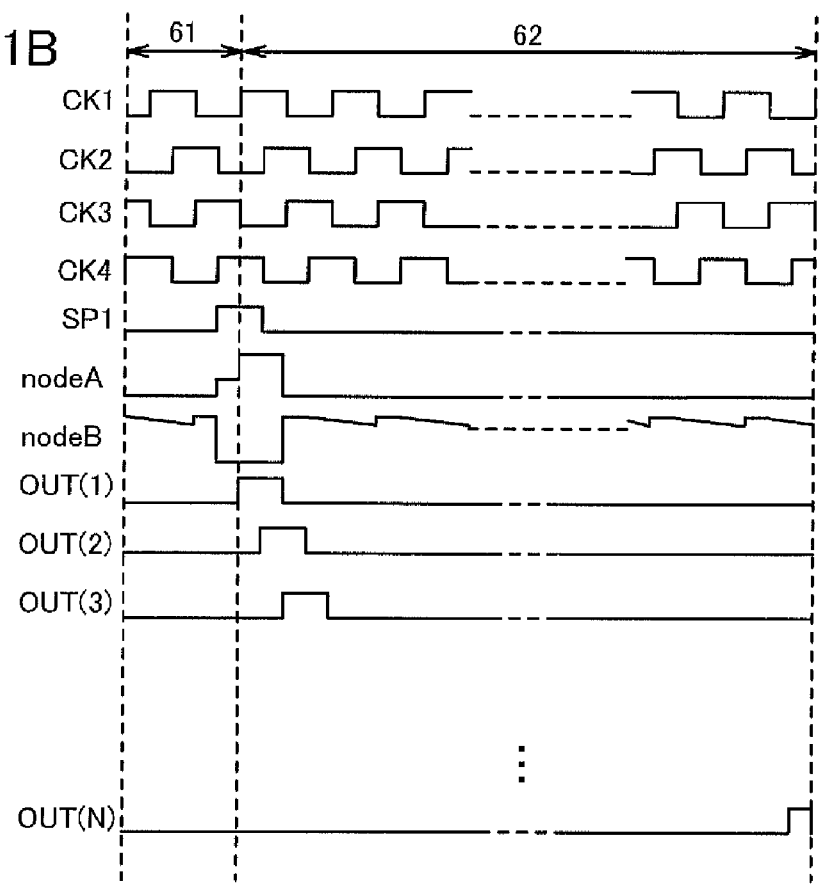

FIG. 21B is a timing diagram of a shift register including a plurality of pulse output circuits illustrated in FIG. 21A. Note that when the shift register is included in a scan line driver circuit, a period 61 in FIG. 21B corresponds to a vertical retrace period and a period 62 corresponds to a gate selection period.

Note that by providing the ninth transistor 39 in which the second power supply potential VCC is applied to the gate as illustrated in FIG. 21A, the following advantages before and after bootstrap operation are provided.

Without the ninth transistor 39 in which the second power supply potential VCC is applied to the gate electrode, if a potential of the node A is raised by bootstrap operation, a potential of the source which is the second terminal of the first transistor 31 rises to a value higher than the first power supply potential VDD. Then, the first terminal of the first transistor 31, that is, the terminal on the power supply line 51 side, comes to serve as a source of the first transistor 31. Consequently, in the first transistor 31, a high bias voltage is applied and thus significant stress is applied between the gate and the source and between the gate and the drain, which might cause deterioration of the transistor. By providing the ninth transistor 39 in which the second power supply potential VCC is applied to the gate electrode, an increase in potential of the second terminal of the first transistor 31 can be prevented while the potential of the node A is raised by bootstrap operation. In other words, by providing the ninth transistor 39, the level of a negative bias voltage applied between the gate and the source of the first transistor 31 can be lowered. Thus, the circuit configuration in this embodiment can reduce a negative bias voltage applied between the gate and the source of the first transistor 31, so that deterioration of the first transistor 31 due to stress can be suppressed.

Note that the ninth transistor 39 is provided so as to be connected between the second terminal of the first transistor 31 and the gate of the third transistor 33 through the first terminal and the second terminal thereof. Note that when the shift register including a plurality of pulse output circuits in this embodiment is included in a signal line driver circuit having a larger number of stages than a scan line driver circuit, the ninth transistor 39 can be omitted, which is advantageous in that the number of transistors can be reduced.

Note that the shift register will achieve similar effect even when the connection relation is changed so that a clock signal that is supplied to the gate electrode of the seventh transistor 37 from the third input terminal 23 and a clock signal that is supplied to the gate electrode of the eighth transistor 38 from the second input terminal 22 may be supplied from the second input terminal 22 and the third input terminal 23, respectively. In that case, in the shift register illustrated in FIG. 21A, a state of the seventh transistor 37 and the eighth transistor 38 is changed so that both the seventh transistor 37 and the eighth transistor 38 are on, then the seventh transistor 37 is off and the eighth transistor 38 is on, and then the seventh transistor 37 and the eighth transistor 38 are off; thus, the fall in potential of the node B, which is caused by fall in potentials of the second input terminal 22 and the third input terminal 23, is caused twice by fall in potential of the gate electrode of the seventh transistor 37 and fall in potential of the gate electrode of the eighth transistor 38. On the other hand, in the case where a state of the seventh transistor 37 and the eighth transistor 38 in the shift register illustrated in FIG. 21A is changed so that both the seventh transistor 37 and the eighth transistor 38 are on, then the seventh transistor 37 is on and the eighth transistor 38 is off, and then the seventh transistor 37 and the eighth transistor 38 are off; the fall in potential of the node B, which is caused by fall in potentials of the second input terminal 22 and the third input terminal 23, is caused only once by fall in potential of the gate electrode of the eighth transistor 38. Consequently, the connection relation, in which the clock signal CK3 is supplied from the third input terminal 23 to the gate electrode of the seventh transistor 37 and the clock signal CK2 is supplied from the second input terminal 22 to the gate electrode of the eighth transistor 38, is preferable. This is because the number of times of the change in the potential of the node B can be reduced, whereby the noise can be reduced.

In such a manner, an H-level signal is regularly supplied to the node B in a period during which the potentials of the first output terminal 26 and the second output terminal 27 are held at the L level; thus, a malfunction of the pulse output circuit can be suppressed.

This embodiment can be implemented in appropriate combination with any structure described in the other embodiments.

Embodiment 7

By manufacturing thin film transistors and using the thin film transistors for a pixel portion and driver circuit, a semiconductor device having a display function (also referred to as a display device) can be manufactured. Moreover, some or all of the driver circuits which include the thin film transistors, can be formed over a substrate where the pixel portion is formed, whereby a system-on-panel can be obtained.

The display device includes a display element. Examples of the display element include a liquid crystal element (also referred to as a liquid crystal display element) and a light-emitting element (also referred to as a light-emitting display element). The light-emitting element includes an element whose luminance is controlled by current or voltage in its category, and specifically includes an inorganic electroluminescent (EL) element, an organic EL element, and the like in its category. Furthermore, the display device may include a display medium whose contrast is changed by an electric effect, such as electronic ink.

In addition, the display device includes a panel in which the display element is sealed, and a module in which an IC and the like including a controller are mounted on the panel. Furthermore, an element substrate, which is one embodiment before the display element is completed in a manufacturing process of the display device, is provided with a means for supplying current to the display element in each of a plurality of pixels. Specifically, the element substrate may be in a state in which only a pixel electrode (also referred to as a pixel electrode layer) of the display element is formed, a state in which a conductive film to be a pixel electrode is formed but is not etched yet to form the pixel electrode, or any other state.

Note that a display device in this specification refers to an image display device or a light source (including a lighting device). Further, the display device also includes any of the following modules in its category: a module to which a connector such as a flexible printed circuit (FPC), a tape automated bonding (TAB) tape, or a tape carrier package (TCP) is attached; a module having a TAB tape or a TCP at the end of which a printed wiring board is provided; and a module having an integrated circuit (IC) that is directly mounted on a display element by a chip on glass (COG) method.

The appearance and a cross section of a liquid crystal display panel, which is one embodiment of a semiconductor device, will be described with reference to FIGS. 14A1, 14A2, and 14B. FIGS. 14A1 and 14A2 are plan views of panels in which thin film transistors 4010 and 4011 and a liquid crystal element 4013 are sealed between a first substrate 4001 and a second substrate 4006 with a sealant 4005. FIG. 14B is a cross-sectional view taken along line M-N in FIGS. 14A1 and 14A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that there is no particular limitation on the connection method of the driver circuit which is separately formed, and a COG method, a wire bonding method, a TAB method, or the like can be used. FIG. 14A1 illustrates an example in which the signal line driver circuit 4003 is mounted by a COG method. FIG. 14A2 illustrates an example in which the signal line driver circuit 4003 is mounted by a TAB method.

The pixel portion 4002 and the scan line driver circuit 4004 provided over the first substrate 4001 include a plurality of thin film transistors. FIG. 14B illustrates the thin film transistor 4010 included in the pixel portion 4002 and the thin film transistor 4011 included in the scan line driver circuit 4004, as an example. Insulating layers 4020, 4042, and 4021 are provided over the thin film transistors 4010 and 4011. In addition, an insulating layer 4043 is provided over the first substrate 4001 and an insulating layer 4044 is provided over gate electrodes of the thin film transistors. A source wiring 4046 is provided over the insulating layer 4020 and is connected to a source electrode or a drain electrode of the thin film transistor 4010 through a contact hole formed in the insulating layer 4020.

Any of the thin film transistors which are described in Embodiments 1 to 3 can be used as the thin film transistors 4010 and 4011. In this embodiment, the thin film transistors 4010 and 4011 are n-channel thin film transistors.

A conductive layer 4040 is provided over part of the insulating layer 4021, which overlaps with a channel formation region in a semiconductor layer in the thin film transistor 4011 for the driver circuit. The conductive layer 4040 is provided at the position overlapping with the channel formation region of the semiconductor layer, whereby the threshold voltage of the thin film transistor 4011 can be controlled. In addition, the amount of change in threshold voltage of the thin film transistor 4011 before and after the BT test can be reduced. A potential of the conductive layer 4040 may be the same or different from that of a gate electrode of the thin film transistor 4011. The conductive layer 4040 can also serve as a second gate electrode. Alternatively, the potential of the conductive layer 4040 may be GND or 0 V, or the conductive layer 4040 may be in a floating state.

A pixel electrode layer 4030 included in the liquid crystal element 4013 is electrically connected to the thin film transistor 4010. A counter electrode layer 4031 of the liquid crystal element 4013 is provided on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 serving as alignment films, respectively, and the liquid crystal layer 4008 is sandwiched between the pixel electrode layer 4030 and the counter electrode layer 4031 with the insulating layers 4032 and 4033 interposed therebetween.

Note that a light-transmitting substrate can be used as the first substrate 4001 and the second substrate 4006; glass, ceramics, or plastics can be used. The plastic can be a fiberglass-reinforced plastics (FRP) plate, a polyvinyl fluoride (PVF) film, a polyester film, or an acrylic resin film.

A spacer 4035 is a columnar spacer which is obtained by selective etching of an insulating film and provided in order to control the distance (a cell gap) between the pixel electrode layer 4030 and the counter electrode layer 4031. Alternatively, a spherical spacer may be used as the spacer 4035. The counter electrode layer 4031 is electrically connected to a common potential line formed over the substrate where the thin film transistor 4010 is formed. The counter electrode layer 4031 and the common potential line can be electrically connected to each other via conductive particles arranged between a pair of substrates using the common connection portion. Note that the conductive particles may be included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase is generated within an only narrow range of temperature, a liquid crystal composition containing a chiral agent at 5 wt % or more is used for the liquid crystal layer 4008 in order to improve the temperature range. The liquid crystal composition including liquid crystal exhibiting a blue phase and a chiral agent has a short response time of 1 msec or less and is optically isotropic; therefore, alignment treatment is not necessary and viewing angle dependence is small.

Note that this embodiment can also be applied to a transflective liquid crystal display device in addition to a transmissive liquid crystal display device.

Although, a polarizing plate is provided on the outer surface of the substrate (on the viewer side) and a coloring layer and an electrode layer used for a display element are sequentially provided on the inner surface of the substrate in the example of the liquid crystal display device, the polarizing plate may be provided on the inner surface of the substrate. The stacked-layer structure of the polarizing plate and the coloring layer is not limited to the structure in this embodiment and may be set as appropriate depending on materials of the polarizing plate and the coloring layer or conditions of the manufacturing process.

In order to reduce the surface roughness due to the thin film transistors, the insulating layer 4021 may be used as a planarization insulating film. For the insulating layer 4021, a heat-resistant organic material such as polyimide, an acrylic resin, benzocyclobutene-based resin, polyamide, or epoxy resin can be used. As an alternative to such organic materials, it is possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed of these materials.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. The organic group may include a fluoro group.

There is no particular limitation on the method of forming the insulating layer 4021. Depending on the material, the insulating layer 4021 can be formed by a method such as sputtering method, an SOG method, a spin coating method, a dipping method, a spray coating method, or a droplet discharge method (e.g., an ink jetting method, screen printing, or offset printing), or by using a tool (apparatus) such as a doctor knife, a roll coater, a curtain coater, a knife coater, or the like. When the baking step of the insulating layer 4021 and the annealing of the semiconductor layer are combined, a semiconductor device can be manufactured efficiently.

The pixel electrode layer 4030 and the counter electrode layer 4031 can be formed from a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added.

Conductive compositions including a conductive high molecule (also referred to as a conductive polymer) can be used for the pixel electrode layer 4030 and the counter electrode layer 4031. The pixel electrode formed using the conductive composition preferably has a sheet resistance of 10000 Ω/square or less and a light transmittance of 70% or more at a wavelength of 550 nm. Further, the resistivity of the conductive high molecule included in the conductive composition is preferably 0.1 Ω·cm or less.

As the conductive high molecule, a so-called π-electron conjugated conductive polymer can be used. Examples include polyaniline and a derivative thereof, polypyrrole and a derivative thereof, polythiophene and a derivative thereof, and a copolymer of two or more of these materials.

Further, a variety of signals and potentials are supplied to the signal line driver circuit 4003 which is separately formed, the scan line driver circuit 4004, or the pixel portion 4002 from an FPC 4018.

A connection terminal electrode 4015 is formed using the same conductive film as the pixel electrode layer 4030 included in the liquid crystal element 4013. A terminal electrode 4016 is formed using the same conductive film as a source and drain electrodes of the thin film transistors 4010 and 4011.

The connection terminal electrode 4015 is electrically connected to a terminal included in the FPC 4018 via an anisotropic conductive film 4019.

Note that FIGS. 14A1, 14A2, and 14B illustrate the example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 23:
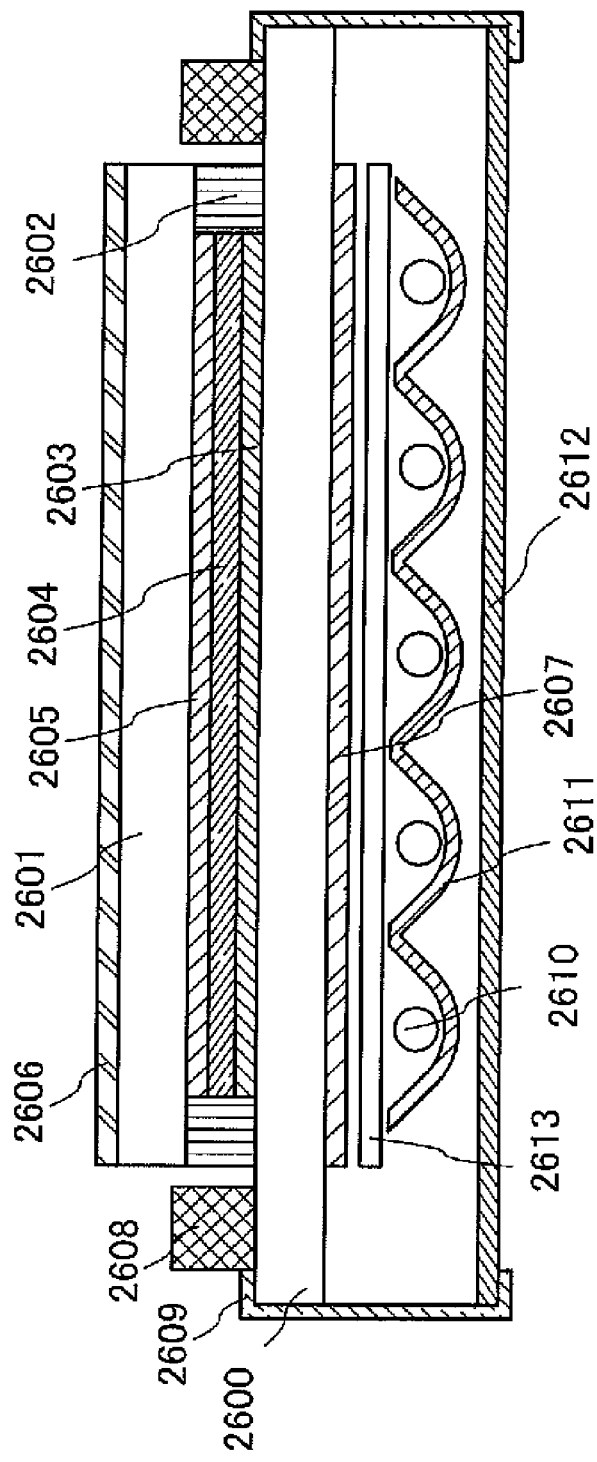
FIG. 23 illustrates a semiconductor device.

FIG. 23 illustrates an example of a liquid crystal display module which is formed as a semiconductor device using a TFT substrate 2600 manufactured according to the manufacturing method disclosed in this specification.

FIG. 23 illustrates an example of the liquid crystal display module, in which the TFT substrate 2600 and a counter substrate 2601 are fixed to each other with a sealant 2602, and a pixel portion 2603 including a TFT and the like, a display element 2604 including a liquid crystal layer, and a coloring layer 2605 are provided between the substrates to form a display region. The coloring layer 2605 is necessary to perform color display. In the RGB system, coloring layers corresponding to colors of red, green, and blue are provided for pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 by a flexible wiring board 2609 and includes an external circuit such as a control circuit or a power source circuit. The polarizing plate and the liquid crystal layer may be stacked with a retardation plate interposed therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be employed.

Through the above steps, a highly reliable liquid crystal display panel as a semiconductor device can be manufactured.

By manufacturing the above liquid crystal display device using the display device disclosed in this specification, a gate wiring or a source wiring can be formed using a conductive material including Cu; thus, an increase in wiring resistance can be prevented. Accordingly, an increase in operation speed and a reduction in power consumption of the liquid crystal display device can be achieved, whereby a liquid crystal display device which can have a large screen or a high definition screen can be provided.

This embodiment can be implemented in appropriate combination with any structure described in the other embodiments.

Embodiment 8

In this embodiment, an electronic paper will be described as an example of a semiconductor device.

The thin film transistor described in any of Embodiments 1 to 4 can be used for electronic paper in which electronic ink is driven by an element electrically connected to a switching element. The electronic paper is also called an electrophoretic display device (an electrophoretic display) and has advantages in that it has the same level of readability as plain paper, it has less power consumption than other display devices, and it can be made thin and lightweight.

There are a variety of modes of electrophoretic displays. The electrophoretic display includes a plurality of microcapsules dispersed in a solvent or a solute; each microcapsule containing first particles which are positively charged and second particles which are negatively charged. When an electric field is applied to the microcapsules, the particles in the microcapsules move in opposite directions to each other and only the color of the particles gathered on one side is displayed. Note that the first particles or the second particles include a pigment, and do not move without an electric field. The first particles and the second particles have different colors (which may be colorless).

Thus, the electrophoretic display utilizes a so-called dielectrophoretic effect by which a substance with high dielectric constant moves to a region with a high electric field.

A solution in which the above microcapsules are dispersed in a solvent is referred to as electronic ink. Electronic ink can be printed on a surface of glass, plastic, fabric, paper, or the like. Furthermore, by use of a color filter or particles that have a pigment, color display can also be achieved.

In addition, if a plurality of the above microcapsules are arranged as appropriate over an active matrix substrate so as to be interposed between two electrodes, an active matrix display device can be completed, and images can be displayed by application of an electric field to the microcapsules. For example, an active matrix substrate formed using the thin film transistors disclosed in Embodiment 1 and Embodiment 2 can be used.

Note that the first particles and the second particles in the microcapsules may be formed from any one of a conductive material, an insulating material, a semiconductor material, a magnetic material, a liquid crystal material, a ferroelectric material, an electroluminescent material, an electrochromic material, and a magnetophoretic material, or formed from a composite material thereof.

Figure 22:
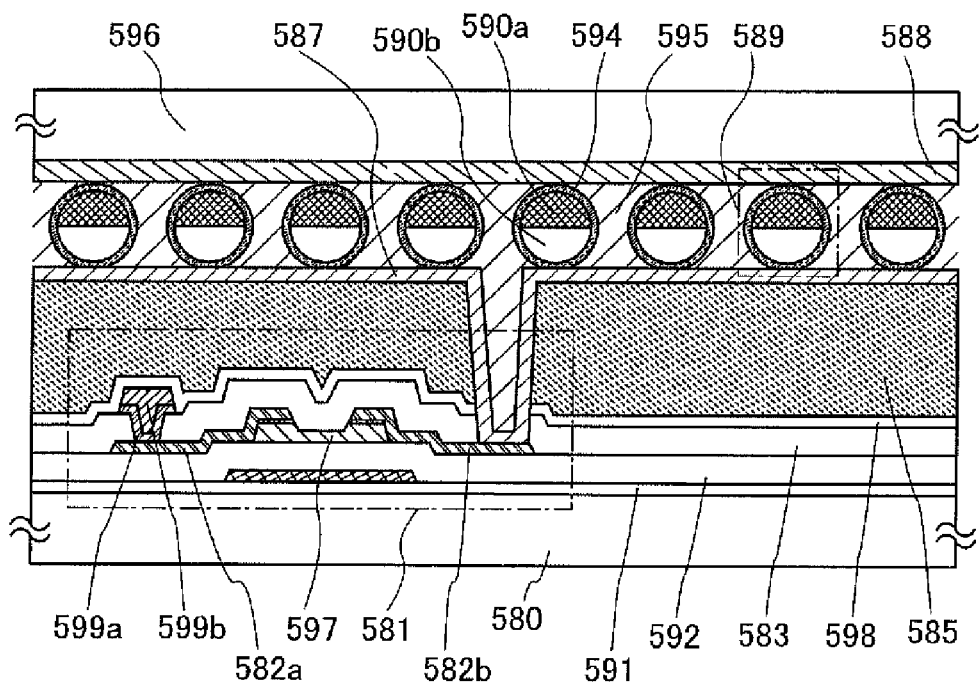
FIG. 22 illustrates a semiconductor device.

FIG. 22 illustrates an active matrix electronic paper as an example of a semiconductor device. A thin film transistor 581 used in the semiconductor device can be manufactured in a manner similar to that of the thin film transistor described in any of Embodiments 1 to 3.

The electronic paper of FIG. 22 is an example of a display device in which a twisting ball display system is employed. The twisting ball display system refers to a method in which spherical particles each colored in black and white are arranged between a first electrode layer and a second electrode layer which are electrode layers used in a display element, and a potential difference is generated between the first electrode layer and the second electrode layer to control orientation of the spherical particles, so that display is performed.

The thin film transistor 581 formed over a substrate 580 is a bottom-gate thin film transistor and is covered with an insulating layer 583 which is in contact with a semiconductor layer. An insulating layer 591 is formed over the substrate 580. An insulating layer 592 is formed over a gate electrode of the thin film transistor. A semiconductor layer 597 is formed over the insulating layer 592. A source electrode 582a and a drain electrode 582b of the thin film transistor 581 are formed over the semiconductor layer 597. The semiconductor layer 597, the source electrode 582a, and the drain electrode 582b are covered with the insulating layer 583. A source wiring 599a and a source wiring 599b are formed over the insulating layer 583 and are connected to the source electrode 582a of the thin film transistor 581 through a contact hole formed in the insulating layer 583. An insulating layer 598 is formed to cover the source wiring 599a, the source wiring 599b, and the thin film transistor 581.

The drain electrode 582b of the thin film transistor 581 is in contact with a first electrode layer 587 through an opening formed in an insulating layer 585, whereby the thin film transistor 581 is electrically connected to the first electrode layer 587. Between the first electrode layer 587 and a second electrode layer 588 formed on a substrate 596, spherical particles 589 each having a black region 590a, a white region 590b, and a cavity 594 filled with liquid around the regions are provided. Space around the spherical particles 589 is filled with a filler 595 such as a resin. The first electrode layer 587 corresponds to a pixel electrode, and the second electrode layer 588 corresponds to a common electrode. The second electrode layer 588 is electrically connected to a common potential line provided over the same substrate as the thin film transistor 581. With the use of a common connection portion, the second electrode layer 588 can be electrically connected to the common potential line through conductive particles provided between the pair of substrates.

Further, instead of the twisting ball, an electrophoretic element can be used. A microcapsule having a diameter of about 10 μm to 200 μm in which transparent liquid, positively charged white microparticles, and negatively charged black microparticles are encapsulated, is used. In the microcapsules which are provided between the first electrode layer and the second electrode layer, when an electric field is applied by the first electrode layer and the second electrode layer, the white microparticles and the black microparticles move to opposite sides from each other, so that white or black can be displayed.

A display element using this principle is an electrophoretic display element, and a device including the electrophoretic display element is called an electronic paper in general. The electrophoretic display element has higher reflectance than a liquid crystal display element, and thus, an auxiliary light is unnecessary, power consumption is low, and a display portion can be recognized in a dim environment. In addition, even when power is not supplied to the display portion, an image which has been displayed once can be maintained. Accordingly, a displayed image can be stored even when the semiconductor device having a display function (which may be referred to simply as a display device or a semiconductor device provided with a display device) is not connected to a radiowave source.

Through the above steps, a highly reliable electronic paper as a semiconductor device can be manufactured.

By manufacturing the above electronic paper using the display device described in Embodiments 1 to 3, a gate wiring or a source wiring can be formed using a conductive material including Cu; thus, an increase in wiring resistance can be prevented. Accordingly, an increase in operation speed and a reduction in power consumption of the electronic paper can be achieved, whereby an electronic paper which can have a large screen or a high definition screen can be provided.

This embodiment can be implemented in appropriate combination with any structure described in the other embodiments.

Embodiment 9

An example of a light-emitting display device will be described as a semiconductor device. As a display element of the display device, a light-emitting element utilizing electroluminescence is described here. Light-emitting elements utilizing electroluminescence are classified according to whether a light emitting material is an organic compound or an inorganic compound. In general, the former is referred to as an organic EL element and the latter is referred to as an inorganic EL element.

In an organic EL element, by application of voltage to a light-emitting element, electrons and holes are separately injected from a pair of electrodes into a layer containing a light-emitting organic compound, and current flows. Then, those carriers (i.e., electrons and holes) are recombined, and thus, the light-emitting organic compound is excited. When the light-emitting organic compound relaxes to the ground state from the excited state, light is emitted. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that a description is made here using an organic EL element as a light-emitting element.

Figure 16:
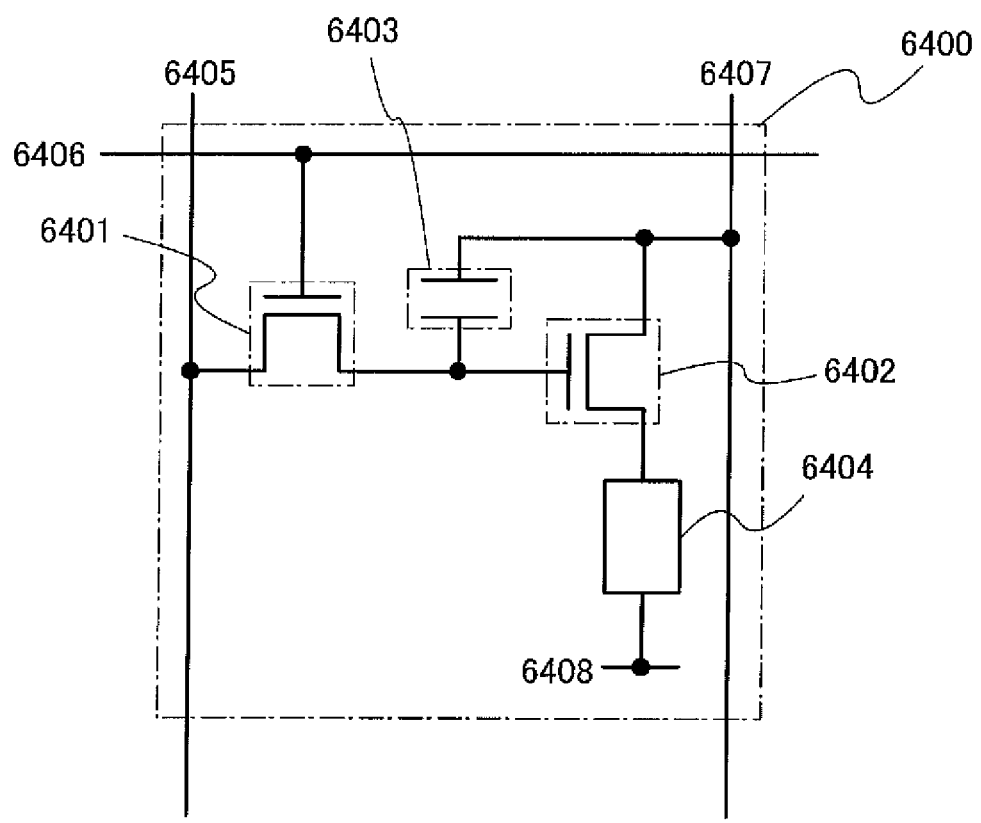
FIG. 16 illustrates a pixel equivalent circuit of a semiconductor device.

FIG. 16 illustrates an example of a pixel structure as an example of a semiconductor device which can be driven by a digital time grayscale method.

A structure and operation of a pixel which can be driven by a digital time grayscale driving can be applied will be described. In this example, one pixel includes two n-channel transistors.

A pixel 6400 includes a switching transistor 6401, a transistor 6402 for driving a light-emitting element, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the transistor 6402 for driving the light-emitting element. The gate of the transistor 6402 for driving the light-emitting element is connected to a power supply line 6407 via the capacitor 6403, a first electrode of the transistor 6402 for driving the light-emitting is connected to the power supply line 6407, and a second electrode of the transistor 6402 for driving the light-emitting element is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

Note that the second electrode (the common electrode 6408) of the light-emitting element 6404 is set to a low power supply potential. Note that the low power supply potential is a potential lower than a high power supply potential which is supplied to the power supply line 6407. For example, GND or 0 V may be set as the low power supply potential. A potential difference between the high power supply potential and the low power supply potential is applied to the light-emitting element 6404 so that current flows through the light-emitting element 6404, whereby the light-emitting element 6404 emits light. Thus, each potential is set so that the difference between the high power supply potential and the low power supply potential is greater than or equal to a forward threshold voltage of the light-emitting element 6404.

When the gate capacitance of the transistor 6402 for driving the light-emitting element is used as a substitute for the capacitor 6403, the capacitor 6403 can be omitted. The gate capacitance of the transistor 6402 for driving the light-emitting element may be formed between a channel region and a gate electrode.

Here, in the case of employing a voltage-input voltage driving method, a video signal is input to the gate of the transistor 6402 for driving the light-emitting element to make the transistor 6402 for driving the light-emitting element completely turn on or off. That is, the transistor 6402 for driving the light-emitting element operates in a linear region, and thus, a voltage higher than the voltage of the power supply line 6407 is applied to the gate of the transistor 6402 for driving the light-emitting element. Note that a voltage greater than or equal to the sum of the power supply line voltage and $V_{th}$ of the transistor 6402 for driving the light-emitting element is applied to the signal line 6405.

In the case of employing an analog grayscale method instead of the digital time grayscale method, the same pixel structure as in FIG. 16 can be employed by inputting signals in a different way.

In the case of employing the analog grayscale method, a voltage greater than or equal to voltage which is the sum of forward voltage of the light-emitting element 6404 and $V_{th}$ of the transistor 6402 for driving the light-emitting element is applied to the gate of the transistor 6402 for driving the light-emitting element. The forward voltage of the light-emitting element 6404 refers to a voltage to obtain a desired luminance, and is larger than at least a forward threshold voltage. By inputting a video signal to enable the transistor 6402 for driving the light-emitting element to operate in a saturation region, current can be supplied to the light-emitting element 6404. In order that the transistor 6402 for driving the light-emitting element may operate in the saturation region, the potential of the power supply line 6407 is set higher than a gate potential of the transistor 6402 for driving the light-emitting element. When an analog video signal is used, it is possible to feed current to the light-emitting element 6404 in accordance with the video signal and perform analog gray-scale driving.

Note that the pixel structure is not limited to that illustrated in FIG. 16. For example, the pixel in FIG. 16 can further include a switch, a resistor, a capacitor, a transistor, a logic circuit, or the like.

Next, structures of the light-emitting element will be described with reference to FIGS. 17A to 17C. Here, a cross-sectional structure of a pixel will be described using an example where a driver TFT is an n-channel TFT. TFTs 7001, 7011, and 7021 for driving a light-emitting element which are used for the semiconductor devices illustrated in FIGS. 17A to 17C can be manufactured in a manner similar to that of the thin film transistor described in any of Embodiments 1 to 3.

In order to extract light emitted from the light-emitting element, at least one of an anode and a cathode should be transparent. There are following structures of a light-emitting element which is formed over the same substrate as a thin film transistor: a top-emission structure in which light is extracted through the surface opposite to the substrate, a bottom-emission structure in which light is extracted through the surface of the substrate, and a dual-emission structure in which light is extracted through the surface opposite to the substrate and the surface of the substrate. The pixel structure can be applied to a light-emitting element having any of these emission structures.

A light-emitting element having a bottom emission structure will be described with reference to FIG. 17A.

A cross-sectional view of a pixel in the case where the TFT 7011 for driving a light-emitting element is of an n-type and light is emitted from a light-emitting element 7012 to a cathode 7013 side. In FIG. 17A, the cathode 7013 of the light-emitting element 7012 is formed over a light-transmitting conductive film 7017 which is electrically connected to the TFT 7011 for driving a light-emitting element, and an EL layer 7014 and an anode 7015 are stacked in that order over the cathode 7013. An insulating layer 7031 is formed over a substrate. An insulating layer 7032 is formed over a gate electrode of the TFT 7011 for driving a light-emitting element. An insulating layer 7037 and an insulating layer 7039 are formed over a source electrode and a drain electrode of the TFT 7011 for driving a light-emitting element. A source wiring 7018a and a source wiring 7018b are formed over the insulating layer 7037 and are connected to the source electrode of the TFT 7011 for driving a light-emitting element through a contact hole formed in the insulating layer 7037. Note that the light-transmitting conductive film 7017 is electrically connected to the drain electrode of the TFT 7011 for driving a light-emitting element through a contact hole formed in a protective insulating layer 7035, an overcoat layer 7034, a color filter layer 7033, the insulating layer 7039, and the insulating layer 7037.

As the light-transmitting conductive film 7017, a light-transmitting conductive film of, for example, indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added can be used.

Any of a variety of materials can be used for the cathode 7013. Specifically, the cathode 7013 is preferably formed using a material having a low work function such as an alkali metal such as Li or Cs; an alkaline earth metal such as Mg, Ca, or Sr; an alloy containing any of these metals (e.g., Mg:Ag or Al:Li); a rare earth metal such as Yb or Er; or the like. In FIG. 17A, the thickness of the cathode 7013 is set so that light can be transmitted (preferably, about 5 nm to 30 nm). For example, an aluminum film having a thickness of 20 nm is used as the cathode 7013.

Note that the light-transmitting conductive film and the aluminum film may be stacked and selectively etched to form the light-transmitting conductive film 7017 and the cathode 7013; in this case, the tight-transmitting conductive film 7017 and the cathode 7013 can be etched using the same mask, which is preferable.

The peripheral portion of the cathode 7013 is covered with a partition 7019. The partition 7019 is formed using an organic resin film of polyimide, an acrylic resin, polyamide, an epoxy resin, or the like; an inorganic insulating film; or organic polysiloxane. It is particularly preferable that the partition 7019 be formed using a photosensitive resin material to have an opening over the cathode 7013 and a sidewall of the opening be formed as an inclined surface with a continuous curvature. In the case where a photosensitive resin material is used for the partition 7019, a step of forming a resist mask can be omitted.

The EL layer 7014 which is formed over the cathode 7013 and the partition 7019 may be formed as a single layer or a stack of plural layers. When the EL layer 7014 is formed as a stack of plural layers, the EL layer 7014 is formed by stacking an electron-injection layer, an electron-transport layer, a light-emitting layer, a hole-transport layer, and a hole-injection layer in that order over the cathode 7013. Note that not all of these layers need to be provided.

The stacking order is not limited to the above, and a hole-injection layer, a hole-transport layer, a light-emitting layer, an electron-transport layer, and an electron-injection layer may be stacked in that order over the cathode 7013. However, from a power consumption standpoint, it is preferable that an electron-injection layer, an electron-transport layer, a light-emitting layer, a hole-transport layer, and a hole-injection layer be stacked in that order over the cathode 7013 because power consumption can be reduced.

As the anode 7015 formed over the EL layer 7014, various materials can be employed, and a material having a high work function such as titanium nitride, zirconium nitride, Ti, W, Ni, Pt, or Cr; or a light-transmitting conductive material such as ITO, IZO, or ZnO is preferably used for example. Further, a blocking film 7016, for example, a metal which blocks light or a metal which reflects light is provided over the anode 7015. In this embodiment, an ITO film is used as the anode 7015, and a Ti film is used as the blocking film 7016.

The light-emitting element 7012 corresponds to a region where the EL layer 7014 is sandwiched between the cathode 7013 and the anode 7015. In the element structure illustrated in FIG. 17A, light is emitted from the light-emitting element 7012 to the cathode 7013 side as indicated by an arrow.

Note that an example in which a light-transmitting conductive film is used as a gate electrode is illustrated in FIG. 17A; thus, light emitted from the light-emitting element 7012 passes through the color filter layer 7033 and is emitted outside.

The color filter layer 7033 is formed by a droplet discharge method such as an ink jetting method, a printing method, an etching method using a photolithography technique, or the like.

The color filter layer 7033 is covered with the overcoat layer 7034, and further covered with the protective insulating layer 7035. Note that although the overcoat layer 7034 has a thin thickness in FIG. 17A, the overcoat layer 7034 has a function to planarize roughness due to the color filter layer 7033.

The contact hole which is formed in the protective insulating layer 7035, the overcoat layer 7034, the color filter layer 7033, the insulating layer 7037, and the insulating layer 7039 and reaches the drain electrode is positioned to overlap with the partition 7019. In FIG. 17A, the contact hole which reaches the drain electrode and the partition 7019 overlap with each other, whereby an aperture ratio can be improved.

Next, a light-emitting element having a dual emission structure will be described with reference to FIG. 17B.

In FIG. 17B, the cathode 7023 of the light-emitting element 7022 is formed over a light-transmitting conductive film 7027 which is electrically connected to the TFT 7021 for driving a light-emitting element, and an EL layer 7024 and an anode 7025 are stacked in that order over the cathode 7023. An insulating layer 7041 is formed over a substrate. An insulating layer 7024 is formed over a gate electrode of the TFT 7021 for driving a light-emitting element. An insulating layer 7047 and an insulating layer 7049 are formed over a source electrode and a drain electrode of the TFT 7021 for driving a light-emitting element. A source wiring 7028a and a source wiring 7028b are formed over the insulating layer 7047 and are connected to the source electrode of the TFT 7021 for driving a light-emitting element through a contact hole formed in the insulating layer 7047. Note that the light-transmitting conductive film 7027 is electrically connected to the drain electrode of the TFT 7021 for driving a light-emitting element through a contact hole formed in a protective insulating layer 7045, an overcoat layer 7044, a color filter layer 7043, the insulating layer 7049, and the insulating layer 7047.

As the light-transmitting conductive film 7027, a light-transmitting conductive film of, for example, indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added can be used.

Any of a variety of materials can be used for the cathode 7023. Specifically, the cathode 7023 is preferably formed using a material having a low work function such as an alkali metal such as Li or Cs; an alkaline earth metal such as Mg, Ca, or Sr; an alloy containing any of these metals (e.g., Mg:Ag or Al:Li); a rare earth metal such as Yb or Er; or the like. In this embodiment, the thickness of the cathode 7023 is set so that light can be transmitted (preferably, about 5 μm to 30 nm). For example, an aluminum film having a thickness of 20 nm is used as the cathode 7023.

Note that the light-transmitting conductive film and the aluminum film may be stacked and selectively etched to form the light-transmitting conductive film 7027 and the cathode 7023; in this case, the light-transmitting conductive film 7027 and the cathode 7023 can be etched using the same mask, which is preferable.

The peripheral portion of the cathode 7023 is covered with a partition 7029. The partition 7029 is formed using an organic resin film of polyimide, an acrylic resin, polyamide, an epoxy resin, or the like; an inorganic insulating film; or organic polysiloxane. It is particularly preferable that the partition 7029 be formed using a photosensitive resin material to have an opening over the cathode 7023 and a sidewall of the opening is formed as an inclined surface with a continuous curvature. In the case where a photosensitive resin material is used for the partition 7029, a step of forming a resist mask can be omitted.

The EL layer 7024 which is formed over the cathode 7023 and the partition 7029 may be formed as a single layer or a stack of plural layers. When the EL layer 7024 is formed as a stack of plural layers, the EL layer 7024 is formed by stacking an electron-injection layer, an electron-transport layer, a light-emitting layer, a hole-transport layer, and a hole-injection layer in that order over the cathode 7023. Note that not all of these layers need to be provided.

The stacking order is not limited to the above, and a hole-injection layer, a hole-transport layer, a light-emitting layer, an electron-transport layer, and an electron-injection layer may be stacked in that order over the cathode 7023. However, from a power consumption standpoint, it is preferable that an electron-injection layer, an electron-transport layer, a light-emitting layer, a hole-transport layer, and a hole-injection layer be stacked in that order over the cathode 7023 because power consumption can be reduced.

As the anode 7025 formed over the EL layer 7024, various materials can be employed, and a material having a high work function, for example, a light-transmitting conductive material of ITO, IZO, ZnO, or the like is preferably used. In this embodiment, an ITO film including silicon oxide is used as the anode 7025.

The light-emitting element 7022 corresponds to a region where the EL layer 7024 is sandwiched between the cathode 7023 and the anode 7025. In the element structure illustrated in FIG. 17B, light is emitted from the light-emitting element 7022 to both the anode 7025 side and the cathode 7013 side as indicated by arrows.

Note that an example in which a light-transmitting conductive film is used as a gate electrode layer is illustrated in FIG. 17B; thus, light emitted from the light-emitting element 7022 to the cathode 7023 passes through the color filter layer 7043 and is emitted outside.

The color filter layer 7043 is formed by a droplet discharge method such as an ink jetting method, a printing method, an etching method using a photolithography technique, or the like.

The color filter layer 7043 is covered with the overcoat layer 7044, and further covered with the protective insulating layer 7045.

The contact hole which is formed in the protective insulating layer 7045, the overcoat layer 7044, the color filter layer 7043, the insulating layers 7047 and 7049 and reaches the drain electrode is positioned to overlap with the partition 7029. The contact hole which reaches the drain electrode and the partition 7029 overlap with each other, whereby the aperture ratio on the anode 7025 side can be approximately the same as the aperture ratio on the cathode 7023 side.

Note that when a light-emitting element having a dual emission structure is used and full color display is performed on both display surfaces, light emitted from the anode 7025 side does not pass through the color filter layer 7043; therefore, a sealing substrate provided with another color filter layer is preferably provided over the anode 7025.

A light-emitting element having a top emission structure will be described with reference to FIG. 17C.

FIG. 17C is a cross-sectional view of a pixel in the case where the TFT 7001 for driving a light-emitting element is an n-channel TFT and light is emitted from a light-emitting element 7002 to an anode 7005 side. In FIG. 17C, a cathode 7003 of the light-emitting element 7002 is formed which is electrically connected to the TFT 7001 for driving a light-emitting element, and an EL layer 7004 and the anode 7005 are stacked in that order over the cathode 7003. An insulating layer 7051 is formed over a substrate. An insulating layer 7052 is formed over a gate electrode of the TFT 7001 for driving a light-emitting element. An insulating layer 7057 and an insulating layer 7059 are formed over a source electrode and a drain electrode of the TFT 7001 for driving a light-emitting element. A source wiring 7008a and a source wiring 7008b are formed over the insulating layer 7057 and are connected to the source electrode of the TFT 7001 for driving a light-emitting element through a contact hole formed in the insulating layer 7057. Note that the cathode 7003 is electrically connected to the drain electrode of the TFT 7001 for driving a light-emitting element through a contact hole formed in the insulating layers 7057 and 7059.

Any of a variety of materials can be used for the cathode 7003. Specifically, the cathode 7003 is preferably formed using a material having a low work function such as an alkali metal such as Li or Cs; an alkaline earth metal such as Mg, Ca, or Sr; an alloy containing any of these metals (e.g., Mg:Ag or Al:Li); a rare earth metal such as Yb or Er; or the like.

The peripheral portion of the cathode 7003 is covered with a partition 7009. The partition 7009 is formed using an organic resin film of polyimide, an acrylic resin, polyamide, an epoxy resin, or the like; an inorganic insulating film; or organic polysiloxane. It is particularly preferable that the partition 7009 be formed using a photosensitive resin material to have an opening over the cathode 7003 and a sidewall of the opening is formed as an inclined surface with a continuous curvature. In the case where a photosensitive resin material is used for the partition 7009, a step of forming a resist mask can be omitted.

The EL layer 7004 which is formed over the cathode 7003 and the partition 7009 may be formed as a single layer or a stack of plural layers. When the EL layer 7004 is formed as a stack of plural layers, the EL layer 7004 is formed by stacking an electron-injection layer, an electron-transport layer, a light-emitting layer, a hole-transport layer, and a hole-injection layer in that order over the cathode 7003. Note that not all of these layers need to be provided.

The stacking order is not limited to the above, and a hole-injection layer, a hole-transport layer, a light-emitting layer, an electron-transport layer, and an electron-injection layer may be stacked in that order over the cathode 7003. In the case where these layers are stacked in that order, the cathode 7003 serves as an anode.

In FIG. 17C, a hole-injection layer, a hole-transport layer, a light-emitting layer, an electron-transport layer, and an electron-injection layer are stacked in that order over a stacked film in which a Ti film, an aluminum film, and a Ti film are stacked in that order, and a stacked layer of a Mg:Ag alloy thin film and ITO is formed thereover.

However, from a power consumption standpoint, it is preferable that an electron-injection layer, an electron-transport layer, a light-emitting layer, a hole-transport layer, and a hole-injection layer be stacked in that order over the cathode 7003 because power consumption can be reduced.

The anode 7005 is formed using a light-transmitting conductive material which transmits light, and for example, a light-transmitting conductive film of indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like may be used.

The light-emitting element 7002 corresponds to a region where the EL layer 7004 is sandwiched between the cathode 7003 and the anode 7005. In the pixel illustrated in FIG. 17C, light is emitted from the light-emitting element 7002 to the anode 7005 side as indicated by an arrow.

In FIG. 17C, the drain electrode of the TFT 7001 for driving a light-emitting element is electrically connected to the cathode 7003 through the contact hole formed in the insulating layers 7057 and 7059. For a planarization insulating layer 7053, an organic material such as polyimide, an acrylic resin, benzocyclobutene-based resin, polyamide, or epoxy resin can be used. As an alternative to such organic materials, it is possible to use a low-dielectric constant material (a low-k material), a siloxane-based resin, phosphosilicate glass (PSG), borophosphosilicate glass (BPSG), or the like. Note that the planarization insulating layer 7053 may be formed by stacking a plurality of insulating films formed of these materials. Depending on the material, the planarization insulating layer 7053 can be formed by a method such as sputtering method, an SOG method, a spin coating method, a dipping method, a spray coating method, or a droplet discharge method (e.g., an ink jetting method, screen printing, or offset printing), or by using a tool (apparatus) such as a doctor knife, a roll coater, a curtain coater, a knife coater, or the like. A protective insulating layer 7055 is formed over the planarization insulating layer 7053.

The partition 7009 is provided so as to insulate the cathode 7003 and a cathode of an adjacent pixel. The partition 7009 is formed using an organic resin film of polyimide, an acrylic resin, polyamide, an epoxy resin, or the like; an inorganic insulating film; or organic polysiloxane. It is particularly preferable that the partition 7009 be formed using a photosensitive resin material to have an opening over the cathode 7003 and a sidewall of the opening is formed as an inclined surface with a continuous curvature. In the case where a photosensitive resin material is used for the partition 7009, a step of forming a resist mask can be omitted.

In the structure of FIG. 17C, when full color display is performed, for example, the light-emitting element 7002 is used as a green light-emitting element, one of adjacent light-emitting elements is used as a red light-emitting element, and the other is used as a blue light-emitting element. Alternatively, a light-emitting display device capable of full color display may be manufactured using four kinds of light-emitting elements, which include white light-emitting elements as well as three kinds of light-emitting elements.

In the structure of FIG. 17C, a light-emitting display device capable of full color display may be manufactured in such a way that all of a plurality of light-emitting elements which is arranged is white light-emitting elements and a sealing substrate having a color filter or the like is provided over the light-emitting element 7002. When a material which exhibits a single color such as white is formed and then combined with a color filter or a color conversion layer, full color display can be performed.

Needless to say, display with single color light emission can also be performed. For example, a lighting system may be formed with the use of white light emission, or an area-color light-emitting device may be formed with the use of a single color light emission.

If necessary, an optical film such as a polarizing film including a circularly polarizing plate may be provided.

Although an organic EL element is described here as a light-emitting element, an inorganic EL element can alternatively be provided as a light-emitting element.

Although the example in which a thin film transistor (a TFT for driving a light-emitting element) which controls the driving of a light-emitting element is electrically connected to the light-emitting element has been described, a structure may be employed in which a TFT for controlling current is connected between the TFT for driving the light-emitting element and the light-emitting element.

When the structure is not provided with a light-emitting element or a partition, this embodiment can be applied to a liquid crystal display device. The case of a liquid crystal display device is illustrated in FIG. 37.

Figure 37:
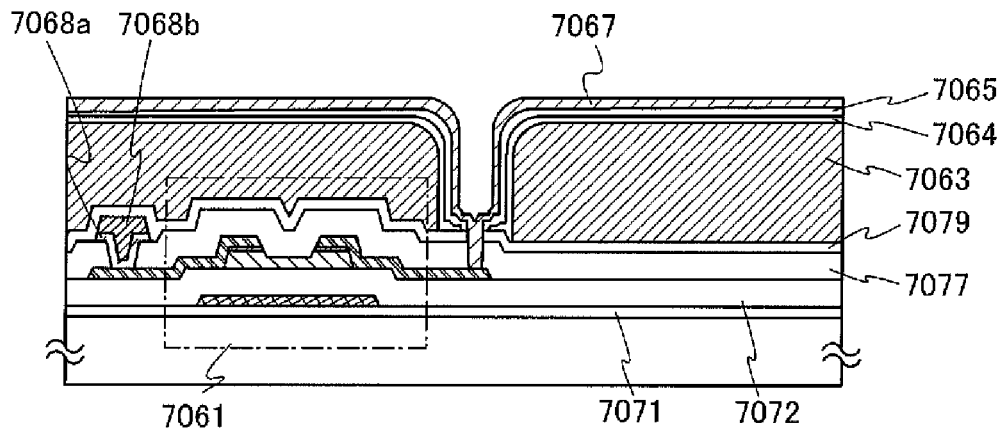
FIG. 37 illustrates a semiconductor device.

In FIG. 37, a light-transmitting conductive film 7067 which is electrically connected to the driver TFT 7061 is provided. An insulating layer 7071 is formed over a substrate. An insulating layer 7072 is formed over a gate electrode of the driver TFT 7061. An insulating layer 7077 and an insulating layer 7079 are formed over a source electrode and a drain electrode of the driver TFT 7061. A source wiring 7068a and a source wiring 7068b are formed over the insulating layer 7077 and are connected to the source electrode of the driver TFT 7061 through a contact hole formed in the insulating layer 7077. The light-transmitting conductive film 7067 is electrically connected to the drain electrode of the driver TFT 7061 through a contact hole formed in the insulating layer 7077 and the insulating layer 7079.

As the light-transmitting conductive film 7067, a light-transmitting conductive film of, for example, indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added can be used.

Note that in FIG. 37, light emitted from a backlight or the like passes through a color filter layer 7063 and emitted outside. The color filter layer 7063 is formed by a droplet discharge method such as an ink jetting method, a printing method, an etching method using a photolithography technique, or the like.

The color filter layer 7063 is covered with an overcoat layer 7064, and further covered with a protective insulating layer 7065. Note that although the overcoat layer 7064 has a small thickness in FIG. 37, the overcoat layer 7064 has a function to planarize roughness due to the color filter layer 7063.

By providing a liquid crystal layer over the light-transmitting conductive film 7067, the structure can be applied to a liquid crystal display device.

The appearance and a cross section of a light-emitting display panel (also referred to as a light-emitting panel), which is one embodiment of a semiconductor device, will be described with reference to FIGS. 15A and 15B. FIG. 15A is a plan view of a panel in which thin film transistors and a light-emitting element which are formed over a first substrate are sealed between the first substrate and a second substrate with a sealant. FIG. 15B is a cross-sectional view taken along line H-I in FIG. 15A.

A sealant 4505 is provided so as to surround a pixel portion 4502, signal line driver circuits 4503a and 4503b, and scan line driver circuits 4504a and 4504b, which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be thus packaged (sealed) with a protective film (such as a bonding film or an ultraviolet curable resin film) or a cover material with high air-tightness and little degasification so that the pixel portion 4502, the signal line driver circuits 4503a and 4503b, the scan line driver circuits 4504a and 4504b are not exposed to air.

The pixel portion 4502, the signal line driver circuits 4503a and 45036, and the scan line driver circuits 4504a and 4504b which are formed over the first substrate 4501 each include a plurality of thin film transistors. A thin film transistor 4510 included in the pixel portion 4502 and a thin film transistor 4509 included in the signal line driver circuit 4503a are illustrated as an example in FIG. 15B. Insulating layers 4541 and 4543 are provided over the thin film transistors 4509 and 4510, and an insulating layer 4544 is provided over the thin film transistor 4510. In addition, an insulating layer 4545 is provided over the first substrate 4501 and an insulating layer 4546 is provided over gate electrodes of the thin film transistors. A source wiring 4548 is provided over the insulating layer 4541 and is connected to a source electrode of the thin film transistor 4510 through a contact hole formed in the insulating layer 4541.

Any of the thin film transistors which are described in Embodiments 1 to 3 can be used as the thin film transistors 4509 and 4510. In this embodiment, the thin film transistors 4509 and 4510 are n-channel thin film transistors.

A conductive layer 4540 is provided over part of the insulating layer 4543, which overlaps with a channel formation region in a semiconductor layer in the thin film transistor 4509 for the driver circuit. The conductive layer 4540 is provided at the position overlapping with the channel formation region of the semiconductor layer, whereby the threshold voltage of the thin film transistor 4509 can be controlled. In addition, the amount of change in threshold voltage of the thin film transistor 4509 before and after the BT test can be reduced. A potential of the conductive layer 4540 may be the same or different from that of a gate electrode of the thin film transistor 4509. The conductive layer 4540 can also serve as a second gate electrode. Alternatively, the potential of the conductive layer 4540 may be GND or 0 V, or the conductive layer 4540 may be in a floating state.

The insulating layer 4544 is formed as the planarization insulating film. The insulating layer 4544 can be formed using a material and a method which are similar to those of the insulating layer 4021 described in Embodiment 7. Here, an acrylic resin is used for the insulating layer.

Moreover, reference numeral 4511 denotes a light-emitting element. A first electrode layer 4517 which is a pixel electrode included in the light-emitting element 4511 is electrically connected to a source electrode or a drain electrode of the thin film transistor 4510. Note that although the light-emitting element 4511 has a stacked-layer structure including the first electrode layer 4517, an electroluminescent layer 4512, and a second electrode layer 4513 in this embodiment, the structure of the light-emitting element 4511 is not limited thereto. The structure of the light-emitting element 4511 can be changed as appropriate depending on, for example, the direction in which light is extracted from the light-emitting element 4511.

The partition 4520 is formed using an organic resin film, an inorganic insulating film, or organic polysiloxane. It is particularly preferable that the partition be formed using a photosensitive material to have an opening over the first electrode layer 4517 and a sidewall of the opening be formed as an inclined surface with a continuous curvature.

The electroluminescent layer 4512 may be formed as a single layer or a stack of plural layers.

In order to prevent entry of oxygen, hydrogen, moisture, carbon dioxide, or the like into the light-emitting element 4511, a protective film may be formed over the second electrode layer 4513 and the partition 4520. As the protective film, a silicon nitride film, a silicon nitride oxide film, a DLC film, or the like can be formed.

In addition, a variety of signals and potentials are supplied from FPCs 4518a and 4518b to the signal line driver circuits 4503a and 4503b, the scan line driver circuits 4504a and 4504b, or the pixel portion 4502.

A connection terminal electrode 4515 is formed using the same conductive film as the first electrode layer 4517 included in the light-emitting element 4511. A terminal electrode 4516 is formed using the same conductive film as a source and drain electrodes included in the thin film transistors 4509 and 4510.

The connection terminal electrode 4515 is electrically connected to a terminal included in the FPC 4518a via an anisotropic conductive film 4519.

The second substrate located in the direction in which light is extracted from the light-emitting element 4511 needs to have a light-transmitting property. In that case, a light-transmitting material such as a glass plate, a plastic plate, a polyester film, or an acrylic resin film is used.

As the filler 4507, an ultraviolet curable resin or a thermosetting resin can be used as well as an inert gas such as nitrogen or argon. For example, poly(vinyl chloride) (PVC), an acrylic resin, polyimide, an epoxy resin, a silicone resin, poly(vinyl butyral) (PVB), or a copolymer of ethylene with vinyl acetate (EVA) can be used. For example, nitrogen may be used as the filler.

If needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions of the surface so as to reduce the glare can be performed.

As the signal line driver circuits 4503a and 4503b and the scan line driver circuits 4504a and 4504b, driver circuits formed by using a single crystal semiconductor film or a polycrystalline semiconductor film over a substrate separately prepared may be mounted. Alternatively, only the signal line driver circuits or part thereof, or only the scan line driver circuits or part thereof may be separately formed and then mounted. The structure is not limited to the structure illustrated in FIGS. 15A and 15B.

Through the above steps, a highly reliable light-emitting display device (display panel) as a semiconductor device can be manufactured.

By manufacturing the above light-emitting display device using the display device disclosed in this specification, a gate wiring or a source wiring can be formed using a conductive material including Cu; thus, an increase in wiring resistance can be prevented. Accordingly, an increase in operation speed and a reduction in power consumption of the light-emitting display device can be achieved, whereby a light-emitting display device which can have a large screen or a high definition screen can be provided.

This embodiment can be implemented in appropriate combination with any structure described in the other embodiments.

Embodiment 10

Figure 24A:
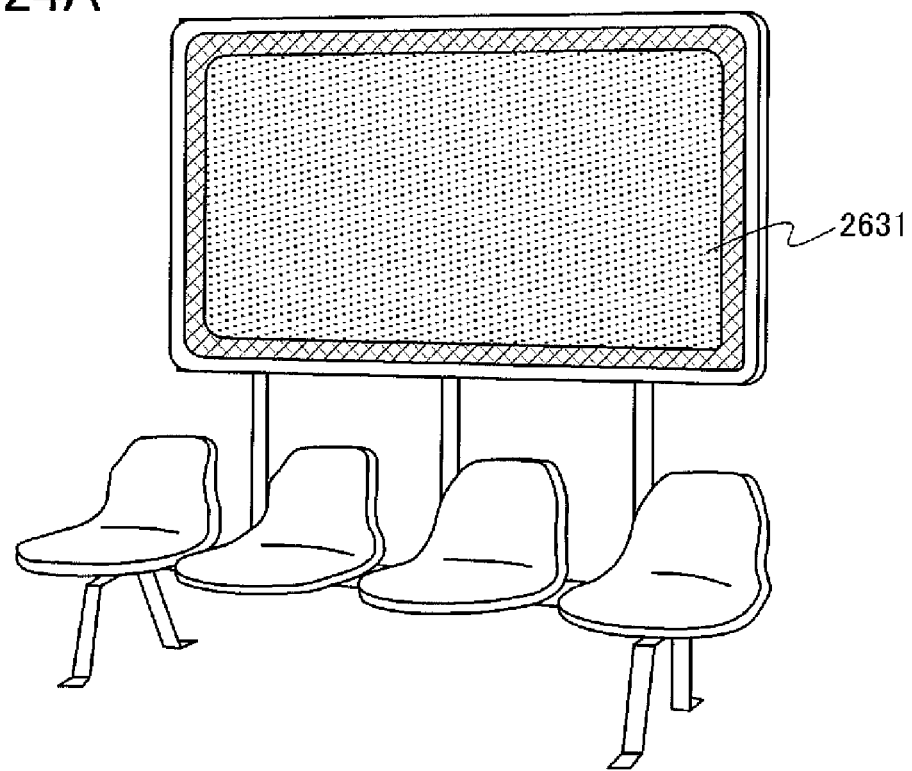
FIGS. 24A and 24B illustrate applications of an electronic paper.
Figure 24B:
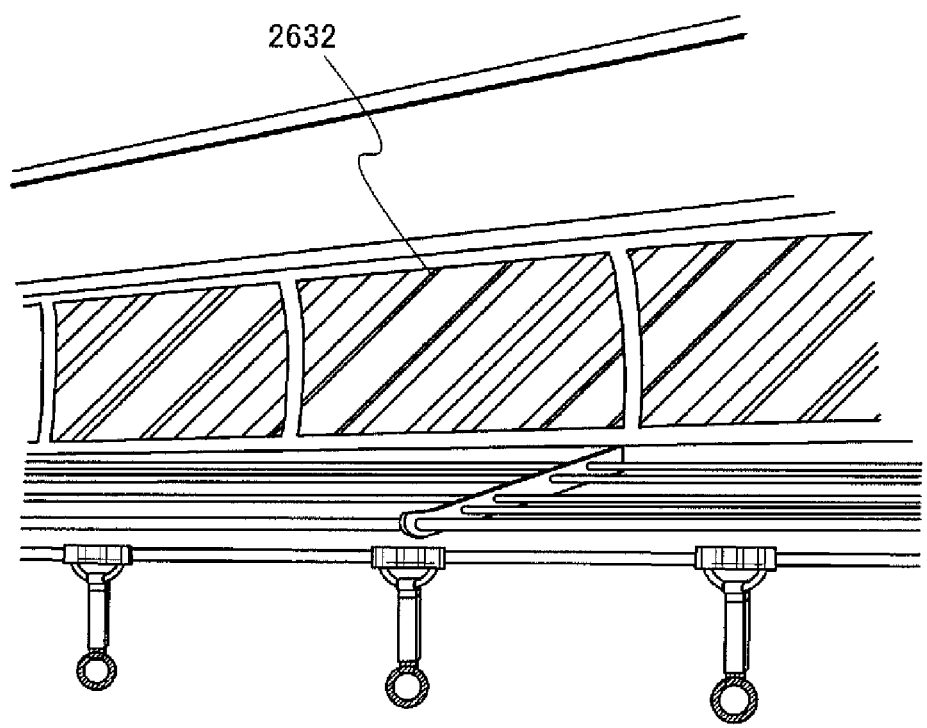
Figure 25:
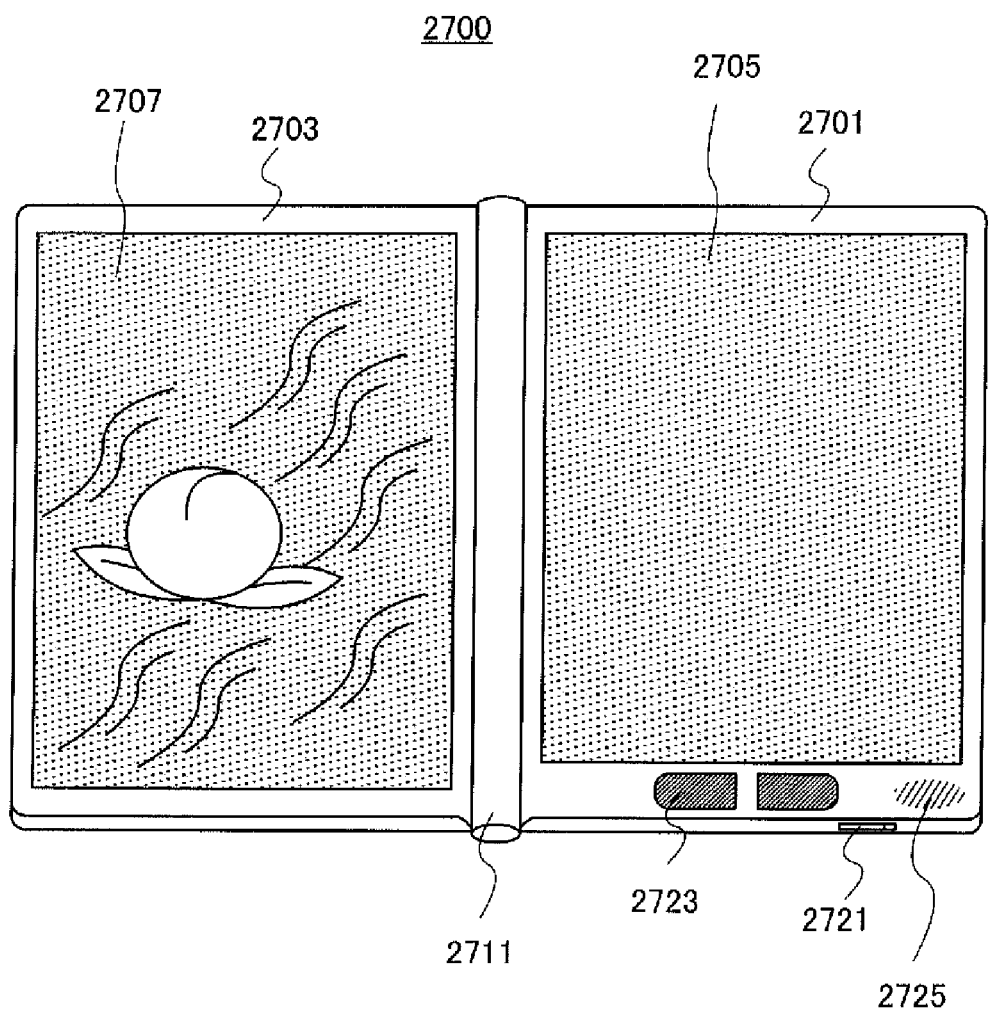
FIG. 25 is an external view illustrating an example of an electronic book reader.

The semiconductor device disclosed in this specification can be applied to an electronic paper. An electronic paper can be used for electronic devices for displaying information in all fields. For example, an electronic paper can be applied to an electronic book reader (an e-book reader), a poster, an advertisement in a vehicle such as a train, or a display of a variety of cards such as a credit card. FIGS. 24A and 24B and FIG. 25 illustrate examples of the electronic devices.

FIG. 24A illustrates a poster 2631 formed using an electronic paper. In the case where an advertising medium is printed paper, the advertisement is replaced by hands; however, when an electronic paper is used, the advertising display can be changed in a short time. Furthermore, stable images can be obtained without display defects. Note that the poster may be configured to transmit and receive data wirelessly.

By manufacturing the poster 2631 using the display device disclosed in this specification, a gate wiring or a source wiring can be formed using a conductive material including Cu; thus, an increase in wiring resistance can be prevented. Accordingly, an increase in operation speed and a reduction in power consumption of the display device can be achieved, whereby the poster 2631 which can have a large screen or a high definition screen can be provided.

FIG. 24B illustrates an advertisement 2632 in a vehicle such as a train. In the case where an advertising medium is printed paper, the advertisement is replaced by hands; however, when an electronic paper is used, the advertisement display can be changed in a short time without much manpower. Furthermore, stable images can be obtained without display defects. Note that the advertisement in a vehicle may be configured to transmit and receive data wirelessly.

By manufacturing the advertisement 2632 in a vehicle using the display device disclosed in this specification, a gate wiring or a source wiring can be formed using a conductive material including Cu; thus, an increase in wiring resistance can be prevented. Accordingly, an increase in operation speed and a reduction in power consumption of the display device can be achieved, whereby the advertisement 2632 in a vehicle which can have a large screen or a high definition screen can be provided.

FIG. 25 illustrates an example of an electronic book reader. For example, an electronic book reader 2700 includes two housings, a housing 2701 and a housing 2703. The housing 2701 and the housing 2703 are combined with a hinge 2711 so that the electronic book reader 2700 can be opened and closed along the hinge 2711. With such a structure, the electronic book reader 2700 can be handled like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right (the display portion 2705 in FIG. 25) can display text and a display portion on the left (the display portion 2707 in FIG. 25) can display an image.

FIG. 25 illustrates an example in which the housing 2701 is provided with an operation portion and the like. For example, the housing 2701 is provided with a power switch 2721, operation keys 2723, a speaker 2725, and the like. Pages can be turned with the operation keys 2723. Note that a keyboard, a pointing device, and the like may be provided on the same surface as the display portion of the housing. Moreover, an external connection terminal (an earphone terminal, a USB terminal, a terminal connectable to a variety of cables such as an AC adapter or a USB cable), a storage medium insertion portion, and the like may be provided on the back surface or the side surface of the housing. Moreover, the electronic book reader 2700 may have a function of an electronic dictionary.

The electronic book reader 2700 may be configured to wirelessly transmit and receive data. Through wireless communication, desired book data or the like can be purchased and downloaded from an electronic book server.

Embodiment 11

The semiconductor device disclosed in this specification can be applied to a variety of electronic devices (including game machines). Examples of such electronic devices are a television device (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio playback device, a large-sized game machine such as a pinball machine, and the like.

Figure 26A:
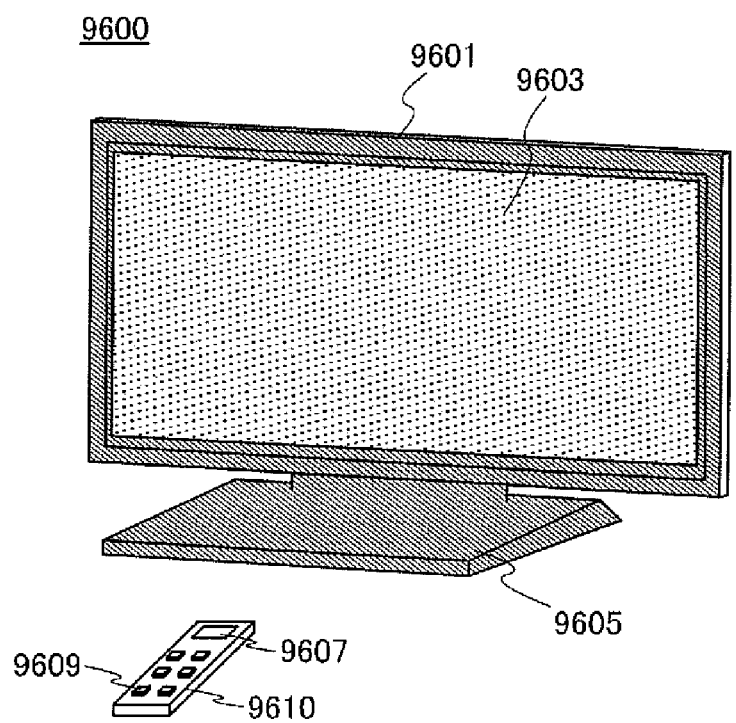
FIGS. 26A and 26B are external views respectively illustrating an example of a television device and an example of a digital photo frame.

FIG. 26A illustrates an example of a television device. In the television device 9600, a display portion 9603 is incorporated in a housing 9601. The display portion 9603 can display images. Here, the housing 9601 is supported by a stand 9605.

The television device 9600 can be operated with an operation switch of the housing 9601 or a separate remote control 9610. Channels can be switched and volume can be controlled with operation keys 9609 of the remote control 9610, whereby an image displayed on the display portion 9603 can be controlled. Moreover, the remote control 9610 may be provided with a display portion 9607 for displaying data output from the remote control 9610.

Note that the television device 9600 is provided with a receiver, a modem, and the like. With the receiver, general TV broadcasts can be received. Moreover, when the display device is connected to a communication network with or without wires via the modem, one-way (from a sender to a receiver) or two-way (e.g., between a sender and a receiver or between receivers) information communication can be performed.

By manufacturing the television device 9600 using the display device disclosed in this specification, a gate wiring or a source wiring can be formed using a conductive material including Cu; thus, an increase in wiring resistance can be prevented. Accordingly, an increase in operation speed and a reduction in power consumption of the display device can be achieved, whereby the television device 9600 which can have a large screen or a high definition screen can be provided.

Figure 26B:
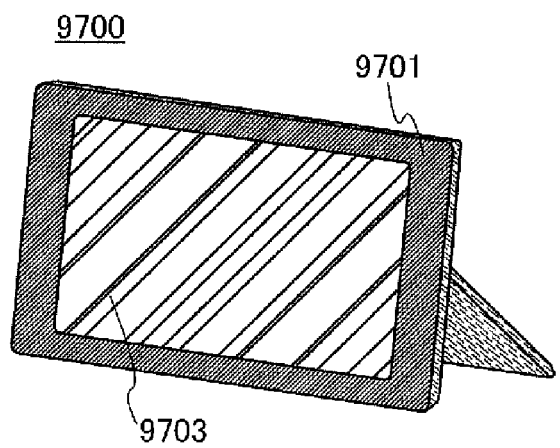

FIG. 26B illustrates an example of a digital photo frame. For example, in a digital photo frame 9700, a display portion 9703 is incorporated in a housing 9701. The display portion 9703 can display a variety of images. For example, the display portion 9703 can display image data taken with a digital camera or the like and function like a normal photo frame.

Note that the digital photo frame 9700 is provided with an operation portion, an external connection terminal (a USB terminal, a terminal connectable to a variety of cables such as a USB cable), a storage medium insertion portion, and the like. Although these components may be provided on the same surface as the display portion, it is preferable to provide them on the side surface or the back surface for design aesthetics. For example, a storage medium storing image data taken with a digital camera is inserted into the storage medium insertion portion of the digital photo frame and the data is loaded, whereby the image can be displayed on the display portion 9703.

The digital photo frame 9700 may be configured to transmit and receive data wirelessly. Through wireless communication, desired image data can be loaded to be displayed.

Figure 27A:
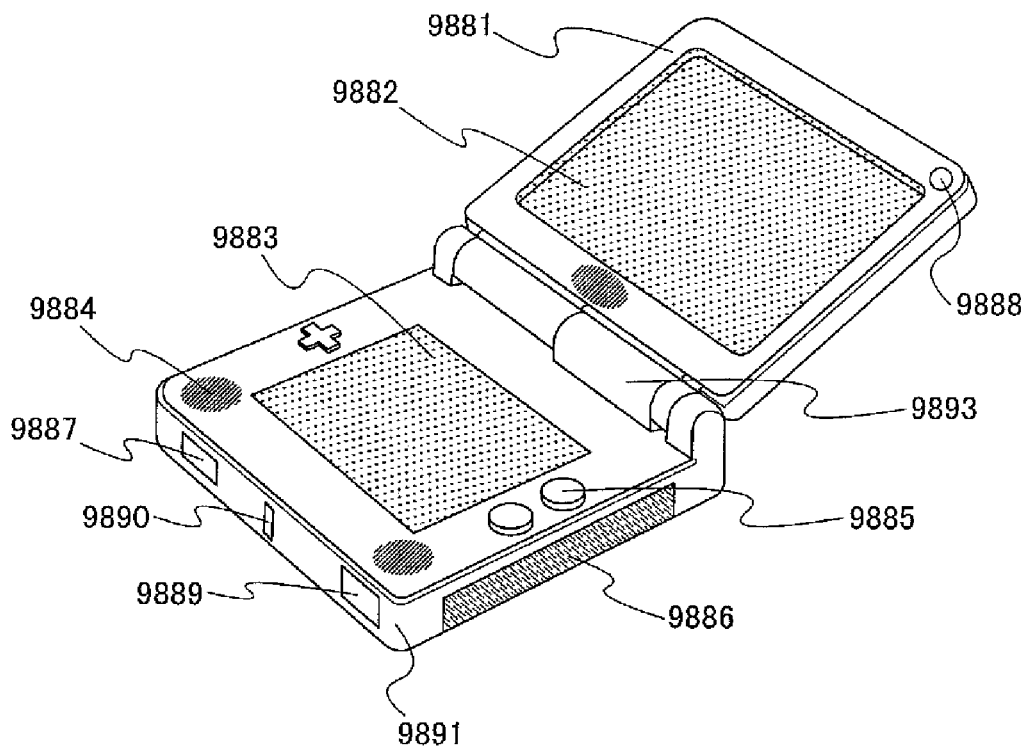
FIGS. 27A and 27B are external views each illustrating an example of a game machine.

FIG. 27A illustrates a portable game console including two housings, a housing 9881 and a housing 9891 which are jointed with a joint portion 9893 so that the portable game console can be opened or folded. A display portion 9882 and a display portion 9883 are incorporated in the housing 9881 and the housing 9891, respectively. In addition, the portable game console illustrated in FIG. 27A is provided with a speaker portion 9884, a storage medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray), and a microphone 9889), and the like. Needless to say, the structure of the portable game console is not limited to the above and another structure which is provided with at least the semiconductor device disclosed in this specification can be employed. The portable game console may include an additional accessory as appropriate. The portable game console illustrated in FIG. 27A has a function of reading a program or data stored in a storage medium to display it on the display portion, and a function of sharing data with another portable game console by wireless communication. Note that a function of the portable game console illustrated in FIG. 27A is not limited to those described above, and the portable game console can have a variety of functions.

Figure 27B:
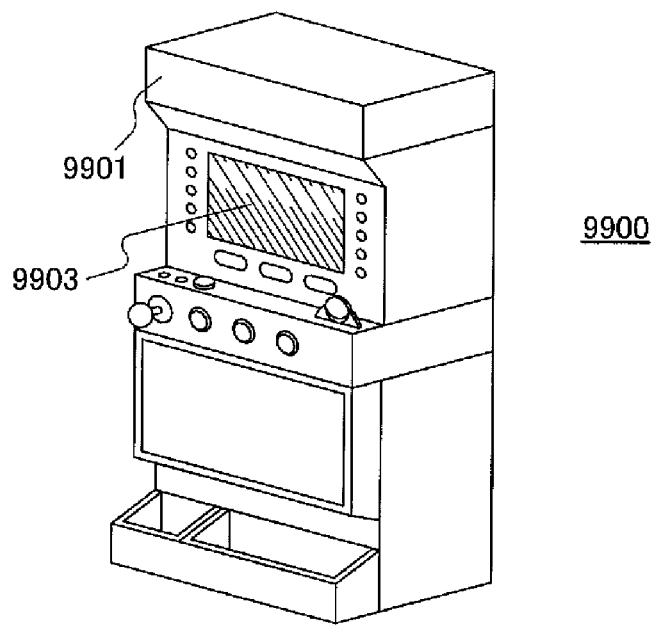

FIG. 27B illustrates an example of a slot machine which is a large-sized game machine. In a slot machine 9900, a display portion 9903 is incorporated in a housing 9901. In addition, the slot machine 9900 includes an operation means such as a start lever or a stop switch, a coin slot, a speaker, and the like. Needless to say, the structure of the slot machine 9900 is not limited to the above and another structure which is provided with at least the semiconductor device disclosed in this specification may be employed. The slot machine 9900 may include an additional accessory as appropriate.

Figure 28A:
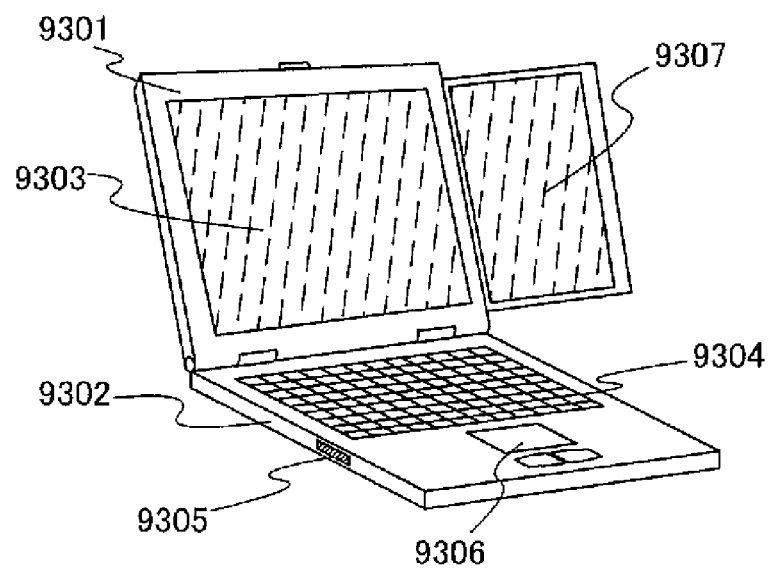
FIGS. 28A and 28B are external views respectively illustrating an example of a portable computer and an example of a mobile phone.

FIG. 28A is a perspective view illustrating an example of a portable computer.

In the portable computer illustrated in FIG. 28A a top housing 9301 having a display portion 9303 and a bottom housing 9302 having a keyboard 9304 can overlap with each other by closing a hinge unit which connects the top housing 9301 and the bottom housing 9302. The portable computer is conveniently carried. In the case of using the keyboard for input of data, the hinge unit is opened so that a user can input data looking at the display portion 9303.

The bottom housing 9302 includes a pointing device 9306 with which input can be performed, in addition to the keyboard 9304. When the display portion 9303 is a touch screen, the user can input data by touching part of the display portion. The bottom housing 9302 includes an arithmetic function portion such as a CPU or hard disk. In addition, the bottom housing 9302 includes an external connection port 9305 into which another device, for example, a communication cable conformable to communication standards of a USB is inserted.

The top housing 9301 further includes a display portion 9307 which can be stored in the top housing 9301 by being slid therein. With the display portion 9307, a large display screen can be realized. In addition, the user can adjust the angle of a screen of the stowable display portion 9307. If the stowable display portion 9307 is a touch screen, the user can input data by touching part of the stowable display portion 9307.

The display portion 9303 or the stowable display portion 9307 is formed using an image display device such as a liquid crystal display panel or a light-emitting display panel using an organic light-emitting element, an inorganic light-emitting element, or the like.

In addition, the portable computer illustrated in FIG. 28A can be provided with a receiver and the like and can receive a TV broadcast to display an image on the display portion 9303 or the display portion 9307. The user can watch a TV broadcast with the whole screen by sliding and exposing the display portion 9307 and adjusting the angle thereof, with the hinge unit which connects the top housing 9301 and the bottom housing 9302 closed. In this case, the hinge unit is not opened and display is not performed on the display portion 9303. In addition, start up of only a circuit for displaying a TV broadcast is performed. Thus, power consumption can be minimized, which is advantageous for the portable computer whose battery capacity is limited.

Figure 28B:
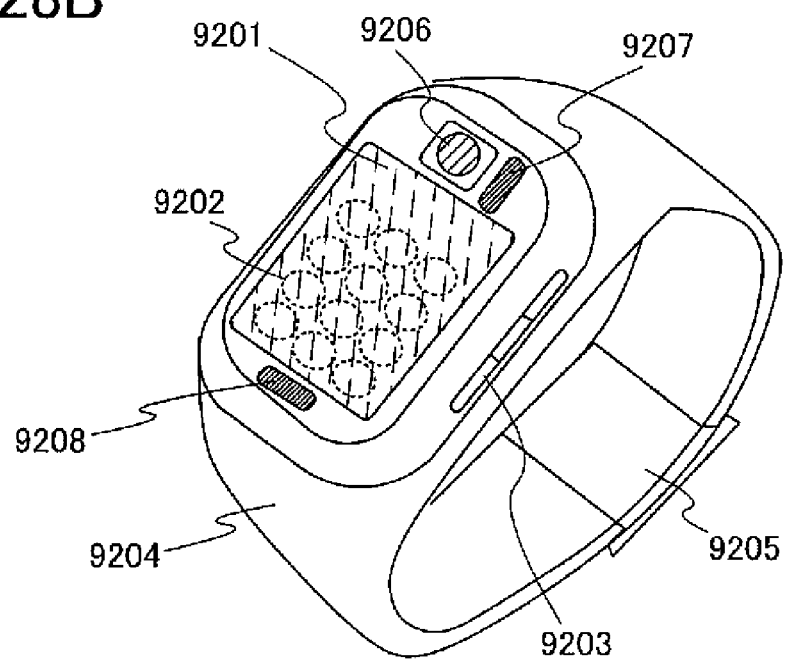

FIG. 28B is a perspective view of an example of a mobile phone that a user can wear on the wrist like a wristwatch.

This mobile phone includes a main body which includes a communication device including at least a telephone function, and a battery; a band portion 9204 which enables the main body to be worn on the wrist; an adjusting portion 9205 for adjusting the band portion 9204 to fit the wrist; a display portion 9201; a speaker 9207; and a microphone 9208.

In addition, the main body includes operation switches 9203. The operation switches 9203 can serve, for example, as a power switch, a switch for changing display, or a switch for instruction to start taking images. The operation switches 9203 may be a switch for starting a program for the Internet when the switch is pushed. The operation switches 9203 can be configured to have respective functions.

The user can input data into this mobile phone by touching the display portion 9201 with a finger or an input pen, controlling the operation switches 9203, or inputting voice into the microphone 9208. In FIG. 28B, display buttons 9202 are displayed on the display portion 9201. The user can input data by touching the display buttons 9202 with a finger or the like.

Further, the main body includes a camera portion 9206 including an image pick-up means having a function of converting an image of an object, which is formed through a camera lens, to an electronic image signal. Note that the camera portion is not necessarily provided.

The mobile phone illustrated in FIG. 28B is provided with a receiver of a TV broadcast and the like, and can display an image on the display portion 9201 by receiving the TV broadcast. In addition, the mobile phone is provided with a storage device such as a memory, and can record the TV broadcast in the memory. The mobile phone illustrated in FIG. 28B may have a function of collecting location information, such as GPS.

An image display device such as a liquid crystal display panel or a light-emitting display panel using an organic or inorganic light-emitting element is used as the display portion 9201. The mobile phone illustrated in FIG. 28B is compact and lightweight and thus has limited battery capacity. Therefore, a panel which can be driven with low power consumption is preferably used as a display device for the display portion 9201.

Note that although FIG. 28B illustrates the electronic device which is worn on the wrist, this embodiment is not limited thereto as long as an electronic device is portable.

Embodiment 12

In this embodiment, an example of a liquid crystal display device including a liquid crystal element as a display element will be described with reference to FIG. 29 to FIG. 32. The thin film transistor described in any of Embodiments 1 to 3 can be used as TFTs 628 and 629 included in the liquid crystal display devices in FIG. 29 to FIG. 32.

As an example of a liquid crystal display device, a vertical alignment (VA) liquid crystal display device will be described. The VA mode of a liquid crystal display device is a kind of mode in which alignment of liquid crystal molecules of a liquid crystal display panel is controlled. In the VA liquid crystal display device, liquid crystal molecules are aligned in a vertical direction with respect to a panel surface without voltage application. In this embodiment, in particular, a pixel is divided into some regions (subpixels), and molecules are aligned in different directions in their respective regions. This is referred to as multi-domain or multi-domain design. Liquid crystal display devices of the multi-domain design will be described below.

Figure 29:
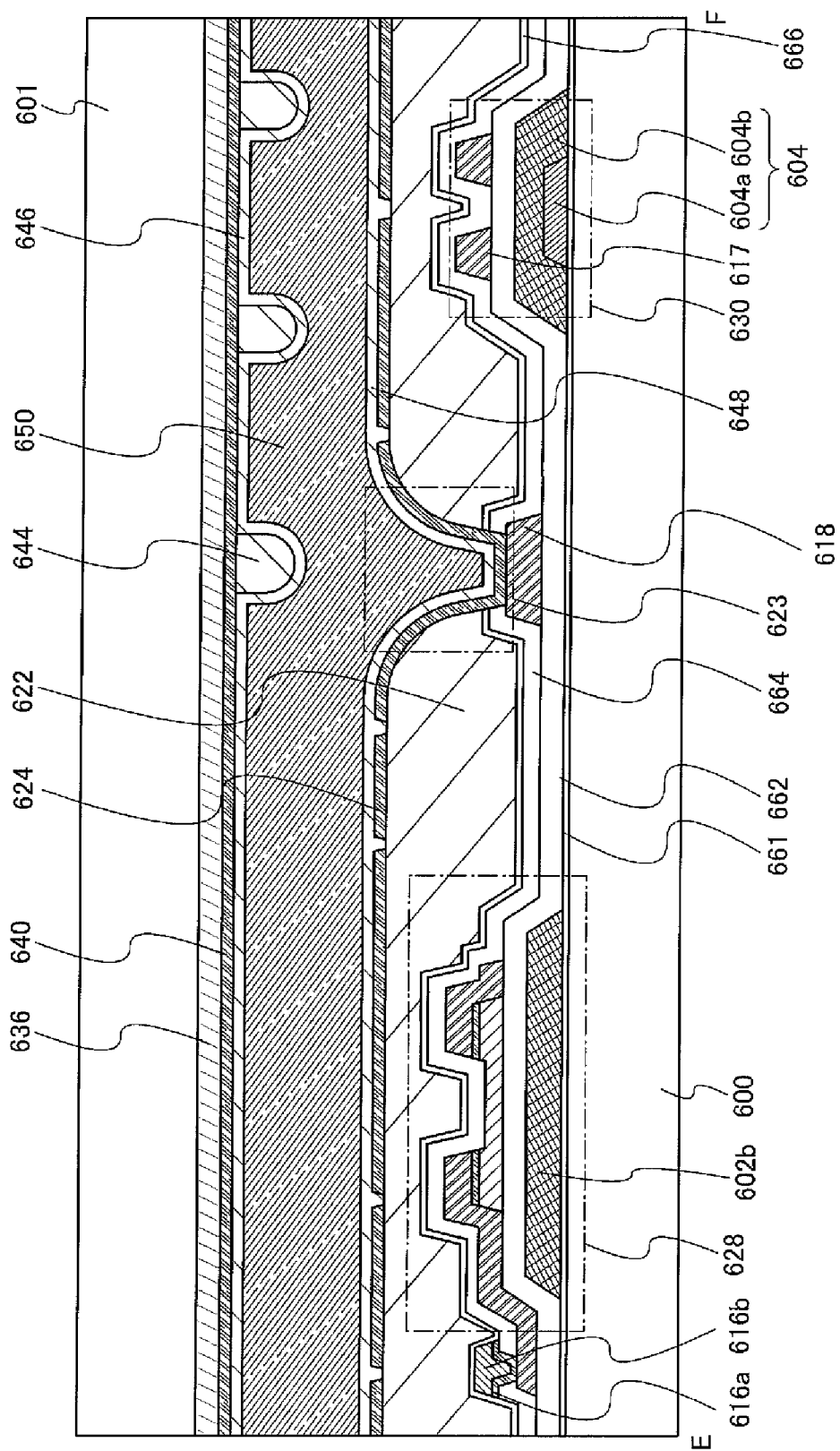
FIG. 29 illustrates a semiconductor device.
Figure 30:
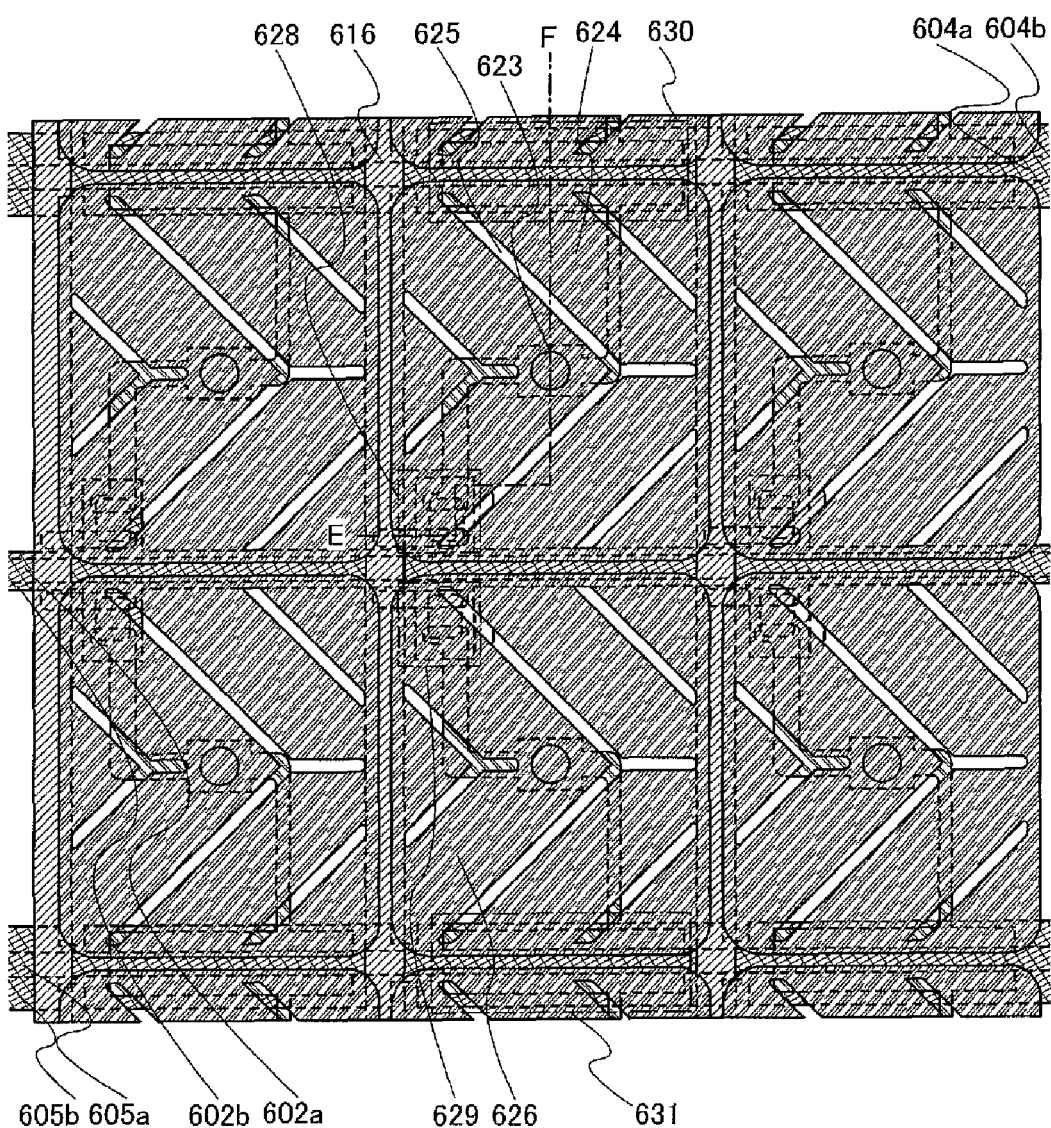
FIG. 30 illustrates a semiconductor device.
Figure 31:
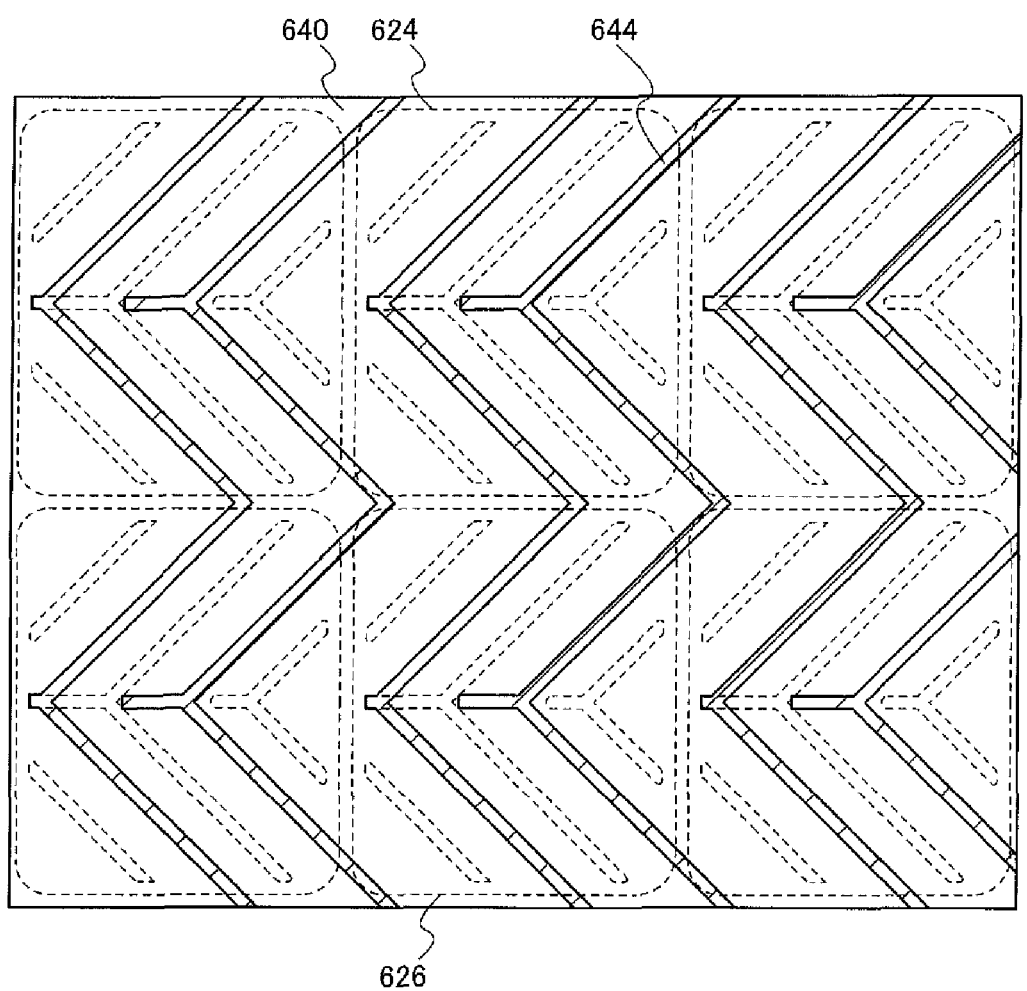
FIG. 31 illustrates a semiconductor device.

FIG. 30 and FIG. 31 illustrate a pixel electrode and a counter electrode, respectively. FIG. 30 is a plan view showing the substrate side where the pixel electrode is formed. FIG. 29 illustrates a cross-sectional structure taken along section line E-F in FIG. 30. FIG. 31 is a plan view showing the substrate side where the counter electrode is formed. The following description will be made with reference to these drawings.

In FIG. 29, a substrate 600 over which the TFT 628, a pixel electrode 624 connected to the TFT 628, and a storage capacitor portion 630 are formed and a counter substrate 601 on which a counter electrode 640 and the like are provided to overlap with each other, and liquid crystal is injected therebetween.

A coloring film 636 (a first coloring film, a second coloring film, and a third coloring film which are not shown) and the counter electrode 640 are provided in a position where a spacer (not shown) is not formed on the counter substrate 601. This structure makes the height of projections 644 for controlling alignment of liquid crystal different from that of the spacer. An alignment film 648 is formed over the pixel electrode 624. Similarly, an alignment film 646 is formed on the counter electrode 640. A liquid crystal layer 650 is formed between the substrate 600 and the counter substrate 601.

Although a columnar spacer is used for the spacer here, bead spacers may be dispersed. Further, the spacer may also be formed over the pixel electrode 624 provided over the substrate 600.

The TFT 628, the pixel electrode 624 electrically connected to the TFT 628, and the storage capacitor portion 630 are formed over the substrate 600 provided with an insulating layer 661. The pixel electrode 624 is connected to a wiring 618 through a contact hole 623 which penetrates an insulating layer 664 that covers the TFT 628, a source wiring 616, and the storage capacitor portion 630, an insulating layer 666 over the insulating layer 664, and an insulating layer 622 over the insulating layer 666. Further, the source wiring 616 which includes a stack of a source wiring 616a and a source wiring 616b is formed over the insulating layer 664 and connected to a source electrode or a drain electrode of the TFT 628 through a contact hole formed in the insulating layer 664. Here, the thin film transistor described in Embodiments 1 and 2 can be used as the TFT 628 as appropriate.

The storage capacitor portion 630 includes a capacitor wiring 604 which is a first capacitor wiring and is formed at the same time as a gate wiring 602 of the TFT 628, an insulating layer 662 over the gate wiring 602, and a capacitor wiring 617 which is a second capacitor wiring and is formed at the same time as the wiring 618. Here, the gate wiring 602 is a stack of gate wirings 602a and 602b, and the gate wiring 602b serves as a gate electrode of the TFT 628. The capacitor wiring 604 is also a stack of capacitor wirings 604a and 604b.

The pixel electrode 624, the liquid crystal layer 650, and the counter electrode 640 overlap with each other, whereby a liquid crystal element is formed.

FIG. 30 illustrates a structure over the substrate 600. The pixel electrode 624 is formed using the material given in Embodiments 1 and 2. The pixel electrode 624 is provided with slits 625. The slits 625 are provided for controlling the alignment of the liquid crystal.

A TFT 629, a pixel electrode 626 connected to the TFT 629, and a storage capacitor portion 631 which are illustrated in FIG. 30 can be formed in a manner similar to the TFT 628, the pixel electrode 624, and the storage capacitor portion 630, respectively. Note that a capacitor wiring 605 included in the storage capacitor portion 631 is also a stack of capacitor wirings 605a and 605b, which is similar to the case of the capacitor wiring 604. Here, the TFT 628 and the TFT 629 are both connected to the source wiring 616 and the gate wiring 602. A pixel of this liquid crystal display panel includes the pixel electrodes 624 and 626. The pixel electrode 624 and 626 are each included in a sub pixel.

FIG. 31 illustrates a structure of the counter substrate side. The counter electrode 640 is preferably formed using a material similar to that of the pixel electrode 624. The counter electrode 640 is provided with the projection 644 for controlling alignment of the liquid crystal.

Figure 32:
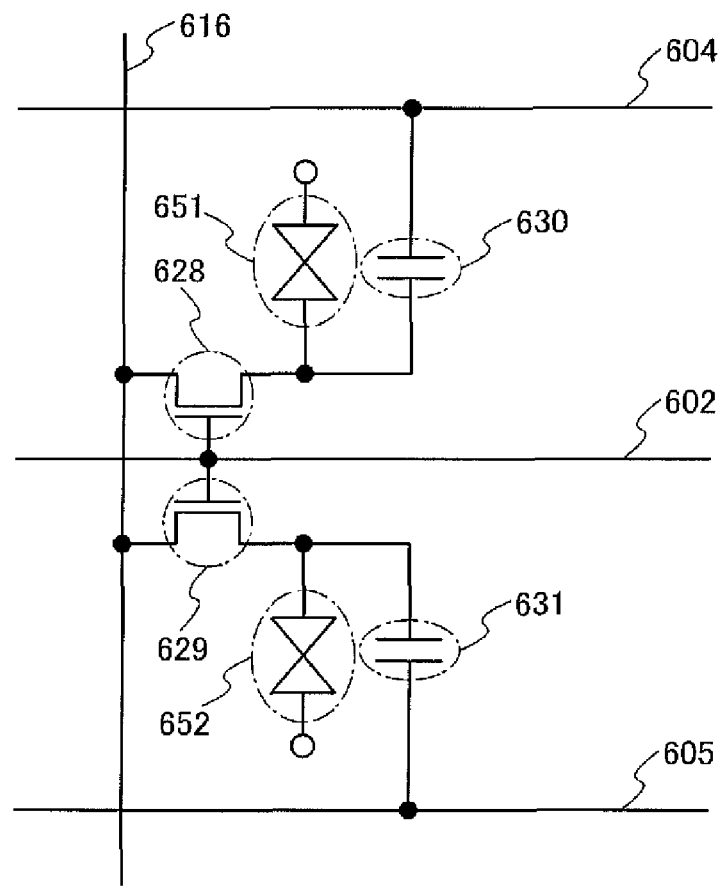
FIG. 32 illustrates a semiconductor device.

FIG. 32 illustrates an equivalent circuit of this pixel structure. Both the TFT 628 and the TFT 629 are connected to the gate wiring 602 and the source wiring 616. In this case, when potentials of the capacitor wiring 604 and the capacitor wiring 605 are different from each other, operations of a liquid crystal element 651 and a liquid crystal element 652 can be different from each other. That is, alignment of the liquid crystal is precisely controlled and the viewing angle is increased by separate control of potentials of the capacitor wirings 604 and 605.

When voltage is applied to the pixel electrode 624 provided with the slit 625, electric field distortion (an oblique electric field) is generated in the vicinity of the slit 625. The slit 625 and the projection 644 on the counter substrate 601 side are alternately arranged with each other, and thus the oblique electric field is effectively generated to control alignment of the liquid crystal, whereby a direction of alignment of the liquid crystal varies depending on location. That is, the viewing angle of the liquid crystal display panel is increased by multi-domain.

Next, another VA liquid crystal display device, which is different from the above, is described with reference to FIGS. 33 to 36. In the structures of the present invention to be given below, portions which are the same as or have functions similar to those of the above VA liquid crystal display device are denoted by the same reference numerals in different drawings, and repetitive description thereof will be omitted.

Figure 33:
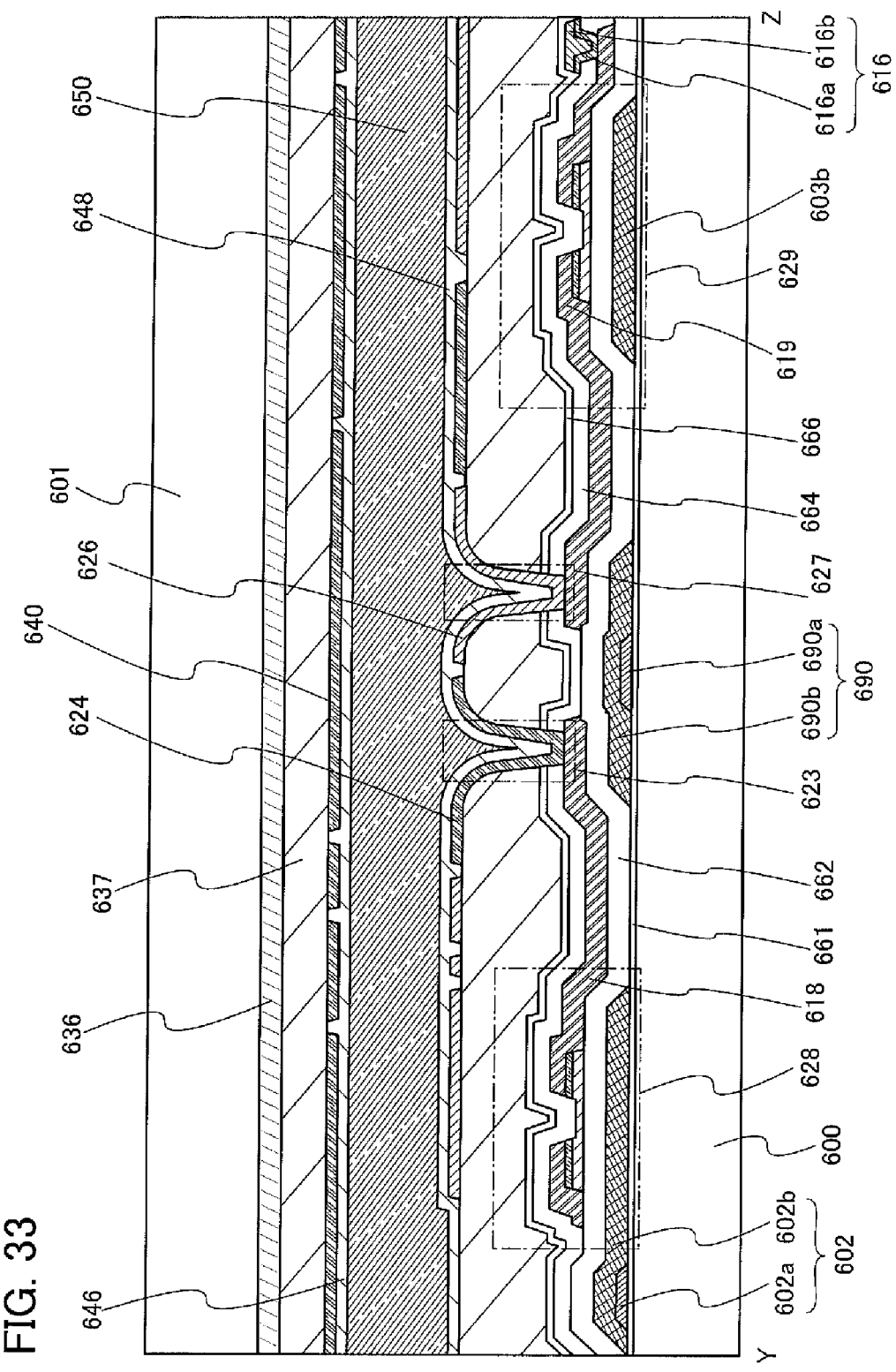
FIG. 33 illustrates a semiconductor device.
Figure 34:
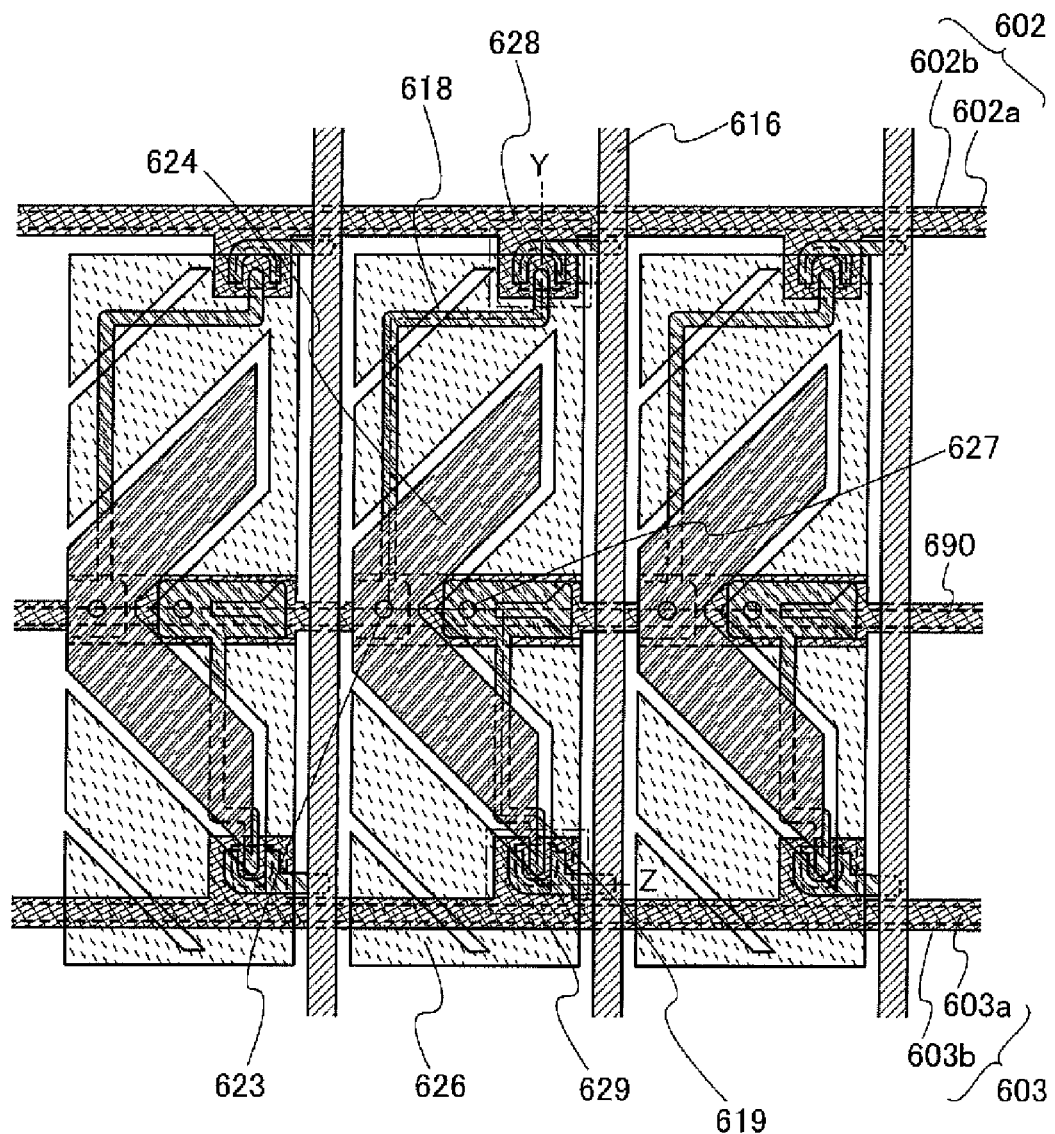
FIG. 34 illustrates a semiconductor device.

FIG. 33 and FIG. 34 illustrate a pixel structure of a VA liquid crystal display panel. FIG. 34 is a plan view of the substrate 600. FIG. 33 illustrates a cross-sectional structure taken along line Y-Z in FIG. 34. The following description will be made with reference to these drawings.

In this pixel structure, a plurality of pixel electrodes is included in one pixel, and the pixel electrodes are connected to respective TFTs. Each TFT is driven by a different gate signal. That is, signals applied to individual pixel electrodes in a multi-domain pixel are independently controlled.

The pixel electrode 624 is connected to the TFT 628 via the wiring 618 through the contact hole 623. The pixel electrode 626 is connected to the TFT 629 via a wiring 619 through a contact hole 627. The gate wiring 602 of the TFT 628 and a gate wiring 603 of the TFT 629 are separated so that different gate signals may be supplied thereto. Meanwhile, the source wiring 616 which serves as a data line is connected to the source electrodes of the TFT 628 and the TFT 629 through contact holes formed in the insulating layer 664, and commonly used between the TFT 628 and the TFT 629. As each of the TFTs 628 and 629, the thin film transistor described in Embodiments 1 and 2 can be used as appropriate. A capacitor wiring 690 is also provided. Note that similarly to the pixel structure of the above VA liquid crystal display panel, the gate wiring 602 is a stack of the gate wirings 602a and 602b, the gate wiring 603 is a stack of gate wirings 603a and 603b, the source wiring 616 is a stack of the source wirings 616a and 616b, and the capacitor wiring 690 is a stack of capacitor wirings 690a and 690b. In addition, the insulating layers 661 to 666 are formed as those in the pixel structure of the above VA liquid crystal display panel.

Figure 36:
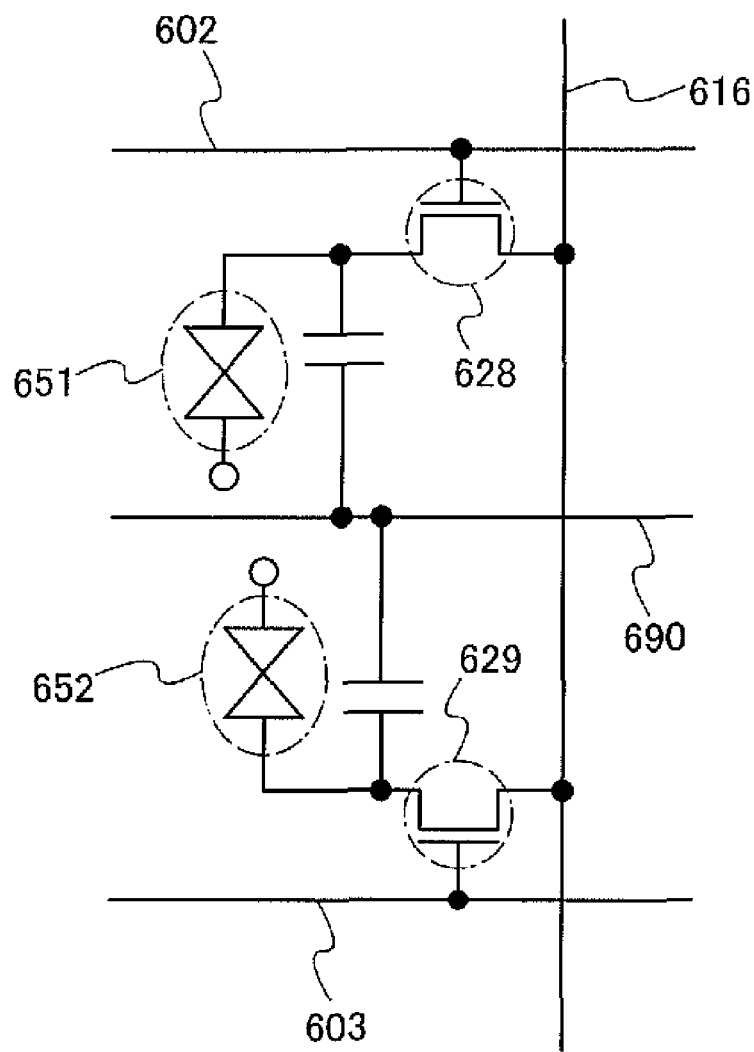
FIG. 36 illustrates a semiconductor device.

The pixel electrodes 624 and 626 have different shapes and are separated by the slit 625. The pixel electrode 626 is formed so as to surround the pixel electrode 624 which spreads has a V shape. A voltage applied to the pixel electrode 624 is made different from a voltage applied to the pixel electrode 626 by the TFTs 628 and 629, whereby alignment of liquid crystals is controlled. FIG. 36 illustrates an equivalent circuit of this pixel structure. The TFT 628 is connected to the gate wiring 602. The TFT 629 is connected to the gate wiring 603. Both the TFT 628 and the TFT 629 are connected to the source wiring 616. By independently controlling signals supplied to the gate wirings 602 and 603, voltages applied to liquid crystal elements 651 and 652 can be different from each other. In other words, by independently controlling operations of the TFTs 628 and 629, alignment of liquid crystal in the liquid crystal elements 651 and 652 can vary and the viewing angle can be increased.

Figure 35:
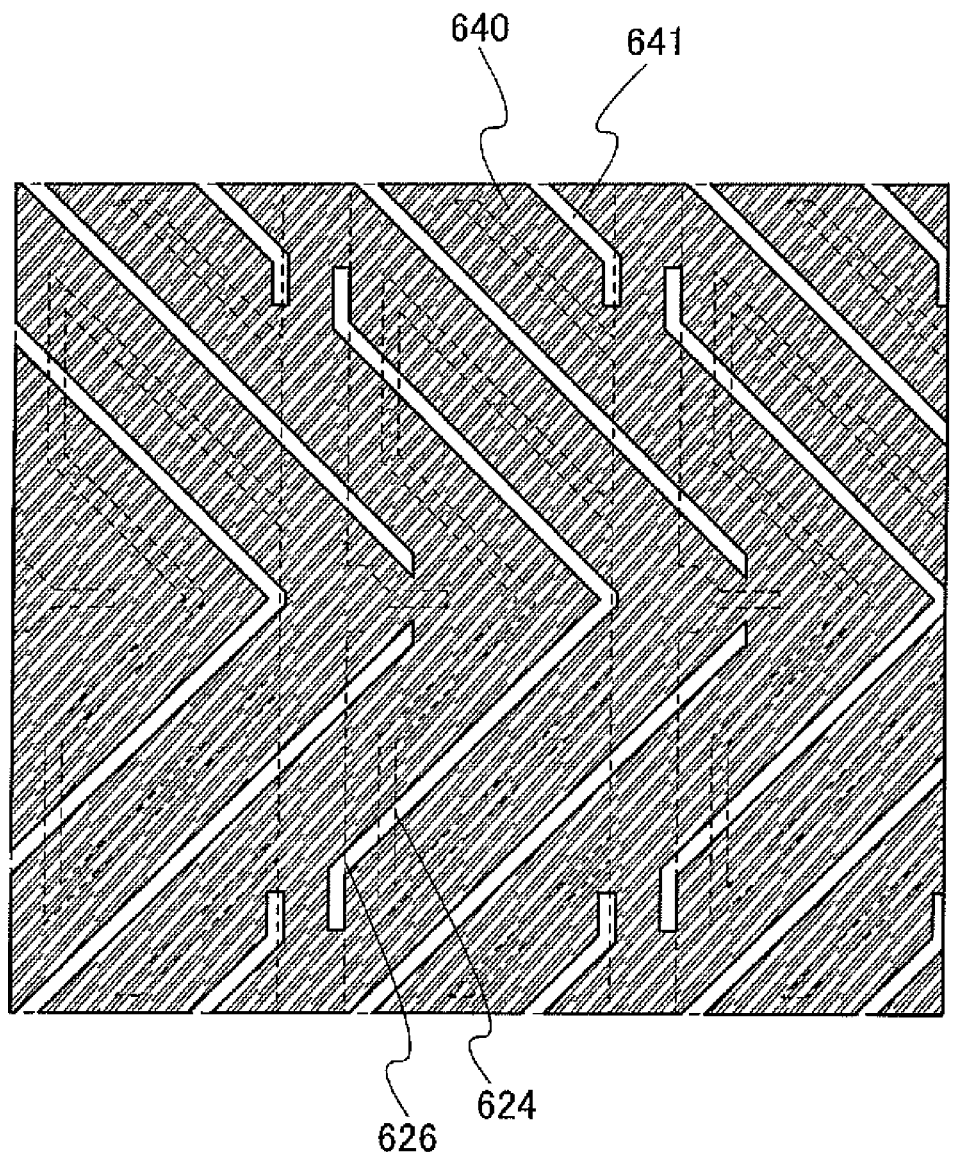
FIG. 35 illustrates a semiconductor device.

The counter substrate 601 is provided with the coloring film 636 and the counter electrode 640. Moreover, a planarization film 637 is formed between the coloring film 636 and the counter electrode 640 to prevent alignment disorder of the liquid crystal. FIG. 35 illustrates a structure on the counter substrate side. The counter electrode 640 is an electrode shared by different pixels and has slits 641. The slit 641 and the slit 625 on the pixel electrode 624 and 626 side are alternately arranged with each other so that an oblique electric field is effectively generated, and alignment of the liquid crystal can be controlled. Accordingly, the direction in which the liquid crystal is aligned can vary depending on location, and the viewing angle is increased. Note that in FIG. 35, the dashed lines indicate the pixel electrodes 624 and 626 which are formed over the substrate 600, and the counter electrode 640 overlaps with the pixel electrode 624 and 626.

The alignment film 648 is formed over the pixel electrodes 624 and 626, and the alignment film 646 is similarly provided on the counter electrode 640. The liquid crystal layer 650 is formed between the substrate 600 and the counter substrate 601.

The liquid crystal element 651 is formed by overlapping of the pixel electrode 624, the liquid crystal layer 650, and the counter electrode 640. The liquid crystal element 652 is formed by overlapping of the pixel electrode 626, the liquid crystal layer 650, and the counter electrode 640. Thus, a multi-domain structure in which the liquid crystal element 651 and the liquid crystal element 652 are included in one pixel is provided.

With the use of the display device described in another embodiment, a liquid crystal display device like the above can be manufactured. Although the vertical alignment (VA) liquid crystal display device has been described, this embodiment is not limited thereto. For example, a liquid crystal display device in a horizontal electric field mode (e.g., an IPS liquid crystal display device) in which a horizontal electric field is applied to liquid crystal molecules in cells so that liquid crystal is driven to express gray scales, or a TN liquid crystal display device may be employed.

By manufacturing the above liquid crystal display device using the display device disclosed in this specification, a gate wiring or a source wiring can be formed using a conductive material including Cu; thus, an increase in wiring resistance can be prevented. Accordingly, an increase in operation speed and a reduction in power consumption of the display device can be achieved, whereby a liquid crystal display device which can have a large screen or a high definition screen can be provided.

This application is based on Japanese Patent Application serial no. 2009-235750 filed with Japan Patent Office on Oct. 9, 2009, the entire contents of which are hereby incorporated by reference.

The invention claimed is:

1. A semiconductor device comprising:
a first insulating layer including silicon nitride over a substrate;
a first conductive layer including Cu over the first insulating layer;
a second conductive layer covering the first conductive layer over the first conductive layer;
a second insulating layer including silicon nitride over the second conductive layer;
an island-shaped semiconductor layer over the second insulating layer;
a pair of third conductive layers serving as a source electrode and a drain electrode over the island-shaped semiconductor layer;
a third insulating layer including silicon nitride over the pair of third conductive layers;
a fourth conductive layer electrically connected to one of the pair of third conductive layers through an opening provided in the third insulating layer;
a fifth conductive layer including Cu, and overlapping the fourth conductive layer;
a fourth insulating layer including silicon nitride, and covering the fifth conductive layer; and
a sixth conductive layer electrically connected to the other of the pair of third conductive layers through an opening provided in the third insulating layer and the fourth insulating layer,
wherein the first conductive layer and the fifth conductive layer do not overlap with the island-shaped semiconductor layer in which a channel of a thin film transistor is formed.

2. The semiconductor device according to claim 1, wherein the first conductive layer includes at least one element selected from W, Ta, Mo, Ti, Cr, Al, Zr, and Ca.

3. The semiconductor device according to claim 1, wherein the second conductive layer includes an element with a higher meting point than Cu.

4. The semiconductor device according to claim 1, wherein the island-shaped semiconductor layer is formed using an amorphous semiconductor, a microcrystalline semiconductor, or a polycrystalline semiconductor.

5. The semiconductor device according to claim 1, wherein the fifth conductive layer includes at least one element selected from W, Ta, Mo, Ti, Cr, Al, Zr, and Ca.

6. The semiconductor device according to claim 1, wherein an upper surface and a lower surface of the first conductive layer and an upper surface and a lower surface of the fifth conductive layer are covered with layers including silicon nitride.

7. A method for manufacturing a semiconductor device, comprising:
forming a first insulating layer including silicon nitride over a substrate;
forming a first conductive layer including Cu over the first insulating layer;
forming a second conductive layer covering the first conductive layer over the first conductive layer;
forming a second insulating layer including silicon nitride over the second conductive layer;
forming an island-shaped semiconductor layer over the second insulating layer;
forming a pair of third conductive layers serving as a source electrode and a drain electrode over the island-shaped semiconductor layer;
forming a third insulating layer including silicon nitride over the pair of third conductive layers;
forming a fourth conductive layer so that the fourth conductive layer is electrically connected to one of the pair of third conductive layers through an opening provided in the third insulating layer;
forming a fifth conductive layer including Cu which overlaps with the fourth conductive layer;
forming a fourth insulating layer including silicon nitride which covers the fifth conductive layer; and
forming a sixth conductive layer so that the sixth conductive layer is electrically connected to the other of the pair of third conductive layers through an opening provided in the third insulating layer and the fourth insulating layer,
wherein the first conductive layer and the fifth conductive layer do not overlap with the island-shaped semiconductor layer in which a channel of a thin film transistor is formed.

8. The method for manufacturing a semiconductor device according to claim 7, wherein the first conductive layer includes at least one element selected from W, Ta, Mo, Ti, Cr, Al, Zr, and Ca.

9. The method for manufacturing a semiconductor device according to claim 7, wherein the second conductive layer includes an element with a higher meting point than Cu.

10. The method for manufacturing a semiconductor device according to claim 7, wherein the island-shaped semiconductor layer is formed using an amorphous semiconductor, a microcrystalline semiconductor, or a polycrystalline semiconductor.

11. The method for manufacturing a semiconductor device according to claim 7, wherein the fifth conductive layer includes at least one element selected from W, Ta, Mo, Ti, Cr, Al, Zr, and Ca.

12. The method for manufacturing a semiconductor device according to claim 7, wherein an upper surface and a lower surface of the first conductive layer and an upper surface and a lower surface of the fifth conductive layer are covered with layers including silicon nitride.

* * * * *

UNITED STATES PATENT AND TRADEMARK OFFICE
CERTIFICATE OF CORRECTION

PATENT NO. : 8,253,144 B2  
APPLICATION NO. : 12/898345  
DATED : August 28, 2012  
INVENTOR(S) : Shunpei Yamazaki et al.

Page 1 of 1

It is certified that error appears in the above-identified patent and that said Letters Patent is hereby corrected as shown below:

Column 6, line 65, replace "2066" with --206b--;

Column 8, line 16, replace "2076" with --207b--;

Column 14, line 22, replace "iridium" with --indium--;

Column 17, line 6, replace "4076" with --407b--;

Column 17, line 17, replace "4056" with --405b--;

Column 20, line 41, replace "1156" with --115b--;

Column 21, line 19, replace "1026" with --102b--;

Column 23, line 20, replace "3546" with --354b--;

Column 23, line 34, replace "2076" with --207b--;

Column 27, line 12, replace "IV" with --$N$--;

Column 36, line 47, replace "5906" with --590b--;

Column 40, line 18, replace "tight-transmitting" with --light-transmitting--;

Column 46, line 5, replace "45036" with --4503b--;

Column 47, line 6, replace "45036" with --4503b--;

Column 54, line 16, replace "6906" with --690b--.

Signed and Sealed this  
Twenty-second Day of January, 2013

David J. Kappos  
*Director of the United States Patent and Trademark Office*